(12) United States Patent
Lester et al.

(10) Patent No.: US 7,694,688 B2
(45) Date of Patent: Apr. 13, 2010

(54) WET CLEAN SYSTEM DESIGN

(75) Inventors: Paul Lester, Emmett, ID (US); Scott Meyer, Boise, ID (US); Wyland L. Atkins, Kuna, ID (US); Douglas Richards, Meridian, ID (US); Constantin Predoaica, Boise, ID (US); Jeffrey Hudgens, San Francisco, CA (US); Charles Carlson, Cedar Park, TX (US); Penchala Kankanala, Santa Clara, CA (US); Mike Rice, Pleasanton, CA (US); James S. Papanu, San Rafael, CA (US); Evanson G. Baiya, Nampa, ID (US); John J. Rosato, Boise, ID (US)

(73) Assignee: Applied Materials, Inc., Santa Clara, CA (US)

( * ) Notice: Subject to any disclaimer, the term of this patent is extended or adjusted under 35 U.S.C. 154(b) by 664 days.

(21) Appl. No.: 11/620,610

(22) Filed: Jan. 5, 2007

(65) Prior Publication Data
US 2008/0166208 A1 Jul. 10, 2008

(51) Int. Cl.
*B08B 3/04* (2006.01)
(52) U.S. Cl. .................. 134/62; 134/66; 134/140; 134/902
(58) Field of Classification Search .......... 134/1, 134/42, 62, 66, 140, 902
See application file for complete search history.

(56) References Cited

U.S. PATENT DOCUMENTS

| 1,927,677 | A | 9/1933 | Bennington |
|---|---|---|---|
| 3,206,041 | A | 9/1965 | McGrath |
| 3,351,219 | A | 11/1967 | Ruderfer |
| 3,402,835 | A | 9/1968 | Saul |
| 3,610,159 | A | 10/1971 | Fickenscher |
| 3,750,804 | A | 8/1973 | Lemelson |
| 3,796,327 | A | 3/1974 | Meyer et al. |
| 3,876,085 | A | 4/1975 | Bright |
| 4,027,246 | A | 5/1977 | Caccoma et al. |
| 4,304,433 | A | 12/1981 | Langowski |
| 4,348,044 | A | 9/1982 | Wood, III |
| 4,410,209 | A | 10/1983 | Trapani |

(Continued)

FOREIGN PATENT DOCUMENTS

JP 03-246940 * 11/1991

(Continued)

OTHER PUBLICATIONS

International Search Report, May 28, 2008.

(Continued)

*Primary Examiner*—Frankie L Stinson
(74) *Attorney, Agent, or Firm*—Patterson & Sheridan, LLP

(57) ABSTRACT

The present invention generally provides an apparatus and method for processing and transferring substrates in a multi-chamber processing system that has the capability of receiving and performing single substrate processing steps performed in parallel, while using the many favorable aspects of batch processing. Embodiments of the invention described herein are adapted to maximize system throughput, reduce system cost, reduce cost per substrate during processing, increase system reliability, improve the device yield on the processed substrates, and reduce system footprint. In one embodiment, the cluster tool is adapted to perform a wet/clean process sequence in which various substrate cleaning processes are performed on a substrate in the cluster tool.

24 Claims, 35 Drawing Sheets

U.S. PATENT DOCUMENTS

| | | |
|---|---|---|
| 4,639,028 A | 1/1987 | Olson |
| 4,830,888 A | 5/1989 | Kobayashi et al. |
| 4,846,623 A | 7/1989 | Otani et al. |
| 4,900,214 A | 2/1990 | Ben |
| 4,911,761 A | 3/1990 | McConnell et al. |
| 4,923,054 A | 5/1990 | Ohtani et al. |
| 4,984,597 A | 1/1991 | McConnell et al. |
| 5,054,332 A | 10/1991 | Terauchi et al. |
| 5,061,144 A | 10/1991 | Akimoto et al. |
| 5,125,790 A | 6/1992 | Foulke et al. |
| 5,133,635 A | 7/1992 | Malin et al. |
| 5,158,616 A * | 10/1992 | Kinoshita et al. .......... 134/25.4 |
| 5,177,563 A | 1/1993 | Everett et al. |
| 5,197,846 A | 3/1993 | Uno et al. |
| 5,308,210 A | 5/1994 | Ohtani et al. |
| 5,317,778 A * | 6/1994 | Kudo et al. ................. 15/88.3 |
| 5,339,128 A | 8/1994 | Tateyama et al. |
| 5,359,785 A | 11/1994 | Fukutomi et al. |
| 5,415,890 A | 5/1995 | Kloiber et al. |
| 5,416,047 A | 5/1995 | Konishi et al. |
| 5,430,271 A | 7/1995 | Orgami et al. |
| 5,436,848 A | 7/1995 | Nishida et al. |
| 5,443,348 A | 8/1995 | Biche et al. |
| 5,468,302 A | 11/1995 | Thietje |
| 5,485,644 A | 1/1996 | Shinbara et al. |
| 5,520,501 A | 5/1996 | Kouno et al. |
| 5,571,325 A | 11/1996 | Ueyama et al. |
| 5,634,377 A | 6/1997 | Kimura et al. |
| 5,636,964 A | 6/1997 | Somekh et al. |
| 5,639,301 A | 6/1997 | Sasada et al. |
| 5,651,823 A | 7/1997 | Parodi et al. |
| 5,665,200 A | 9/1997 | Fujimoto et al. |
| 5,668,733 A | 9/1997 | Morimoto et al. |
| 5,687,085 A | 11/1997 | Morimoto et al. |
| 5,700,046 A | 12/1997 | Van Doren et al. |
| 5,701,627 A | 12/1997 | Matsumura et al. |
| 5,730,574 A | 3/1998 | Adachi et al. |
| 5,733,024 A | 3/1998 | Slocum et al. |
| 5,733,902 A | 3/1998 | Schneider |
| 5,741,113 A | 4/1998 | Bacchi et al. |
| 5,756,444 A | 5/1998 | Walters et al. |
| 5,762,745 A | 6/1998 | Hirose |
| 5,766,824 A | 6/1998 | Batchelder et al. |
| 5,788,453 A | 8/1998 | Donde et al. |
| 5,788,868 A | 8/1998 | Itaba et al. |
| 5,803,932 A | 9/1998 | Akimoto et al. |
| 5,823,736 A | 10/1998 | Matsumura |
| 5,838,121 A | 11/1998 | Fairbairn et al. |
| 5,875,804 A | 3/1999 | Tanaka et al. |
| 5,884,640 A | 3/1999 | Fishkin et al. |
| 5,915,396 A | 6/1999 | Kinose |
| 5,919,529 A | 7/1999 | Matsumura |
| 5,921,257 A | 7/1999 | Weber et al. |
| 5,933,902 A | 8/1999 | Frey |
| 5,935,768 A | 8/1999 | Biche et al. |
| 5,938,902 A | 8/1999 | Nguyen et al. |
| 5,943,880 A | 8/1999 | Tateyama |
| 5,944,476 A | 8/1999 | Bacchi et al. |
| 5,960,225 A | 9/1999 | Fujimoto |
| 5,963,753 A | 10/1999 | Ohtani et al. |
| 5,970,717 A | 10/1999 | Tateyama |
| 5,974,682 A | 11/1999 | Akimoto |
| 5,980,187 A | 11/1999 | Verhovsky |
| 5,980,188 A | 11/1999 | Ko et al. |
| 5,988,971 A | 11/1999 | Fossey et al. |
| 5,989,346 A | 11/1999 | Hiroki |
| 5,992,431 A | 11/1999 | Weber et al. |
| 6,004,047 A | 12/1999 | Akimoto et al. |
| 6,012,192 A | 1/2000 | Sawada et al. |
| 6,021,790 A | 2/2000 | Yoshitani et al. |
| 6,027,574 A | 2/2000 | Fishkin et al. |
| 6,051,101 A | 4/2000 | Ohtani et al. |
| 6,063,439 A | 5/2000 | Semba et al. |
| 6,074,515 A | 6/2000 | Iseki et al. |
| 6,076,652 A | 6/2000 | Head, III |
| 6,077,321 A | 6/2000 | Adachi et al. |
| 6,082,377 A | 7/2000 | Frey |
| 6,092,971 A | 7/2000 | Balg et al. |
| 6,098,484 A | 8/2000 | Bacchi et al. |
| 6,099,643 A | 8/2000 | Ohtani et al. |
| 6,105,454 A | 8/2000 | Bacchi et al. |
| 6,108,932 A | 8/2000 | Chai |
| 6,116,848 A | 9/2000 | Thomas et al. |
| 6,128,829 A | 10/2000 | Wolke et al. |
| 6,138,695 A | 10/2000 | Shibao et al. |
| 6,142,722 A | 11/2000 | Genov et al. |
| 6,143,087 A | 11/2000 | Walter |
| 6,155,275 A | 12/2000 | Shinbara |
| 6,167,322 A | 12/2000 | Holbrooks |
| 6,176,667 B1 | 1/2001 | Fairbairn et al. |
| 6,251,195 B1 | 6/2001 | Wagener et al. |
| 6,253,118 B1 | 6/2001 | Koyama |
| 6,256,555 B1 | 7/2001 | Bacchi et al. |
| 6,261,007 B1 | 7/2001 | Takamori et al. |
| 6,275,748 B1 | 8/2001 | Bacchi et al. |
| 6,292,250 B1 | 9/2001 | Matsuyama |
| 6,293,713 B1 | 9/2001 | Ueda |
| 6,313,903 B1 | 11/2001 | Ogata |
| 6,318,948 B1 | 11/2001 | Ueda et al. |
| 6,318,951 B1 | 11/2001 | Schmidt et al. |
| 6,322,119 B1 | 11/2001 | Schmidt et al. |
| 6,328,814 B1 | 12/2001 | Fishkin et al. |
| 6,348,101 B1 | 2/2002 | Walter |
| 6,371,713 B1 | 4/2002 | Nishimura et al. |
| 6,379,056 B1 | 4/2002 | Ueda |
| 6,402,400 B1 | 6/2002 | Ueda et al. |
| 6,402,508 B2 | 6/2002 | Karada et al. |
| 6,403,924 B1 | 6/2002 | Hayashi |
| 6,435,199 B1 * | 8/2002 | Kamikawa ................... 134/76 |
| 6,438,449 B2 | 8/2002 | Kawamatsu et al. |
| 6,438,460 B1 | 8/2002 | Bacchi et al. |
| 6,444,029 B1 | 9/2002 | Kimura et al. |
| 6,446,646 B1 | 9/2002 | Izumi |
| 6,453,214 B1 | 9/2002 | Bacchi et al. |
| 6,454,332 B1 | 9/2002 | Govzman et al. |
| 6,454,927 B1 | 9/2002 | Stevens et al. |
| 6,464,789 B1 | 10/2002 | Akimoto |
| 6,471,422 B1 | 10/2002 | Ueda et al. |
| 6,475,279 B1 | 11/2002 | Akimoto |
| 6,491,491 B1 | 12/2002 | Tsuneda et al. |
| 6,507,770 B2 | 1/2003 | Tateyama et al. |
| 6,511,315 B2 | 1/2003 | Hashimoto |
| 6,526,329 B2 | 2/2003 | Tateyama et al. |
| 6,533,531 B1 | 3/2003 | Nguyen et al. |
| 6,539,956 B1 | 4/2003 | Wolke et al. |
| 6,556,893 B2 | 4/2003 | Kumar et al. |
| 6,558,053 B2 | 5/2003 | Shigemori et al. |
| 6,568,847 B2 | 5/2003 | Nishijima et al. |
| 6,575,177 B1 | 6/2003 | Brown et al. |
| 6,592,677 B1 | 7/2003 | Tomimori et al. |
| 6,616,394 B1 | 9/2003 | Park |
| 6,616,762 B2 | 9/2003 | Inada et al. |
| 6,632,292 B1 | 10/2003 | Aegerter et al. |
| 6,658,053 B1 | 12/2003 | Aiello et al. |
| 6,659,661 B2 | 12/2003 | Deguchi et al. |
| 6,672,779 B2 | 1/2004 | Ueda et al. |
| 6,673,161 B2 | 1/2004 | Ha et al. |
| 6,676,757 B2 | 1/2004 | Kitano et al. |
| 6,678,581 B2 | 1/2004 | Hung et al. |
| 6,689,257 B2 | 2/2004 | Mishima et al. |
| 6,691,430 B2 | 2/2004 | Saito et al. |
| 6,692,219 B2 | 2/2004 | Coomer et al. |
| 6,694,224 B2 | 2/2004 | Ramanan |
| 6,695,926 B1 | 2/2004 | Koyanagi et al. |

| | | |
|---|---|---|
| 6,703,316 B2 | 3/2004 | Inoue et al. |
| 6,712,579 B2 | 3/2004 | Fujii et al. |
| 6,713,239 B2 | 3/2004 | Toshima et al. |
| 6,726,848 B2 | 4/2004 | Hansen et al. |
| 6,736,556 B2 | 5/2004 | Kanagawa |
| 6,746,544 B2 | 6/2004 | Fishkin et al. |
| 6,752,543 B2 | 6/2004 | Fukutomi et al. |
| 6,752,584 B2 | 6/2004 | Woodruff et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,822,413 B2 | 11/2004 | Simondet |
| 6,832,863 B2 | 12/2004 | Sugimoto et al. |
| 6,834,210 B2 | 12/2004 | Tateyama et al. |
| 6,837,632 B2 | 1/2005 | Koyama et al. |
| 6,841,031 B2 * | 1/2005 | Iwata et al. ............ 156/345.22 |
| 6,844,274 B2 * | 1/2005 | Yoshioka et al. ............ 438/800 |
| 6,846,519 B2 | 1/2005 | Ivanov et al. |
| 6,848,876 B2 | 2/2005 | Babbs et al. |
| 6,851,872 B1 | 2/2005 | Okubo et al. |
| 6,852,007 B1 | 2/2005 | Gonzalez-Martin et al. |
| 6,866,723 B2 | 3/2005 | Ueda et al. |
| 6,868,888 B2 | 3/2005 | Adachi |
| 6,893,171 B2 | 5/2005 | Fukutomi et al. |
| 6,913,651 B2 | 7/2005 | Ivanov et al. |
| 6,927,176 B2 | 8/2005 | Verhaverbeke et al. |
| 6,929,722 B2 * | 8/2005 | Hongo et al. ............ 204/198 |
| 6,955,516 B2 | 10/2005 | Achkire et al. |
| 6,979,165 B2 | 12/2005 | Larson et al. |
| 6,979,168 B2 | 12/2005 | Uchimaki et al. |
| 6,980,187 B2 | 12/2005 | Toriumi |
| 6,987,272 B2 | 1/2006 | Ota et al. |
| 6,991,710 B2 | 1/2006 | Harris et al. |
| 7,053,386 B1 | 5/2006 | Holtam et al. |
| 7,066,787 B2 | 6/2006 | Nakanishi et al. |
| 7,100,954 B2 | 9/2006 | Klein et al. |
| 7,102,726 B2 | 9/2006 | Byun et al. |
| 7,108,001 B2 | 9/2006 | Pope et al. |
| 7,125,059 B2 | 10/2006 | Miyamoto |
| 7,134,827 B2 | 11/2006 | Larson et al. |
| 7,335,090 B2 * | 2/2008 | Takahashi et al. ............ 451/41 |
| 2001/0024691 A1 | 9/2001 | Kimura et al. |
| 2002/0029788 A1 | 3/2002 | Verhaverbeke et al. |
| 2002/0121290 A1 | 9/2002 | Tang et al. |
| 2002/0195128 A1 | 12/2002 | Shibagaki |
| 2003/0010449 A1 | 1/2003 | Gramarossa et al. |
| 2003/0045098 A1 | 3/2003 | Verhaverbeke et al. |
| 2003/0052497 A1 | 3/2003 | Holbrooks |
| 2003/0052498 A1 | 3/2003 | Holbrooks |
| 2003/0098047 A1 * | 5/2003 | Herbst et al. ............ 134/25.4 |
| 2003/0121170 A1 | 7/2003 | Achkire et al. |
| 2003/0151268 A1 | 8/2003 | Holbrooks |
| 2003/0172954 A1 | 9/2003 | Verhaverbeke |
| 2003/0192577 A1 | 10/2003 | Thakur et al. |
| 2003/0200988 A1 | 10/2003 | Brown et al. |
| 2003/0205559 A1 | 11/2003 | Hansen et al. |
| 2003/0209255 A1 | 11/2003 | Brown et al. |
| 2004/0055625 A1 | 3/2004 | Fishkin et al. |
| 2004/0091349 A1 | 5/2004 | Tabrizi et al. |
| 2004/0127044 A1 | 7/2004 | Verhaverbeke et al. |
| 2004/0197179 A1 | 10/2004 | Achkire et al. |
| 2004/0198051 A1 | 10/2004 | Hansen et al. |
| 2004/0203251 A1 | 10/2004 | Kawaguchi et al. |
| 2004/0206371 A1 | 10/2004 | Bran |
| 2005/0126030 A1 | 6/2005 | Ohmi et al. |
| 2005/0223588 A1 | 10/2005 | Hansen |
| 2005/0229426 A1 | 10/2005 | Achkire et al. |
| 2005/0241684 A1 | 11/2005 | Achkire et al. |
| 2006/0027248 A1 | 2/2006 | Lewis et al. |
| 2006/0032833 A1 | 2/2006 | Kawaguchi et al. |
| 2006/0035475 A1 | 2/2006 | Verhaverbeke et al. |
| 2006/0042651 A1 | 3/2006 | Verhaverbeke et al. |
| 2006/0045719 A1 | 3/2006 | Bacchi et al. |
| 2006/0045722 A1 * | 3/2006 | Hashimoto ............ 414/754 |
| 2006/0046482 A1 | 3/2006 | Verhaverbeke |
| 2006/0086616 A1 * | 4/2006 | Kurashina et al. ............ 205/83 |
| 2006/0104795 A1 | 5/2006 | Mimken |
| 2006/0137726 A1 * | 6/2006 | Sano et al. ............ 134/61 |
| 2006/0165408 A1 | 7/2006 | Akmoto et al. |
| 2006/0174919 A1 | 8/2006 | Randhawa |
| 2006/0174920 A1 | 8/2006 | Randhawa |
| 2006/0182535 A1 | 8/2006 | Rice et al. |
| 2006/0182536 A1 | 8/2006 | Rice et al. |
| 2007/0026321 A1 | 2/2007 | Kumar |
| 2007/0224820 A1 * | 9/2007 | Lim et al. ............ 438/690 |

FOREIGN PATENT DOCUMENTS

| | | |
|---|---|---|
| JP | 10-150090 * | 10/1998 |
| JP | 2001223195 | 8/2001 |
| JP | 2001271188 | 10/2001 |
| JP | 2001286831 | 10/2001 |
| JP | 2002162113 | 6/2002 |
| JP | 2002172367 | 6/2002 |
| JP | 2002176019 | 6/2002 |
| JP | 2004319724 | 11/2004 |
| JP | 2005051099 | 2/2005 |
| JP | 2005051101 | 2/2005 |
| JP | 2005064252 | 3/2005 |
| JP | 2005064482 | 3/2005 |
| JP | 2005166847 | 6/2005 |
| JP | 2005166848 | 6/2005 |
| JP | 2005166956 | 6/2005 |
| JP | 2005166957 | 6/2005 |
| JP | 2005166958 | 6/2005 |
| JP | 2005244130 | 9/2005 |
| JP | 2006344912 | 2/2006 |
| JP | 2006080420 | 3/2006 |
| JP | 2006093334 | 4/2006 |
| JP | 2006108512 | 6/2006 |
| JP | 2006294762 | 10/2006 |
| JP | 2007042691 | 2/2007 |
| JP | 2007059832 | 3/2007 |
| JP | 2007077410 | 3/2007 |
| JP | 2007105626 | 4/2007 |
| WO | WO 2006/115745 A1 | 11/2006 |

OTHER PUBLICATIONS

U.S. Appl. No. 11/463,429, filed Aug. 9, 2006, Thakur et al.

* cited by examiner

WET CLEAN SYSTEM DESIGN

BACKGROUND OF THE INVENTION

1. Field of the Invention

Embodiments of the invention generally relate to an integrated processing system containing multiple processing stations and robots that are capable of processing multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. Typical cluster tools used to perform semiconductor cleaning processes, commonly described as a wet/clean tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware, reliable transferring methods and reliable systems that have increased uptime.

Extraordinarily high levels of cleanliness are generally required during the fabrication of semiconductor substrates. During the fabrication of semiconductor substrates, multiple cleaning steps are typically required to remove impurities from the surfaces of the substrates before subsequent processing. The cleaning of a substrate, known as surface preparation, has for years been performed by collecting multiple substrates into a batch and subjecting the batch to a sequence of chemical and rinse steps and eventually to a final drying step. A typical surface preparation procedure may include etch, clean, rinse and dry steps. During a typical cleaning step, the substrates are exposed to a cleaning solution that may include water, ammonia or hydrochloric acid, and hydrogen peroxide. After cleaning, the substrates are rinsed using ultrapure water and then dried using one of several known drying processes.

Moreover, the push in the industry to shrink the size of semiconductor devices to improve device processing speed and reduce the generation of heat by the device, has reduced the industry's tolerance for process variability. To minimize process variability an important factor in semiconductor fabrication processes is the issue of assuring that every substrate run through a cluster tool sees the same processing conditions or receives the highest quality deposition or cleaning process steps. Conventional batch cleaning processes often do not provide results that are repeatable and uniform for each substrate positioned within the batch or from batch to batch.

In some cases, various semiconductor processes are advantageously performed using a substrate in a vertical orientation, wherein the typical processing surface(s) of the substrate face a horizontal direction. Such processes generally include cleaning processes (e.g., Marangoni drying), where insertion and removal of the substrate are critical to the performance of the process, or where the footprint of the processing apparatus is minimized by processing the substrate in a vertical orientation. However, batches of substrates are typically transferred and positioned in an input device in a cluster tool, such as a substrate cassette and/or FOUPs in a horizontal orientation. Transferring and supporting batches of substrates in a horizontal orientation is advantageous, because of the likelihood of generating particles due to the tipping and/or "rattling" of the substrates in the cassette due to the inherent instability of a semiconductor substrate that is positioned in a vertical orientation. Therefore, to transfer, orient and position a substrate from a horizontal to a vertical orientation requires the use of one or more substrate tilting device. Conventional processing systems generally require at least one or more devices positioned within each processing chamber or in a position near the processing chamber to rotate the substrate in a vertical orientation so that it can be processed vertically. In some cases multiple substrate tilting devices can be used to rotate the substrate into a vertical orientation to avoid being a bottleneck to the process sequence. Having multiple substrate tilting devices can greatly affect the reliability of the cluster tool, since the overall system reliability is proportional to the product of the reliability of each component in the system. Thus adding multiple chambers that can tilt or rotate a substrate to a vertical orientation degrades the reliability of the whole cluster tool.

Also, the process of rapidly transferring and positioning a substrate in a cluster tool generally requires a robot to grip the substrate so that the substrate will not slide on the robot blade while robot is accelerated and decelerated during the transferring process. Sliding on the robot blade will generate particles and/or cause the substrate to become chipped, which greatly affects device yield and CoO performance of the cluster tool.

Therefore, there is a need for a system, a method and an apparatus that can transfer and receive a substrate in a horizontal and vertical orientation, provide a reliable transferring process. There is also a need for a cluster tool that can meet the required device performance goals, has a high substrate throughput, and thus reduces the process sequence CoO.

SUMMARY OF THE INVENTION

The present invention generally provide an cluster tool for cleaning a substrate, comprising two or more process chambers that are configured to process a substrate in a vertical orientation, wherein the two or more process chambers are positioned a distance apart along a first direction, a robot assembly that comprises a first robot having a robot blade assembly that has a substrate supporting surface, and the first robot is adapted to position a substrate at one or more points generally contained within a first plane, wherein the first plane is generally parallel to the first direction, an actuator that is coupled to the robot blade assembly and is adapted to position the substrate supporting surface in an angular orientation relative to a horizontal plane, a first motion assembly that is adapted to position the first robot in a third direction that is generally perpendicular to the first plane, and a second motion assembly that is adapted to position the first robot in a direction generally parallel to the first direction, a chamber actuator assembly that has two or more end-effector assemblies that each have a substrate supporting surface, wherein the chamber actuator assembly is adapted to position one of the two or more end-effector assemblies in each of the two or more process chambers generally simultaneously, two or more substrate supports that are each adapted to receive one or more substrates from the first robot assembly, and a support actuator that is adapted to position the two or more substrate supports so that each of the two or more end-effector assemblies can receive a substrate from at least one of the two or more substrate supports.

Embodiments of the invention further provide a cluster tool for cleaning a substrate, comprising a first processing rack comprising two or more process chambers that each have one or more walls that form a processing region, wherein each of the two or more process chambers are configured to process a substrate in a vertical orientation, a chamber actuator assembly that are adapted to dispose a substrate in each of the two or more process chambers generally simultaneously, and a fluid source that is fluidly coupled to each of the two or more process chambers, wherein the fluid source is adapted to deliver a desired volume of a liquid to the processing regions of each of the two or more processing chambers from a fluid reservoir, and a robot assembly that comprises a first robot having a robot blade assembly that has a substrate supporting surface, and the first robot is adapted to position a substrate at one or more points generally contained within a first plane, wherein the first plane is generally parallel to the first direction and a second direction, an actuator that is coupled to the robot blade assembly and is adapted to position the substrate supporting surface in an angular orientation relative to a horizontal plane, a first motion assembly that is adapted to position the first robot in a third direction that is generally perpendicular to the first plane, and a second motion assembly that is adapted to position the first robot in a direction generally parallel to the first direction.

Embodiments of the invention further provide a method of processing a substrate in a cluster tool, comprising positioning a first substrate on a first substrate supporting device using a robot assembly, positioning a second substrate on a second substrate supporting device using the robot assembly, transferring the first substrate to a first end-effector and the second substrate to a second end-effector, positioning the first substrate in a processing region of a first processing chamber and the second substrate in a processing region of a second processing chamber simultaneously, simultaneously disposing a first processing liquid in the first processing region and the second processing region simultaneously.

Embodiments of the invention further provide a cluster tool for cleaning a substrate, comprising two or more process chambers that are configured to process a substrate in a vertical orientation, wherein the two or more process chambers are positioned a distance apart along a first direction, and each of the two or more process chambers comprise one or more walls that form a processing region, and a first megasonic actuator that is adapted to deliver energy to a processing side of a substrate that is positioned in the processing region, a robot assembly that comprises a first robot having a robot blade assembly that has a substrate supporting surface, and the first robot is adapted to position a substrate at one or more points contained within a first plane, wherein the first plane is parallel to the first direction, a first motion assembly that is adapted to position the first robot in a third direction that is perpendicular to the first plane, and a second motion assembly that is adapted to position the first robot in a direction parallel to the first direction, a chamber actuator assembly that has two or more end-effector assemblies, wherein the chamber actuator assembly is adapted to position one of the two or more end-effector assemblies in each of the two or more process chambers simultaneously, two or more chamber pass-through supports that are each adapted to receive one or more substrates from the robot assembly, and a support actuator that is adapted to position the two or more chamber pass-through supports so that each of the two or more end-effector assemblies can simultaneously receive a substrate from at least one of the two or more chamber pass-through supports.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
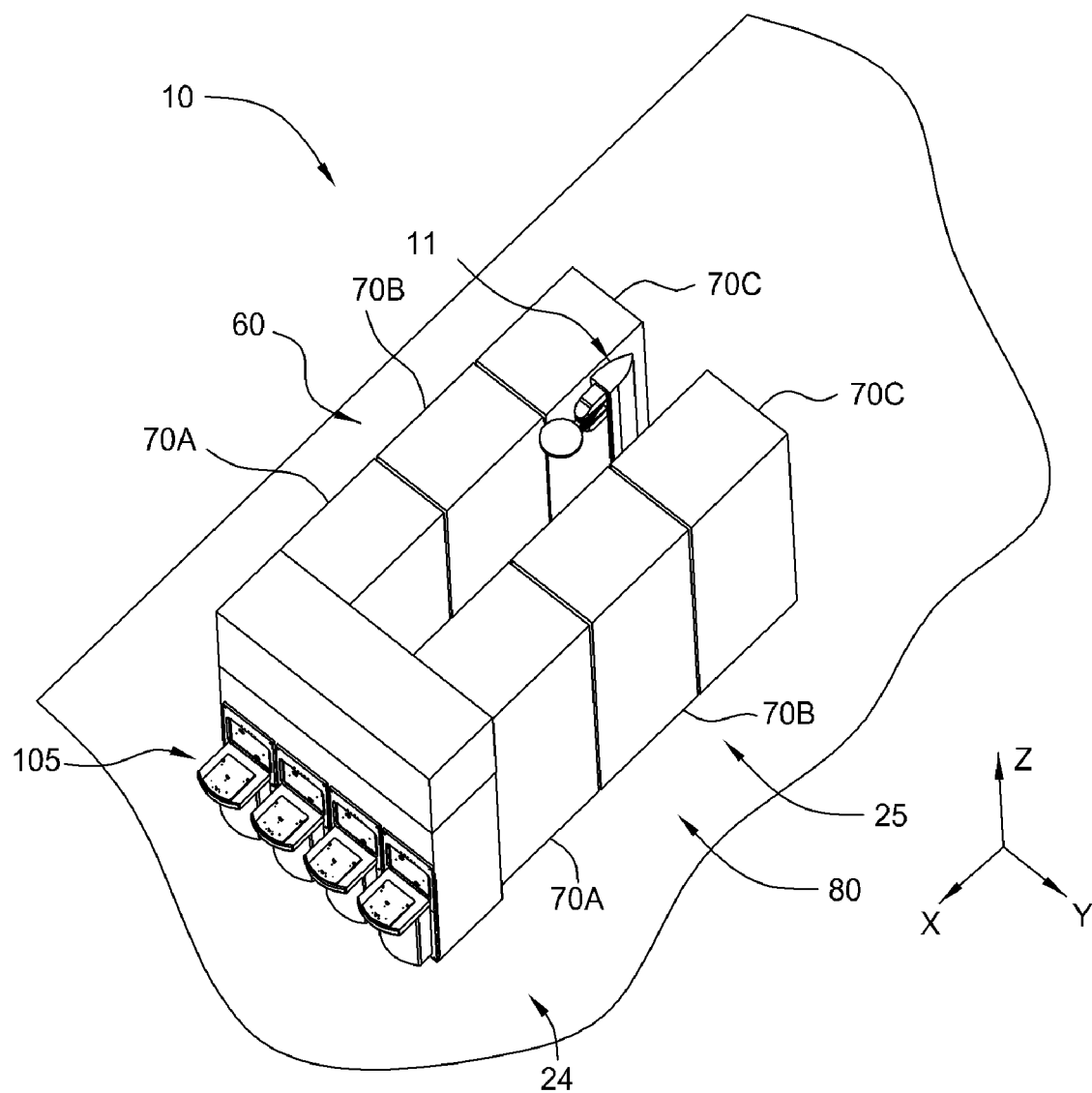
FIG. 1A is an isometric view illustrating one embodiment of a cluster tool of the invention.

The present invention generally provides an apparatus and method for processing and transferring substrates in a multi-chamber processing system (e.g., a cluster tool) that has the capability of receiving and performing single substrate processing steps performed in parallel, while using the many favorable aspects of batch processing. Embodiments of the invention described herein are adapted to maximize system throughput, reduce system cost, reduce cost per substrate during processing, increase system reliability, improve the device yield on the processed substrates, and reduce system footprint. In one embodiment, the cluster tool is adapted to perform a wet/clean process sequence in which various substrate cleaning processes are performed on a substrate in the cluster tool.

FIGS. 1-12 illustrate some of the various robot and process chamber configurations that may be used in conjunction with various embodiments of this invention. The various embodiments of the cluster tool 10 generally utilize one or more robot assemblies that are configured to transfer substrates between the various processing chambers retained in the processing racks (e.g., elements 60, 80, etc.) so that a desired processing sequence can be performed on the substrates. In one embodiment, as shown in FIGS. 1-2, the processing configuration contains one robot assembly 11 that is adapted to move a substrate in a vertical (hereafter the z-direction) and horizontal directions, i.e., transfer direction (x-direction) and a direction orthogonal to the transfer direction (y-direction), so that the substrates can be processed in various processing chambers retained in the processing racks (e.g., elements 60 and 80) which are aligned along the transfer direction. The various embodiments described herein are generally configured to minimize and control the particles generated by the substrate transferring mechanisms, to prevent device yield and substrate scrap problems that can affect the CoO of the cluster tool. Another advantage of this configuration is the flexible and modular architecture allows the user to configure the number of processing chambers, processing racks, and processing robots required to meet the throughput needs of the user. While FIGS. 1-2 illustrate one embodiment of a robot assembly 11 that can be used to carryout various aspects of the invention, other types of robot assemblies 11 may be adapted to perform the same substrate transferring and positioning function(s) without varying from the basic scope of the invention.

The present invention generally provides an apparatus and method for processing substrates in a cluster tool that has the capability of performing substrate processing steps simultaneously on multiple substrates that are processed in a single substrate fashion. In one embodiment, each of the described chambers/methods performs wet processing steps, such as but not limited to etching, cleaning, rinsing and/or drying of a single substrate in a single substrate processing chamber. In one embodiment, multiple cleaning process steps are performed on multiple substrates that are each positioned in multiple single substrate processing chambers simultaneously. The advantageous process sequence improves the substrate throughput, and reduces system complexity, process variability and chemical waste concerns commonly found when trying to wet process multiple substrates separately in a single substrate processing chamber. The embodiments described herein also improve the process results commonly found in conventional batch processing configurations, since the use of multiple single-substrate processing chambers are better able to control the key substrate processing variables on each substrate during the substrate processing steps. Such process chambers and methods are beneficial in that each substrate is exposed to the same process conditions to which the other substrates undergoing the same process are exposed. This yields higher precision processing than seen in a batch system, in which a substrate positioned in one part of a substrate batch may be exposed to slightly different process conditions (such as fluid flow conditions, chemical concentrations, temperatures, etc.) than a substrate positioned in a different part of the batch. For example, a substrate at the end of a batch containing a longitudinal array of substrates may see different conditions than a substrate at the center of the same array. Such variations in conditions can yield batches lacking in wafer-to-wafer uniformity.

Single substrate chambers/methods such as those described herein are further beneficial in that each substrate is exposed to process fluids for a shorter amount of time than is required in batch processing. Moreover, the chambers/methods described herein can be practiced using the same or smaller volumes of process fluids (on a substrate-per-substrate basis) than would be used in corresponding batch processes.

Cluster Tool Configuration

A. System Configuration

Figure 1B:
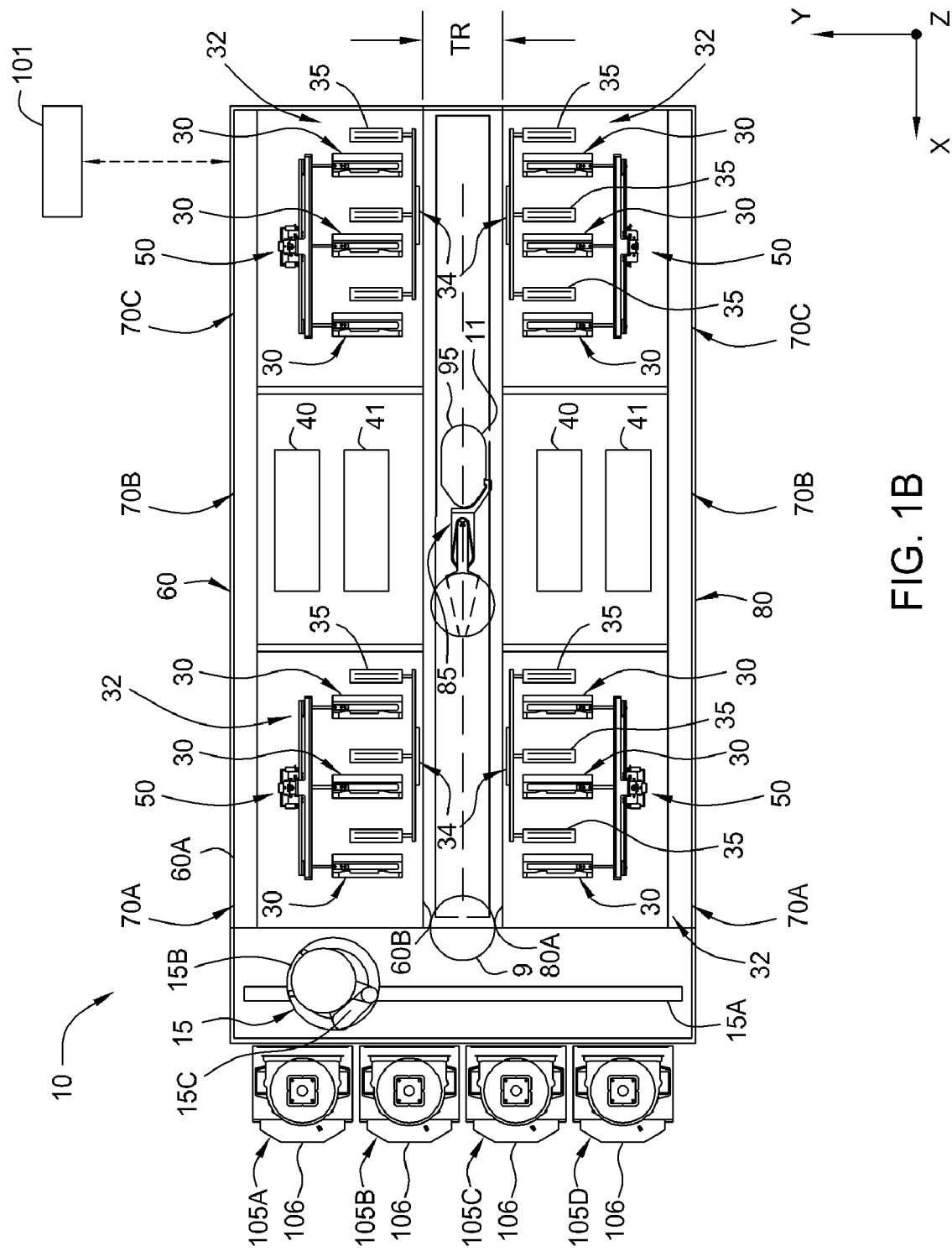
FIG. 1B is a plan view of the processing system illustrated in FIG. 1A, according to the present invention.

FIG. 1A is an isometric view of one embodiment of a cluster tool 10 that illustrates a number of the aspects of the present invention that may be used to advantage. FIG. 1A illustrates an embodiment of the cluster tool 10 which contains a single robot that is adapted to access the various process chambers that positioned in a first processing rack 60 and a second processing rack 80. FIG. 1B is a plan view of the embodiment of the cluster tool 10 shown in FIG. 1A. One embodiment of the cluster tool 10, as illustrated in FIGS. 1A and 1B, contains a front end module 24 and a central module 25. The central module 25 generally contains the first processing rack 60, the second processing rack 80, and one or more robot assemblies 11. The first processing rack 60 and a second processing rack 80 contain various processing chambers (e.g., process chambers 30 (FIG. 1B)) that are adapted to perform the various processing steps found in a substrate processing sequence.

The front end module 24 generally contains one or more pod assemblies 105 (e.g., items 105A-D) and a front end robot assembly 15 (FIG. 1B). The one or more pod assemblies 105, or front-end opening unified pods (FOUPs), are generally adapted to accept one or more cassettes 106 that may contain one or more substrates "W", or wafers, that are to be processed in the cluster tool 10. In one embodiment, the cassettes are adapted to retain the one or more substrates in horizontal orientation (i.e., processing surface, or surface on which the semiconductor devices are formed, is facing up or facing down). In one aspect, the front end module 24 also contains one or more pass-through positions 9 that allow the front end robot assembly 15 and the one or more robot assembly 11 in the central module 25 to exchange substrates.

Figure 1C:
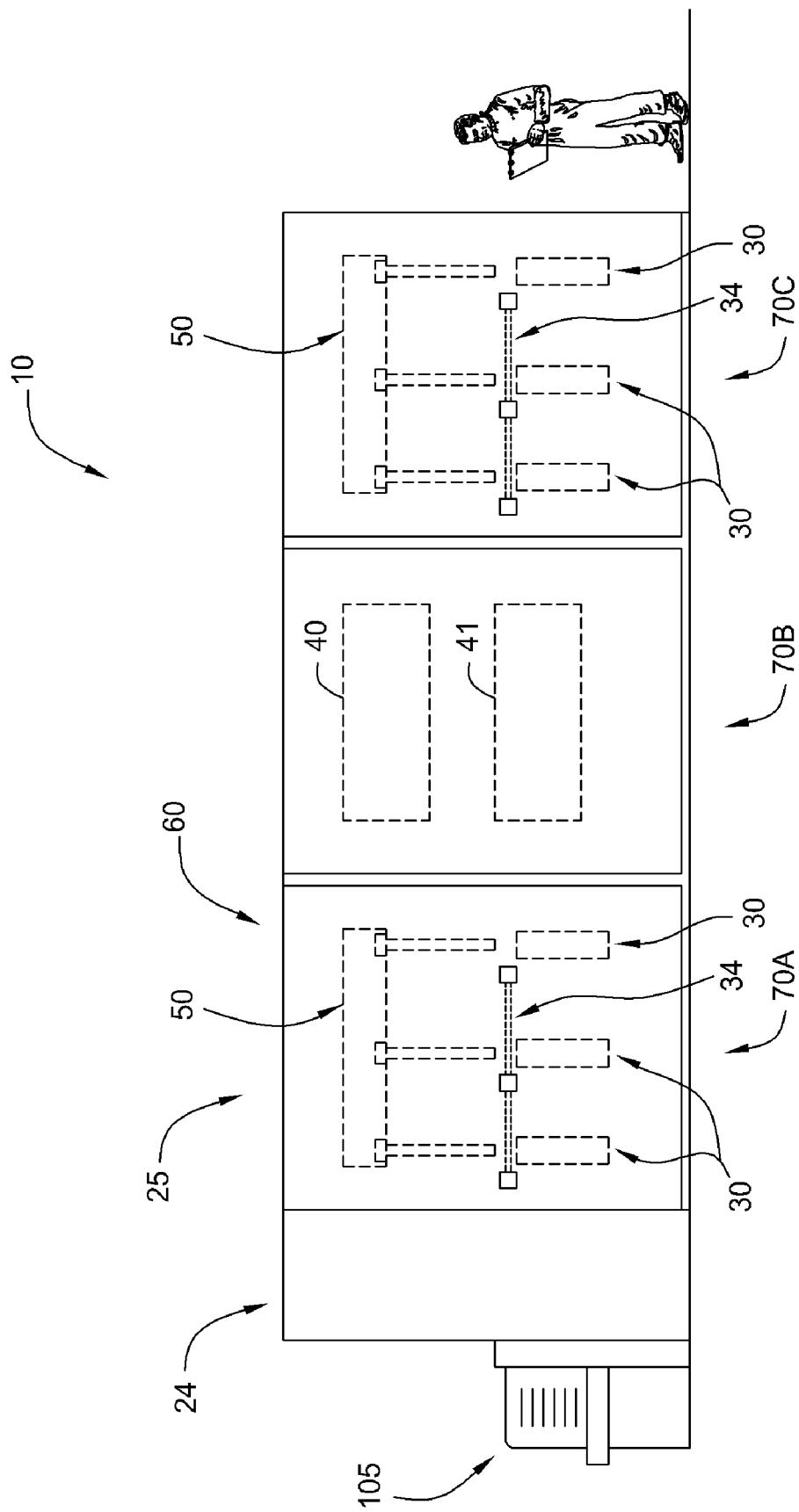
FIG. 1C is a side view that illustrates one embodiment of the first processing rack 60 according to the present invention.
Figure 1D:
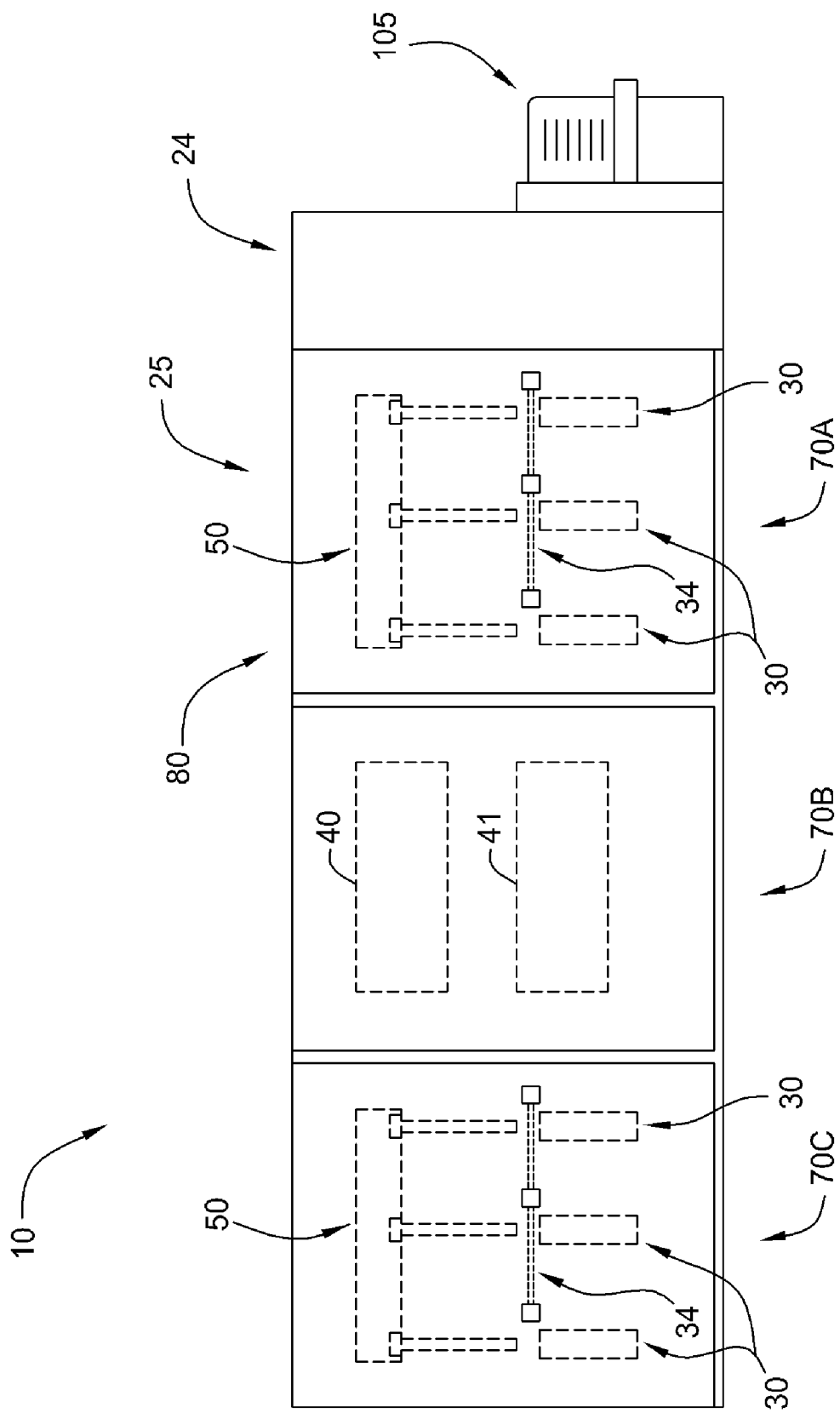
FIG. 1D is a side view that illustrates one embodiment of the second processing rack 80 according to the present invention.

The first processing rack 60 and second processing rack 80 may contain one or more modules 70A-70C that contain process chambers and/or the process chamber support hardware. FIGS. 1C and 1D illustrate side views of one embodiment of the first processing rack 60 and second processing rack 80 as viewed when facing the first processing rack 60 and second processing racks 80 from outside of the cluster tool 10. The first processing rack 60 and second processing rack 80 generally contain one or more processing chambers that are adapted to perform some desired semiconductor or flat panel display device fabrication processing steps on a substrate. For example, in FIGS. 1B and 1C the first process rack 60 contains three processing chambers. In one embodiment, these device fabrication processing steps may include cleaning a surface of the substrate, etching a surface of the substrate, or exposing the substrate to some form of radiation to cause a physical or chemical change to one or more regions on the substrate. In one embodiment, the first processing rack 60 and second processing rack 80 have one or more processing chambers contained in them that can be adapted to perform one or more cleaning processing sequence steps. Examples of a processing chambers and or systems that may be adapted to perform one or more cleaning processes on a substrate and may be adapted to benefit one or more aspects of the invention is further described in the commonly assigned United States Patent Publication No. 2002/0029788, filed Jun. 25, 2001 and United States Patent Publication No. 2003/0045098, filed Aug. 31, 2001 and, which are hereby incorporated by reference in its entirety to the extent not inconsistent with the claimed invention.

FIGS. 1B, 1C and 1D illustrate one embodiment of the cluster tool 10 that has a first processing rack 60 and a second processing rack 80 that each contain two processing chamber arrays 32 that contain a total of three process chambers 30. Generally, the processing racks 60 and 80 may contain on or more modules (e.g., reference numerals 70A-70C) that either contain processing chambers or supporting equipment. In the configuration shown, modules 70A and 70C each contain three process chambers 30 that are positioned along a desirable direction (i.e., X-direction) and module 70B contains the process supporting components, such as the fluid deliver systems 40 and 41. The orientation, positioning, type and number of process chambers shown in the FIGS. 1B-D are not intended to be limiting as to the scope of the invention, but are intended to illustrate an embodiment of the invention.

Referring to FIG. 1B, in one embodiment, the front end robot assembly 15 is adapted to transfer substrates between a cassette 106 mounted in a pod assembly 105 (see elements 105A-D) and the one or more of the pass-through positions 9. The front end robot assembly 15 generally contains a horizontal motion assembly 15A and a robot 15B, which in combination are able to position a substrate in a desired horizontal and/or vertical position in the front end module 24 or the adjoining positions in the central module 25. The front end robot assembly 15 is adapted to transfer one or more substrates using one or more robot blades 15C, by use commands sent from a system controller 101 (discussed below). In one sequence the front end robot assembly 15 is adapted to transfer a substrate from the cassette 106 to the pass-through positions 9. Generally, a pass-through position is a substrate staging area that may contain a pass-through processing chamber that is similar to a conventional substrate cassette 106, which is able to accept one or more substrates from a front end robot 15B so that it can be removed and repositioned by the robot assembly 11.

Figure 1E:
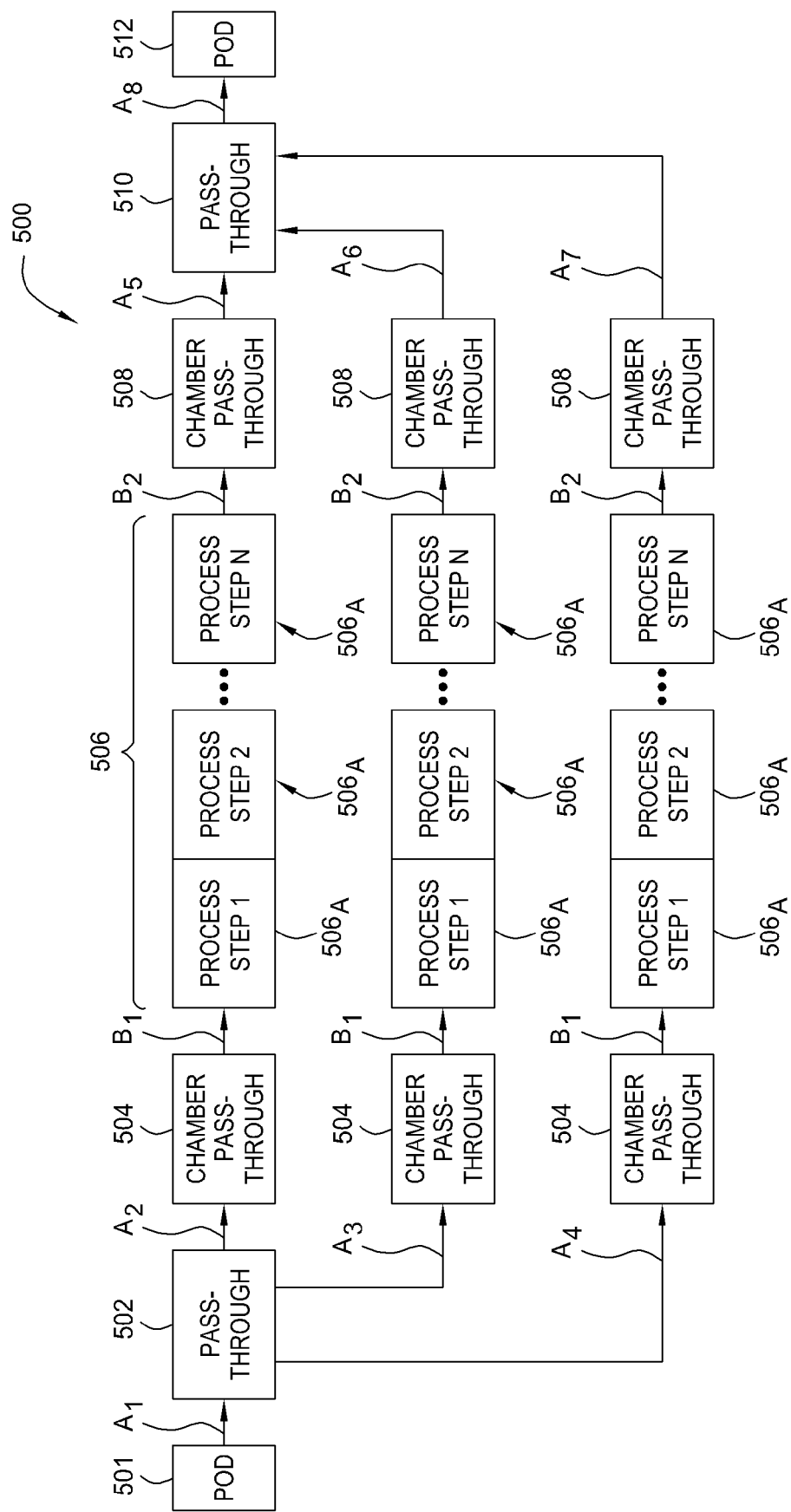
FIG. 1E illustrates one embodiment of a process sequence containing various process recipe steps that may be used in conjunction with the various embodiments of the cluster tool described herein.
Figure 1F:
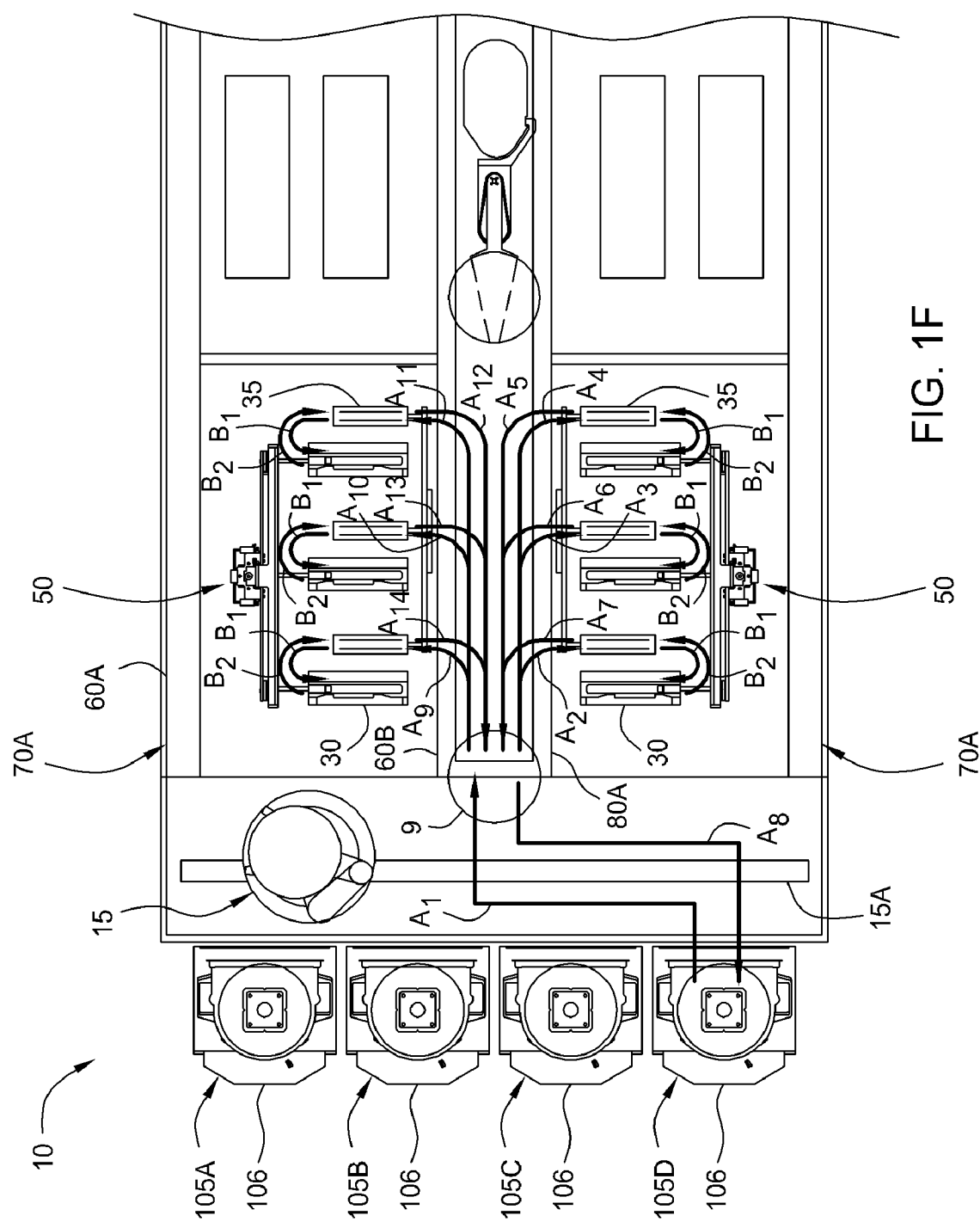
FIG. 1F is a plan view of a processing system illustrated in FIG. 1B that illustrates a transfer path of a substrate through the cluster tool following the process sequence illustrated in FIG. 1E.

A system controller 101 is used to control the front-end robot 15, the first robot assembly 11 and other supporting hardware so that substrate can be transferred to the various processing chambers contained in the first processing rack 60 and the second processing rack 80. In one embodiment, the modules 70A and 70C each contain a chamber pass-through assembly 34 that is adapted to interface with the robot assembly 11 and the actuator assembly 50. In this configuration, as shown in FIG. 1B and FIGS. 1E-1F, the substrates are transferred from the pass-through position 9 by the robot assembly 11 to a chamber pass-through assembly 34. The robot assembly 11 is adapted to transfer substrates and position substrates in a horizontal, vertical, or angular orientation so as to facilitate the transfer between various positions within the cluster tool 10. The ability to position and angularly orient a substrate using a robot assembly 11 is generally completed by cooperative movement of the components contained in the horizontal motion assembly 90, vertical motion assembly 95, and robot hardware assembly 85, supinating robot blade assembly 1100 by use of commands sent from the system controller 101. In one aspect, the side 60B of the first processing rack 60, and the side 80A of the second processing rack 80 are both aligned along a direction parallel to the horizontal motion assembly 90 (described below) of each of the various robot assemblies.

The actuator assembly 50, which is positioned so that it can communicate with the chamber pass-through assemblies 34, is adapted to position a substrate in a processing chamber 30. Therefore, the robot assembly 11 is adapted to pick-up, transfer and receive substrates from each of the chamber pass-through supports 35 contained in the chamber pass-through assembly 34 so that the end-effector assembly 52 in the actuator assembly 50 can pickup and position a substrate in the processing chamber 30. In one aspect, the transferring process the robot assembly 11 is adapted to deposit a substrate in position 36A (FIG. 1H) of the chamber pass-through 35 before it is picked-up and positioned in the process chamber 30 by the end-effector assemblies 52.

The system controller 101 is adapted to control the position and motion of the various components used to complete the transferring process. The system controller 101 is generally designed to facilitate the control and automation of the overall system and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, fluid delivery hardware, gas sources hardware, etc.) and monitor the system and chamber processes (e.g., chamber temperature, process sequence throughput, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to perform tasks relating to monitoring and execution of the processing sequence tasks and various chamber process recipe steps (e.g., See FIGS. 1E and 1F).

Figure 1G:
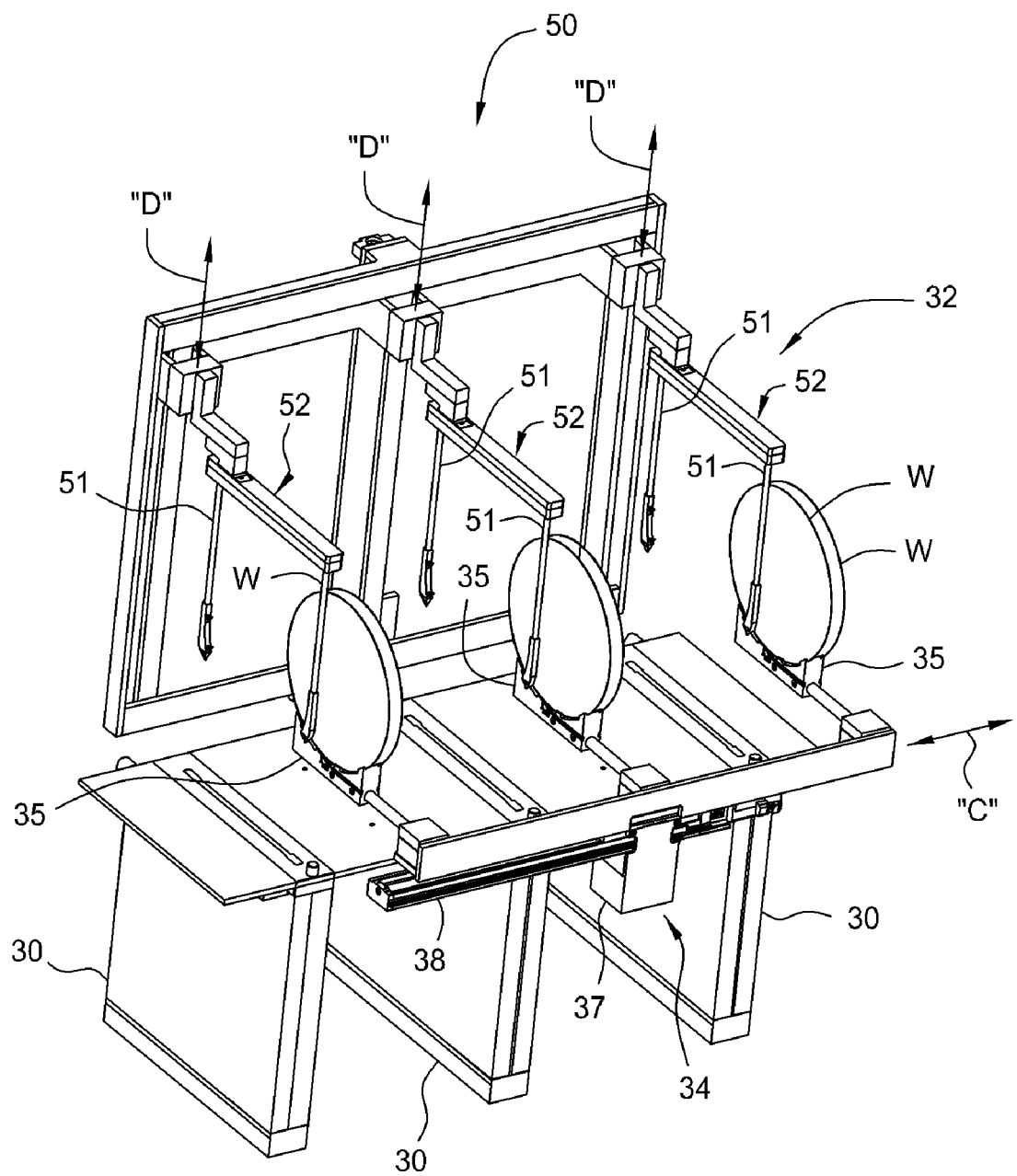
FIG. 1G is an isometric view illustrating one embodiment of a plurality of processing chambers according to the present invention.
Figure 1H:
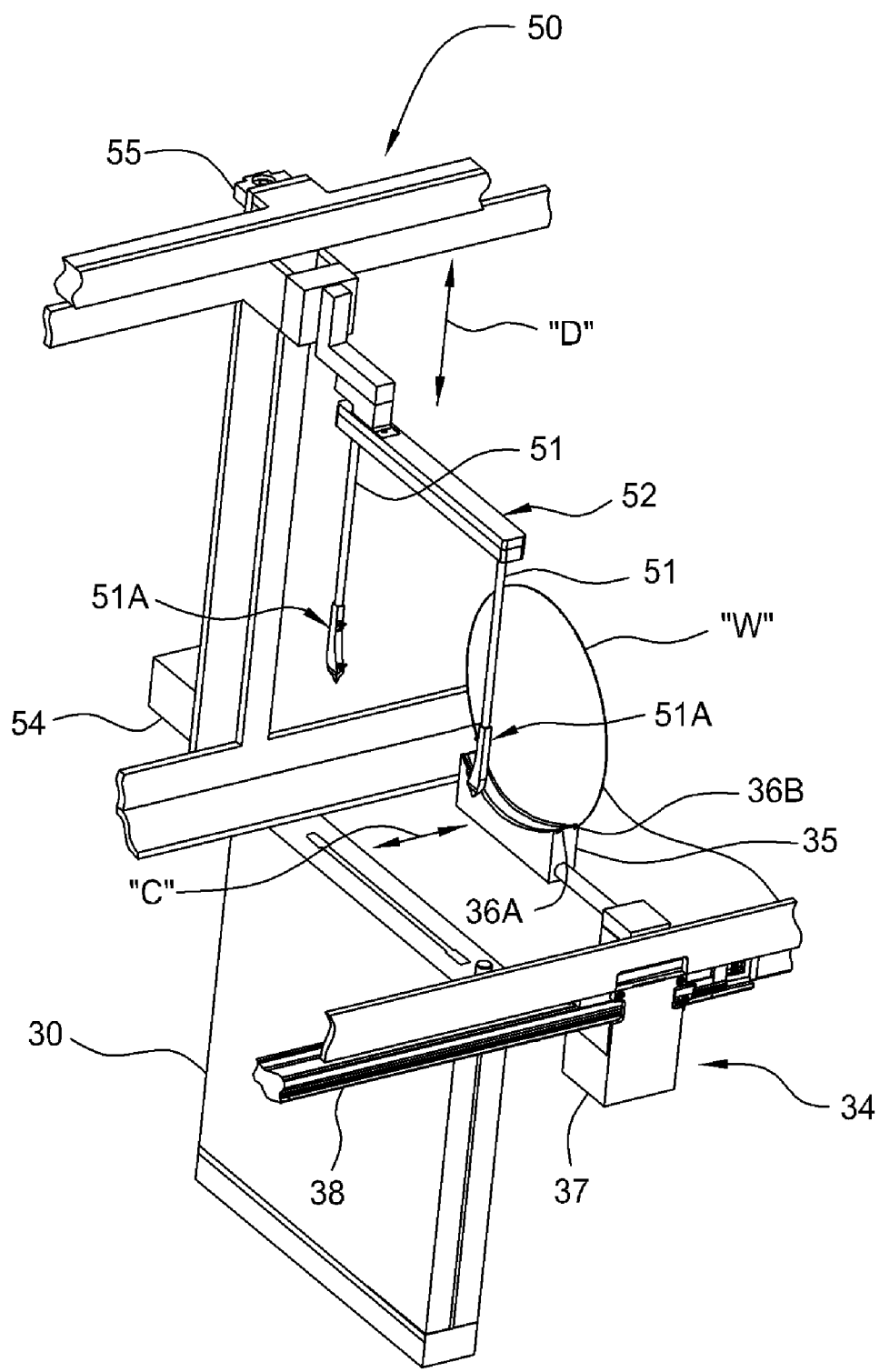
FIG. 1H is an isometric view illustrating one embodiment of a processing chamber illustrated in FIG. 1G according to the present invention.

FIGS. 1G and 1H are isometric views of one embodiment of a processing chamber array 32 that may be found in one or more of the modules 70A-70C in the first processing rack 60 or second processing rack 80. In one embodiment, the processing chamber array 32 contains three processing chambers 30, a chamber pass-through assembly 34 that contains three chamber pass-throughs 35, and an actuator assembly 50 that has three end-effector assemblies 52. In one example, as shown in FIG. 1B, the three processing chambers 30 in the processing chamber array 32 are aligned along the X-direction. An end-effector support 51A on each of the three end-effector assemblies 52 are adapted receive a substrate from an input slot 36A or an output slot 36B formed on a chamber pass-through 35. The end-effector assembly 51 is then adapted to position the substrates in the processing chambers 30. The chamber pass-through assembly 34 may have an actuator 37 (e.g., DC servomotor, linear motor, air cylinder) and linear slide 38 that are adapted to support, guide and position the three chamber pass-throughs 35 in a position relative to the end-effector assemblies 52 and the robot assembly 11 by use of commands from the system controller 101 (FIG. 1B). The actuator assembly 50 may have an actuator 54 (e.g., DC servomotor, linear motor) that is coupled to a slide assembly 55 that are adapted to support, guide and position the three end-effector assemblies 52 in a position relative to the chamber pass-throughs 35 and the processing chambers 30 by use of the controller 101 (FIG. 1B).

B. Transfer Sequence Example

FIG. 1E illustrates one example of a substrate processing sequence 500 through the cluster tool 10, where a number of process steps (e.g., elements 501-512) may be performed after each of the transferring steps $A_1$-$A_8$, $B_1$ and $B_2$ have been completed by the robot assembly 11 or the chamber pass-through assembly 34, respectively. One or more of the process steps 501-512 may entail performing one or more fluid processing steps on a substrate to clean a surface of the substrate, to etch a surface of the substrate, to deposit a material on a surface of the substrate, or to exposing the substrate to some form of radiation to cause a physical or chemical change to one or more regions on the substrate. An example of a typical process that may be performed is a substrate clean process steps. FIG. 1F illustrates an example of the transfer steps that a substrate may follow as it is transferred through a cluster tool that is configured as the cluster tool shown in FIG. 1B following the processing sequence 500 described in FIG. 1E. In this embodiment, the substrate is removed from a pod assembly 105 (item #105D) by the front end robot assembly 15 and is delivered to a chamber positioned at the pass-through position 9 following the transfer path $A_1$, so that the pass-through step 502 can be completed on the substrate. In one embodiment, the pass-through step 502 entails positioning or retaining the substrate so that another robot could pickup the substrate from the pass-through position 9. Once the pass-through step 502 has been completed, the substrate is then transferred to an input slot 36A (FIG. 1H) formed in the chamber pass-through support 35 by the robot assembly 11 following the transfer path $A_2$. A second substrate may then be transferred from the pod assembly 105 to an input slot 36A formed in another chamber pass-through support 35 by following the transfer paths $A_1$ and $A_3$, respectively. Then a third substrate is transferred from the pod assembly 105 to an input slot 36A formed in another chamber pass-through support 35 by following the transfer paths $A_1$ and $A_4$, respectively. In aspect of the invention, during the transferring steps $A_2$, $A_3$, and $A_4$ the substrate is rotated from a horizontal orientation to a vertical orientation by use of a supinating robot blade assembly 1100 (discussed below) prior to disposing the substrate in the input slots 36A of each respective chamber pass-through support 35.

After a desirable number of substrates are positioned on the chamber pass-through supports 35 the substrates are then transferred to their respective end-effector assembly 52 following the transfer path $B_1$. In one embodiment, the chamber pass-through supports 35 are simultaneously moved and positioned so that each of the end-effector assemblies 52 can receive a substrate. The end-effector assemblies 52 are adapted to simultaneously lifts (i.e., direction "D" in FIGS. 1G-1H) the substrates from the chamber pass-through supports 35 and then simultaneous deposits the substrates into each of the processing chambers 30. In one aspect, the chamber pass-through assembly 34 is adapted to transfer the substrates positioned on the chamber pass-through supports 35 to the end-effector assembly 52 and move the chamber pass-through supports 35 out of the way (i.e., direction "C" in FIG. 1H) prior to the substrates being deposited in the processing chambers 30.

After simultaneously depositing the substrates in the processing chambers 30 the process step 506 is then performed on the substrates generally simultaneously (i.e., direction "D" in FIG. 1H). The process step 506 may contain multiple sub-process steps in which one or more fluid processing steps are performed on the substrate. In one embodiment, the process step 506 generally contains 1 to N sub-process steps (e.g., reference numeral 506A), wherein N is greater than or equal to 2. The sub-process steps 506A may include but is not limited to a standard clean 1 (SC1), a standard clean 2 (SC2), an RCA clean, a HF Last clean, a DI rinse, a BEOL aqueous clean, and/or a Marangoni dry type cleaning process steps. In one example, the process step 506 contains five sub-process steps 506A that include a SC1 clean step, a DI rinse step, a HF Last step, a DI rinse step and a Marangoni dry process step. In another example, the process step 506 contains five sub-process steps 506A that include a HF Last step, a DI Rinse step, a SC1 clean step, a DI Rinse step, and an enhanced Marangoni Dry (EMD) step. In one or more of sub-process steps 506A one or more megasonic actuators (e.g., transducer assemblies 115A-115C in FIG. 3) are used to further improve the cleaning process, such as during the enhanced Marangoni dry (EMD) process. An example of various sub-process steps 506A that may be used in conjunction with one or more of the embodiments of the processing chamber 30 described herein are further described in the commonly assigned US Patent Publications 2004/0198051 and 2005/0223588, which are all incorporated by reference in their entirety.

Referring to FIGS. 1E and 1F, after completing the process step 506 the substrate is then simultaneously transferred to the pass-through supports 35 by the end-effector assemblies 52 following the transfer path $B_2$. After the substrates are positioned on the chamber pass-through supports 35 the substrates are then separately transferred to pass-through chamber 9, following the transfer paths $A_5$, $A_6$, or $A_7$ so that the pass-through step 510 can be completed on the substrate. In one embodiment, the pass-through step 510 entails positioning or retaining the substrate so that another robot could pickup the substrate from the pass-through position 9. After performing the pass-through step 510 the substrate is then transferred by the front end robot assembly 15, following the transfer path $A_8$, to the pod assembly 105D. While FIGS. 1E-1F illustrate one example of a process sequence that may be used to process a substrate in a cluster tool 10, process sequences and/or transfer sequences that are more or less complex may be performed without varying from the basic scope of the invention.

In one embodiment, while the process step 506 is being completed in the process chambers 30 in the module 70A of the first processing rack 60 multiple substrates may be transferred and loaded into the process chambers 30 in the module 70A of the second processing rack 80 following the transfer paths $A_1$, $A_9$-$A_{11}$ and $B_3$ so that the process step 506 can be completed on these new substrates. The transferring process following the transfer paths $A_1$, $A_9$-$A_{11}$ and $B_3$ is completed by the front end robot assembly 15, robot assembly 11, chamber pass-through assembly 34, and end-effector assembly 50 found in the module 70A, respectively. After completing the process step 506 the substrates are transferred back to the pod 105D following the transfer paths $B_4$, $A_{12}$-$A_{14}$ and $A_1$, respectively.

System Configurations

The number of processing chambers 30 contained within the processing chamber array 32 and/or the number of modules (e.g., reference numerals 70A, 70B, 70C) positioned within the cluster tool 10 may be advantageously selected to meet a desired substrate throughput while minimizing the system cost and complexity. FIG. 2A-2D are plan views of multiple examples of various systems and process chamber configurations that may be advantageously used. One will note that FIGS. 2A-2D are similar to FIG. 1B except the number and/or position of processing chambers 30 and chamber pass-through supports 35 have been changed, and thus like numbers for similar components have been used where appropriate and will not be discussed here. The various configurations illustrated herein are not intended to limiting as to the scope of the invention.

Figure 2A:
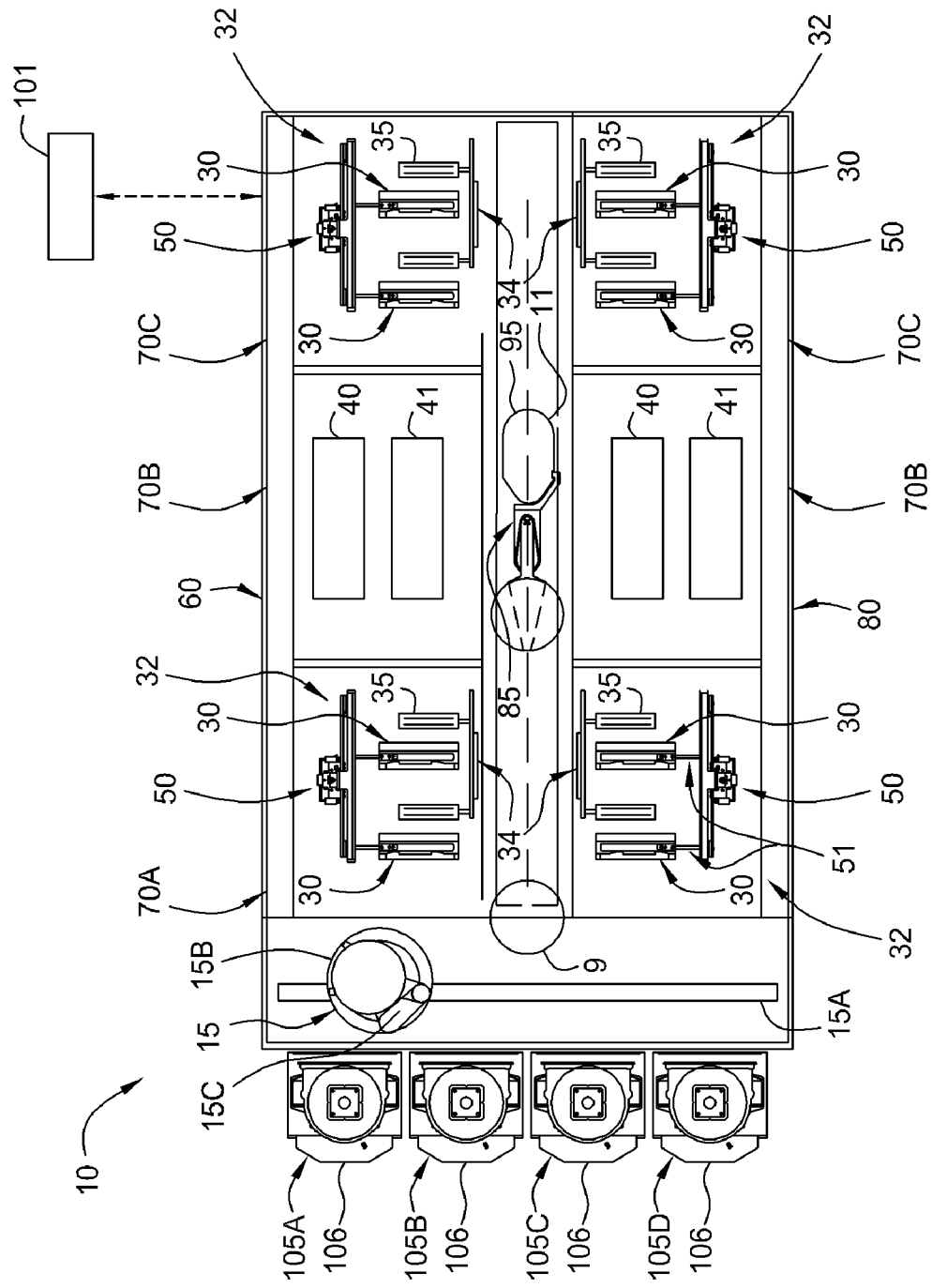
FIG. 2A is a plan view of a processing system according to the present invention.

FIG. 2A is a plan view that illustrates a cluster tool 10 that contains a two processing chambers 30 within each of the processing chamber arrays 32 that are positioned in the modules 70A and 70C in the first and second processing racks 60, 80. In one embodiment, the two processing chambers 30 are adapted to communicate with the two chamber pass-through supports 35, the two end-effector assemblies 52 and/or the robot assembly 11.

Figure 2B:
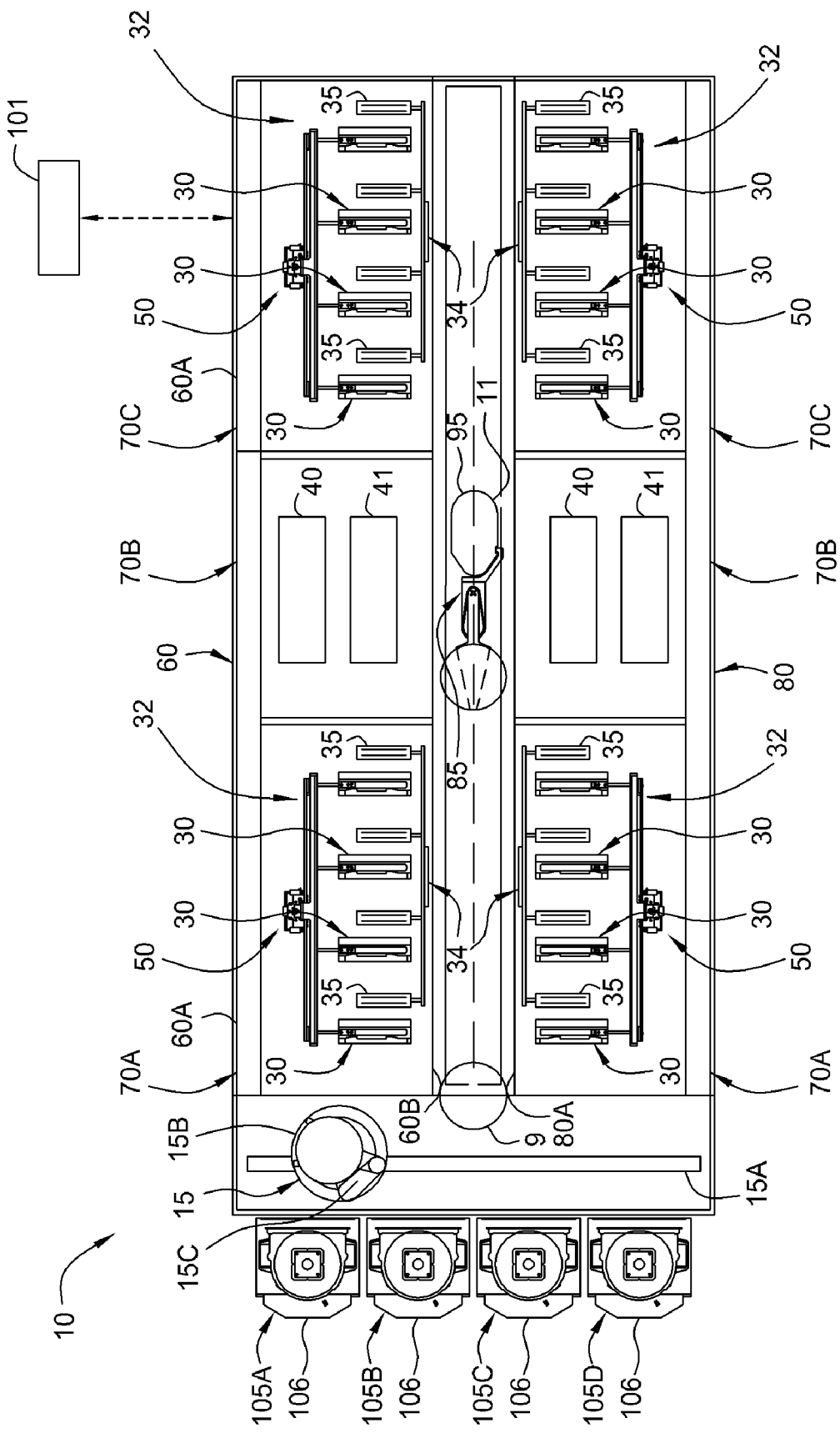
FIG. 2B is a plan view of a processing system according to the present invention.

FIG. 2B is a plan view that illustrates a cluster tool 10 that contains a four processing chambers 30 within each of the processing chamber arrays 32 that are positioned in the modules 70A and 70C in the first and second processing racks 60, 80. In one embodiment, the four processing chambers 30 are adapted to communicate with the four chamber pass-through supports 35, the four end-effector assemblies 52 and/or the robot assembly 11.

Figure 2C:
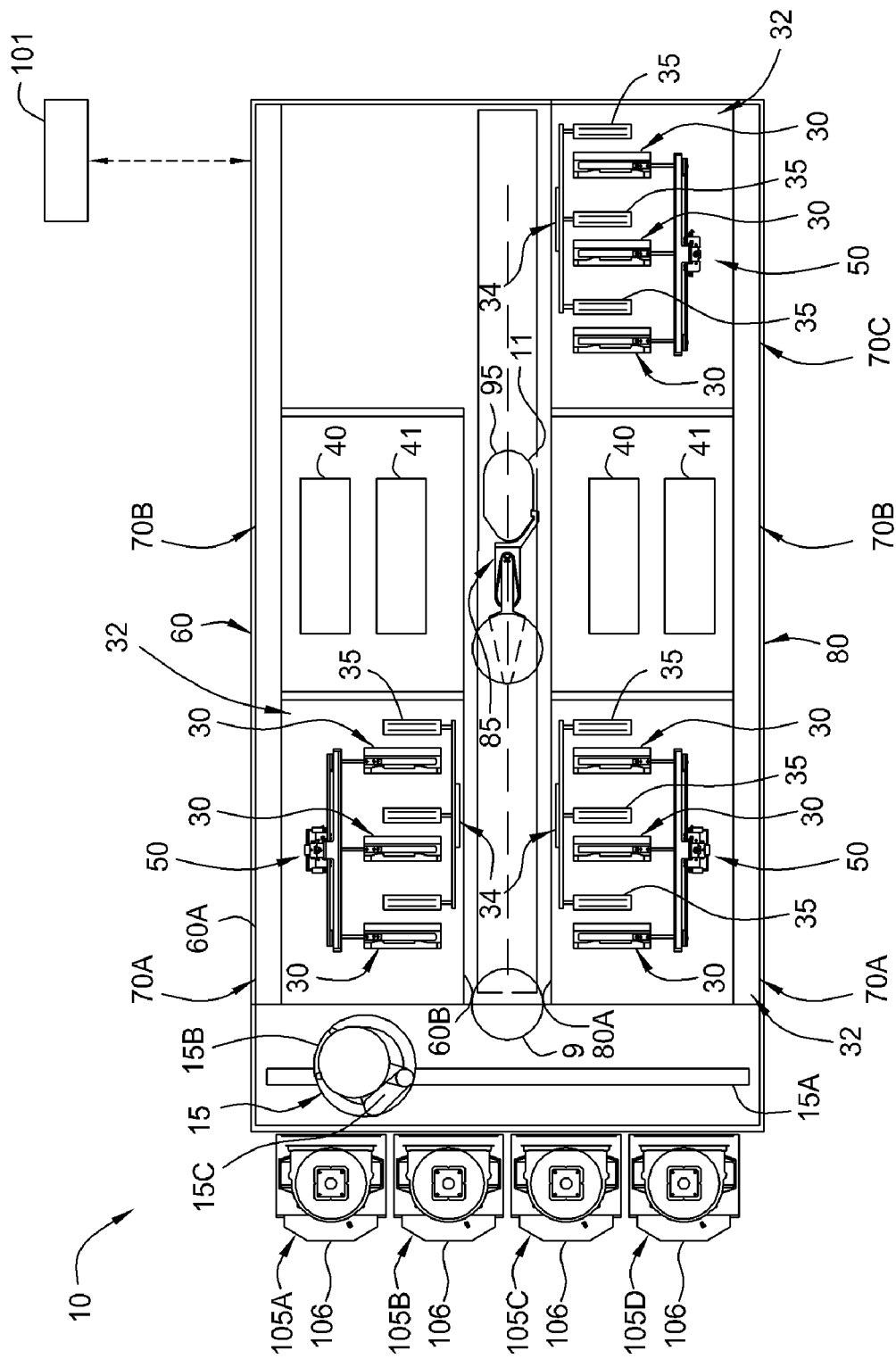
FIG. 2C is a plan view of a processing system according to the present invention.

FIG. 2C illustrates one embodiment of a cluster tool 10 that is similar to FIG. 1B except the processing chamber array 32 has been removed from the module 70C of the second processing rack 80. This configuration may be advantageous where the addition of the process chambers 30 in the module 70C of the second processing rack 80 would not help the system throughput and thus only add to the cost and complexity of the system. In one embodiment, the number of processing chambers 30 in each of the various modules 70A-70C of one or more of the processing racks, and may be configured and tailored to meet a desired substrate throughput goal.

Figure 2D:
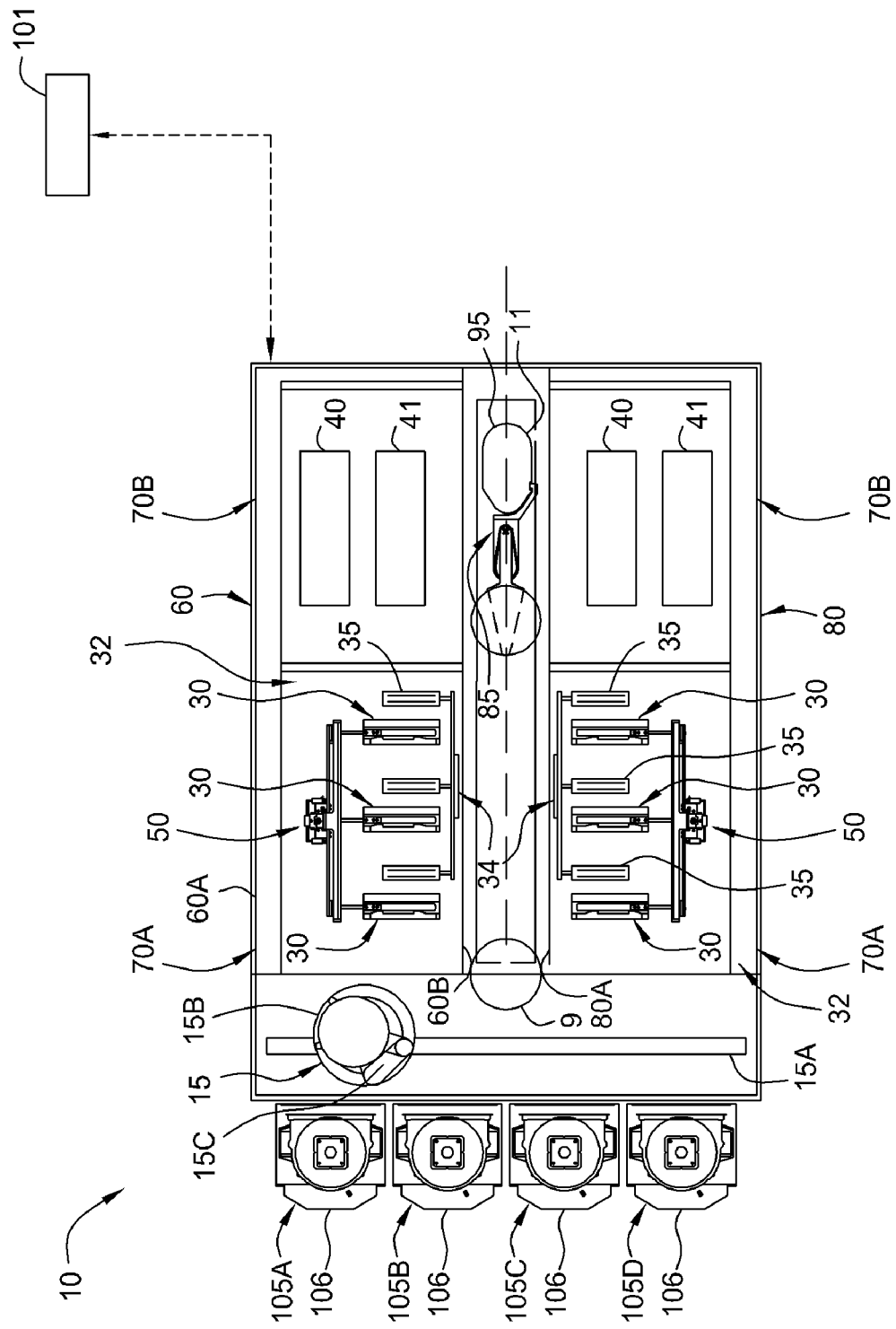
FIG. 2D is a plan view of a processing system according to the present invention.

FIG. 2D illustrates one embodiment of a cluster tool 10 that is similar to FIG. 1B except the modules 70C in the first processing rack 60 and the second processing rack 80 have been removed. This configuration may be advantageous where the addition of the process chambers 30 and modules 70C will not help the system throughput and thus only add to the cost and complexity of the system.

Process Chamber Design

The processing chambers 30 and methods of the present invention may be configured to perform substrate surface cleaning/surface preparation processes, such as etching, cleaning, rinsing and/or drying a single substrate. Method of processing and similar processing chambers may be found in U.S. Pat. No. 6,726,848, which issued on Apr. 27, 2004, U.S.

patent application Ser. No. 11/460,049, filed Jul. 26, 2006, and U.S. patent application Ser. No. 11/445,707, filed Jun. 2, 2006, all of which are incorporated herein by reference.

Figure 3:
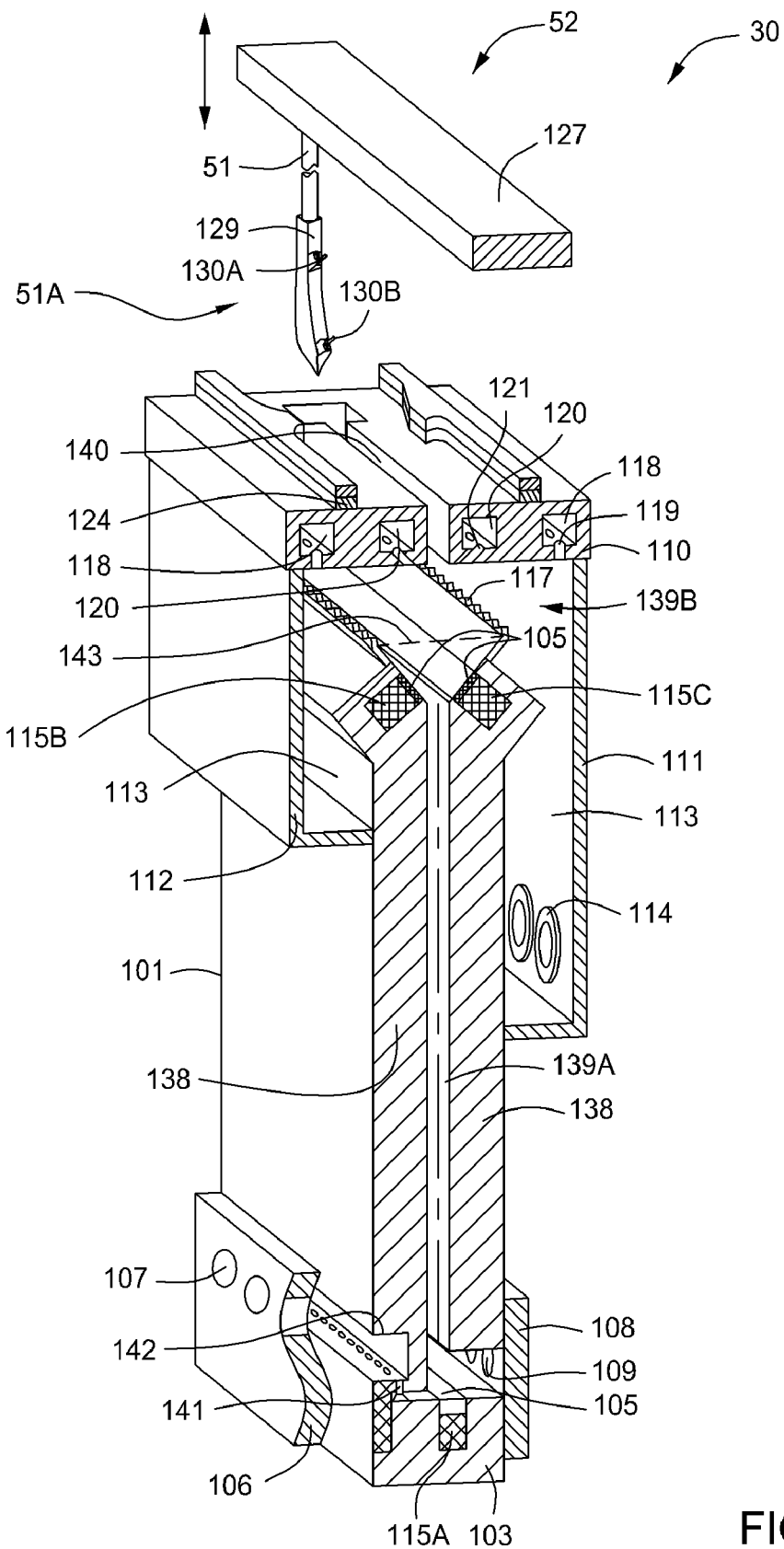
FIG. 3 is an isometric view illustrating one embodiment of a processing chamber according to the present invention.

FIG. 3 illustrates an isometric cross sectional view of one embodiment of a substrate processing chamber 30. The substrate processing chamber 30 comprises a chamber body 101 configured to retain a fluid, and an end-effector assembly 52 configured to transfer a substrate (not shown) into and out of the chamber body 101. The chamber body 101 generally includes an interior volume, indicated generally as a lower chamber volume 139A and an upper chamber volume 139B, collectively configured as a liquid and/or a vapor processing environment. More specifically, the lower chamber volume 139A is configured as a liquid processing environment, and the upper chamber volume 139B is configured as a vapor processing environment.

The lower portion of the chamber body 101 generally comprises side walls 138 and a bottom wall 103 defining the lower chamber volume 139A. The lower chamber volume 139A may have a rectangular shape configured and sized to retain fluid for immersing a substrate therein. The upper chamber volume 139B generally comprises a chamber lid 110 having an opening 140 formed therein, and an area below the lid 110 and above the lower chamber volume 139A. The opening 140 is configured to allow the end-effector assembly 52 to transfer at least one substrate in and out the chamber body 101. A weir 117 is formed on top of the side walls 138 to contain and allow fluid from the lower chamber volume 139A to overflow. The upper portion of the chamber body 101 includes overflow members 111 and 112 configured to collect fluid flowing over the weir 117 from the lower chamber volume 139A. Each of the overflow members 111, 112 may be coupled together by a conduit (not shown), such as by a hose between overflow member 112 to overflow member 111, that is configured to allow fluid to drain from overflow member 112 to overflow member 111. The coupling of the overflow members 111, 112 allows all fluid to be collected at a common location, which in this embodiment is the lower portion of overflow member 111.

An inlet manifold 142 is formed on the sidewall 138 near the bottom of the lower portion of the chamber body 101 and is configured to fill the lower chamber volume 139A with processing fluid. The inlet manifold 142 has a plurality of apertures 141 opening to the bottom of the lower chamber volume 139A. An inlet assembly 106 having a plurality of inlet ports 107 is connected to the inlet manifold 142. Each of the plurality of inlet ports 107 may be connected with an independent fluid source (e.g., fluid delivery systems 40, 41 in FIGS. 1B and 4) by a dedicated valve (not shown), such as sources for etching, cleaning, and DI water for rinsing, such that different fluids, or a combination of fluids, may be supplied to the lower chamber volume 139A for different processes.

As the processing fluid fills up the lower chamber volume 139A and reaches the weir 117, the processing fluid overflows from the weir 117 to an overflow volume 113 formed at least partially by the overflow members 111 and 112. Fluid from overflow member 112 may be flowed to the overflow member 111 to a common collection point in the lower portion of overflow member 111. A plurality of outlet ports 114, configured to drain the collected fluid, may be formed on the overflow member 111. The plurality of outlet ports 114 may be connected to a pump system, and in one embodiment, each of the plurality of outlet ports 114 may form an independent drain path dedicated to a particular processing fluid. In one embodiment, each drain path may be routed to a negatively pressurized container to facilitate rapid removal, draining, and/or recycling of the processing fluid. In one embodiment, the lower chamber volume 139A may include a volume between about 1500 milliliters (mL) to about 2500 mL, for example, between about 1800 mL to about 2400 mL. In one embodiment, the lower chamber volume 139A may be filled in less than about 10 seconds, for example less than about 5 seconds.

A drain assembly 108 may be coupled to the sidewall 138 near the bottom of the lower chamber volume 139A that is in fluid communication with the lower chamber volume 139A. The drain assembly 108 is configured to drain the lower processing volume 139A rapidly. In one embodiment, the drain assembly 108 has a plurality of drain ports 109, each configured to form an independent drain path dedicated to a particular processing fluid. Examples of fluid supply and drain configurations may be found in FIGS. 9-10 of U.S. patent application Ser. No. 11/445,707, filed Jun. 2, 2006, which was previously incorporated by reference.

In one embodiment of the processing chamber 30, a transducer assembly 115A is disposed behind or integral to a window 105 in the bottom wall 103. The transducer assembly 115A may be one or more megasonic transducers configured to provide megasonic energy to the lower processing volume 139A. The transducer assembly 115A may include a single transducer or an array of transducers, oriented to direct megasonic energy into the lower chamber volume 139A via the window 105. In another embodiment, a pair of transducer assemblies 115B, 115C, each of which may include a single transducer or an array of multiple transducers, are positioned behind or integral to windows 105 at an elevation below that of the weir 117, and are oriented to direct megasonic energy into an upper portion of lower chamber volume 139A. The transducer assemblies 115B and 115C are configured to direct megasonic energy towards a front surface and a back surface of a substrate, respectively, as the substrate is positioned in the lower chamber volume 139A, and may be actuated as the substrate passes through a liquid/vapor interface, generally indicated by a dashed line at 143. The addition of focused megasonic energy, as well as the controlled delivery of fluid to the substrate, will provide better substrate, and substrate-to-substrate, cleanliness results than substrates processed in a batch of multiple substrates. Examples of transducer assemblies, power adjustment to transducer assemblies, angle adjustments to transducer assemblies, and substrate orientations may be found in U.S. patent application Ser. No. 11/460,054, filed Jul. 26, 2006, and U.S. patent application Ser. No. 11/460,172, filed Jul. 26, 2006, which are both incorporated by reference herein.

As shown in FIG. 3, the opening 140 formed in the chamber lid 110, which is configured to allow the end-effector assembly 52 in and out the chamber body 101. The end-effector assembly 52 comprises a pair of rods 51 connected to a frame 127, which is coupled to an actuator 54 (FIG. 1H) configured to move the end-effector assembly 52 relative to the chamber body 101. Each of the rods 51 have a substrate support assembly 51A which contains a effector 129 that contains substrate supporting elements 130A, 130B. The substrate support assembly 51A may comprise an end effector 129 configured to receive and secure the substrate 137 by an edge of the substrate. In one embodiment, the chamber lid 110 includes one or more inlet plenums 120 and one or more exhaust plenums 118, which may be formed on each side of the opening 140. Each exhaust plenum may contain one or more exhaust ports 119.

During processing, the lower chamber volume 139A may be filled with a processing liquid supplied from the inlet manifold 142, and the upper chamber volume 139B may be filled with a vapor coming in from the openings 121 disposed on the chamber lid 110. The liquid/vapor interface 143 may be created in the chamber body 101 by the introduction of the vapor from the openings 121. In one embodiment, the processing liquid fills up the lower chamber volume 139A and overflows from the weir 117, and the liquid/vapor interface 143 is located at substantially the same level as the upper portion of the weir 117.

Also, during processing, a substrate (not shown) being processed in the substrate processing chamber 100 is first immersed in the processing liquid disposed in the lower chamber volume 139A, and then pulled out of the processing liquid. It is desirable that the substrate is free of the processing liquid after being pulled out of the lower chamber volume 139A. In one embodiment, the presence of a surface tension gradient on the substrate will naturally cause the liquid to flow away from regions of low surface tension, which may be referred to as the Marangoni effect, is used to remove the processing liquid from the substrate. The surface tension gradient may be created at the liquid/vapor interface 143. In one embodiment, an IPA vapor is used to create the liquid/vapor interface 143. When the substrate is being pulled out from the processing liquid in the lower chamber volume 139A, the IPA vapor condenses on the liquid meniscus extending between the substrate and the processing liquid, which facilitates a concentration of IPA in the meniscus, and results in the so-called Marangoni effect.

Chemical Delivery System

In one embodiment of the invention, one or more chemical delivery systems are configured to deliver a processing solution to two or more of the processing chambers 30 positioned within the cluster tool 10. The chemical delivery systems may be connect to all of the processing chambers 30 contained within each of the modules (e.g., reference numerals 70A-70C), within a processing rack (e.g., reference numerals 60 or 80), or within the cluster tool 10. The one or more chemical delivery systems are advantageously used to reduce the system complexity, redundancy, cost, and waste typically experienced in systems that utilize a dedicated chemical delivery sources to each processing chamber in the system. In general the one or more chemical delivery systems, such as the first fluid deliver system 40 and or the second fluid delivery system 41, are adapted to retain, deliver and control the concentrations of the various chemical components in a process solution (e.g., reference numeral "E" FIG. 4) that is used during one or more of the steps in the method steps 500, discussed above. In one example, an SC1 processing solution is delivered to two or more of the processing chambers 30 in one of the modules (e.g., reference numerals 70A-70C) during one or more of the sub-steps 506A found in step 506.

Figure 4:
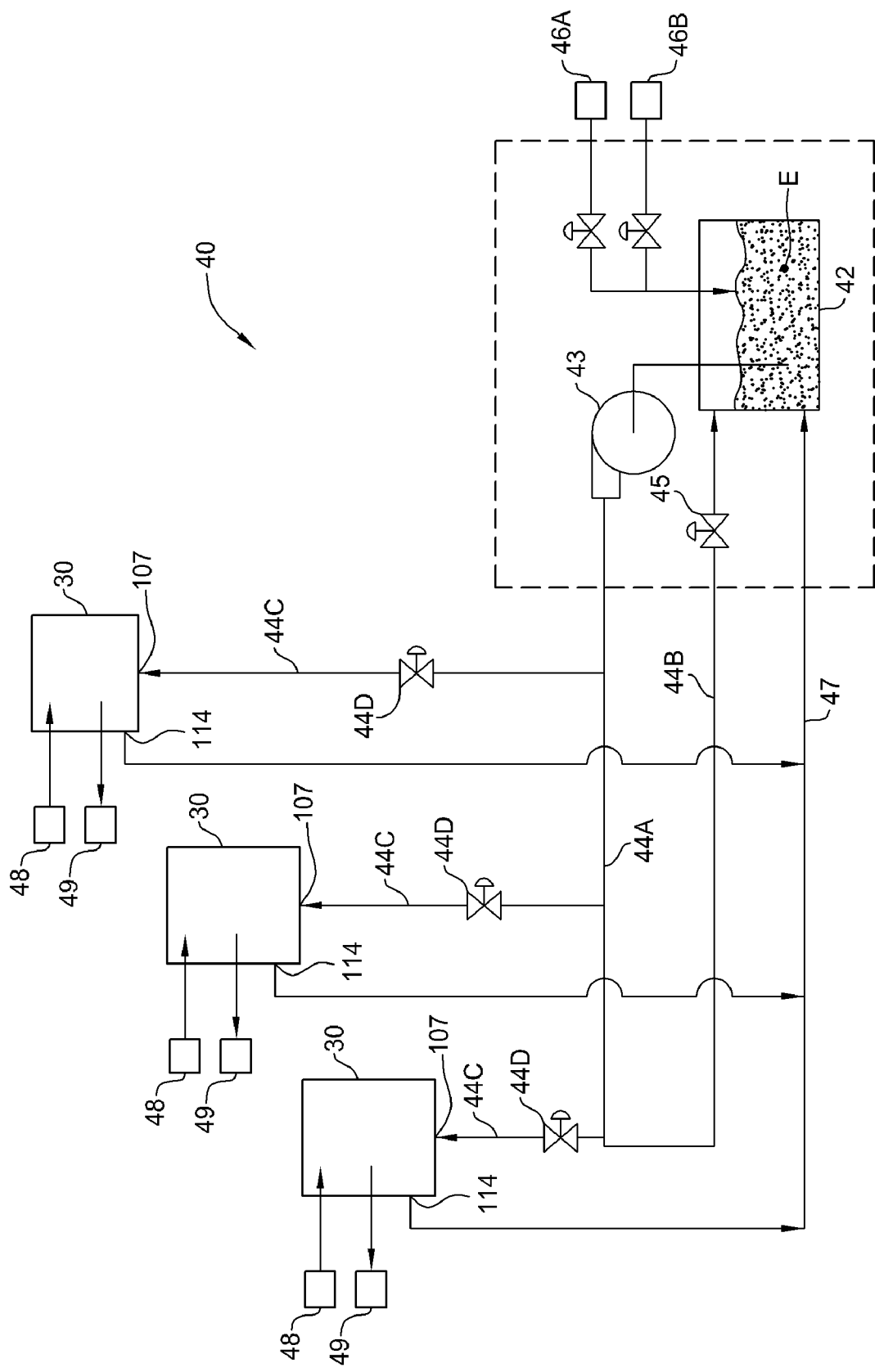
FIG. 4 is plumbing schematic according to the present invention.

FIG. 4 is a schematic of one embodiment of the first fluid delivery system 40 that is adapted to deliver a processing solution "E" to one or more of the processing chambers 30 positioned in the cluster tool 10. In this configuration, a pump 43 is adapted to deliver the processing solution "E" from the tank 42 to an inlet line 44A that is in fluid communication with each of the processing chambers 30 through each of their respective chamber inlet lines 44C. A chamber inlet line 44C is in communication with lower chamber volume 139A of a processing chamber 30 through an inlet port 107 (FIG. 3), discussed above. Each of the processing chambers 30 can selectively receive fluid from the inlet line 44A by opening the valve 44D connected to the chamber inlet line 44C that are controlled by the system controller 101. During processing the fluid that is delivered to the processing chamber 30 is returned to the tank 42 through the drain line 47. The unused processing solution delivered to the inlet line 44A by the pump is re-circulated back to the tank 42 through the return line 44B and flow regulation valve 45 (e.g., back pressure valve) so that the processing solution is never stagnant and the concentration processing solution throughout the fluid delivery system is uniform. As the concentration of the various components in the processing solution due to aging, or breakdown during processing, one or more dosing sources 46A, 46B are used to dose, or "spike", the processing solution to control the desired component's concentration.

In one embodiment, a fluid delivery source 48 is adapted to deliver an inert gas, such as nitrogen ($N_2$) or an IPA vapor to a portion of the processing chamber 30 during one or more of the phases of the process performed during a processing sequence. The inert gas or IPA vapor concentration may be controlled and exhausted from the processing chamber 30 by use of a conventional exhaust source 49 and flow regulating valve (not shown).

In one embodiment, the second fluid delivery system 41 (not shown in FIG. 4 for clarity) is configured similarly as the first fluid delivery system 40 and thus contains the same hardware components that are illustrated in conjunction with the first fluid delivery system 40 shown in FIG. 4. In this configuration, the second fluid delivery system 41 is communication with a second inlet port 107 that is connected to on the processing chamber 30. The second inlet port 107 is different than the first inlet port 107 that the first fluid delivery system 40 is connected to on each of the processing chambers 30. In this configuration the second fluid delivery system 41 is adapted to contain and deliver a processing solution that is different than the processing solution delivered from the first fluid delivery system 40. In one example the first chemical delivery system 40 contains a SC1 chemistry while the second fluid delivery system 41 contains an HF Last type chemistry, that are commonly available from Applied Materials of Santa Clara, Calif. Typically, the SC1 chemistry will contain ammonium hydroxide, hydrogen peroxide, and water in a ratio of 1:2:100 ($NH_4OH:H_2O_2:H_2O$). The processing solution used in the HF Last process may contain HF and DI water in a concentration between about 50:1 and 500:1 ($H_2O:HF$).

Robot Assemblies

In general the various embodiments of the cluster tool 10 described herein have particular advantage over prior art configurations due to the reduced cluster tool foot print created by the reduced size of the robot assemblies (e.g., element 11 in FIG. 5A) and a robot design that minimizes the physical encroachment of a robot into a space occupied by other cluster tool components (e.g., robot(s), process chambers) during the process of transferring a substrate. The reduced physical encroachment prevents collisions of the robot with other foreign components. While reducing the footprint of the cluster tool, the embodiments of the robot described herein, also has particular advantage due to the reduced number of axes that need to be controlled to perform the transferring motion. This aspect is important since it will improve the reliability of the robot assemblies and thus the cluster tool. The importance of this aspect may be better understood by noting that the reliability of a system is proportional to the product of the reliability of each component in the system. Therefore, a robot having three actuators that each have a 99.00% up-time is always better than a robot that has four actuators that each have a 99.00% up-time, since the system up-time for three actuators each having 99.00% up-time is 97.03% and for four actuators each having 99.00% up-time is 96.06%.

In a case where the system throughput is robot limited, the maximum substrate throughput of the cluster tool is governed by the total number of robot moves to complete the process sequence and the time it takes to make the robot move. The time it takes a robot to make a desired move is usually limited by robot hardware, distance between processing chambers, substrate cleanliness concerns, and system control limitations. Typically the robot move time will not vary much from one type of robot to another and is fairly consistent industry wide. Therefore, a cluster tool that inherently has fewer robot moves to complete the processing sequence will have a higher system throughput than a cluster tool that requires more moves to complete the processing sequence, such as cluster tools that contains multiple pass-through steps.

Various semiconductor processes are advantageously performed using a substrate in a vertical orientation, wherein the processing surface(s) of the substrate face a horizontal direction. Such processes, as discussed above, generally include cleaning processes (e.g., Marangoni drying), where insertion and removal of the substrate are critical to the performance of the process, or where the footprint of the processing apparatus is minimized by processing the substrate in a vertical orientation. As noted above, when using these processes it is common to have both horizontal and vertical substrate retaining or processing stations that require a substrate tilting devices to orient the substrate prior to completing one or more desired process sequence steps. To reduce the system complexity and improve the system reliability embodiments of the invention utilize a supinating robot blade assembly 1100 to support and position a substrate in a vertical, horizontal or other angular orientation during the one or more steps in the process of transferring the substrate through a cluster tool.

As noted above, conventional processes of transferring a substrate from a horizontal orientation to vertical orientation, and vice versa, can also lead to a number of device yield problems due to particles created by the positioning of the substrate on a substrate receiving surface. To eliminate the issues that arise from the handoff of a constrained substrate, and the reliability issues created by adding multiple substrate orienting mechanisms, various embodiments of the invention disclosed herein generally provide a method and apparatus to transfer a substrate in a constrained and unconstrained state in a horizontal and vertically oriented manner. FIGS. 5A-5F illustrate one embodiment of an apparatus and method of transferring a substrate in a constrained state and then transferred to a substrate support in an unconstrained vertically oriented manner.

Cartesian Robot Configuration

Figure 5A:
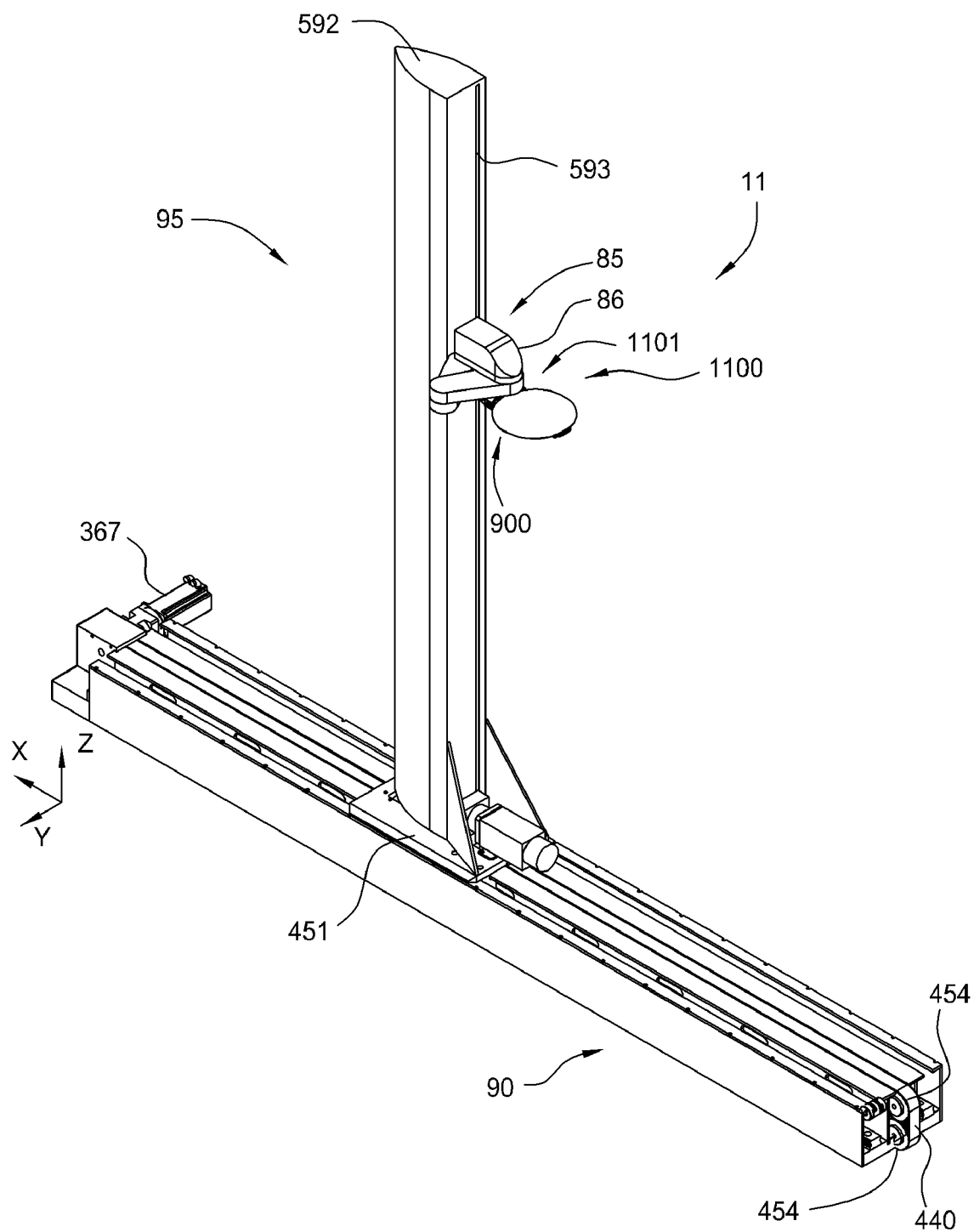
FIG. 5A is an isometric view illustrating one embodiment of a robot that may be adapted to transfer substrates in various embodiments of the cluster tool.

FIG. 5A illustrates one embodiment of a robot assembly 11 that may be used as one or more of the robot assemblies 11. The robot assembly 11 generally contains a robot hardware assembly 85, one or more vertical robot assemblies 95 and one or more horizontal robot assemblies 90. A substrate can thus be positioned in any desired X, Y and Z position in the cluster tool 10 by the cooperative motion of the robot hardware assemblies 85, vertical robot assemblies 95, horizontal robot assemblies 90, and supinating robot blade assembly 1100 from commands sent by the system controller 101.

The robot hardware assembly 85 generally contains one or more transfer robot assemblies 86 that are adapted to retain, transfer and position one or more substrates by use of commands sent from the system controller 101. In one embodiment, as shown in FIG. 5A, a single transfer robot assemblies 86 containing a supinating robot blade assembly 1100 is attached to in a robot assembly 11. In one embodiment, supinating robot blade assembly 1100 contains a robot blade assembly 900 (FIG. 6A) and an actuator assembly 1101 that are coupled to one or more linkages and actuator components that are adapted to position a substrate in desired orientation. The supinating robot blade assembly 1100 is adapted to hold, or restrain, a substrate so that the accelerations experienced by a substrate during a transferring process will not cause the substrate to move from a known position on the robot blade assembly 900, while allowing the substrate to be positioned and deposited on a chamber pass-through 35 or in a processing chamber 30 in a horizontal, vertical or other angular orientation. As noted above, movement of the substrate during the transferring process will generate particles and reduce the substrate placement accuracy and repeatability by the robot.

Figure 5B:
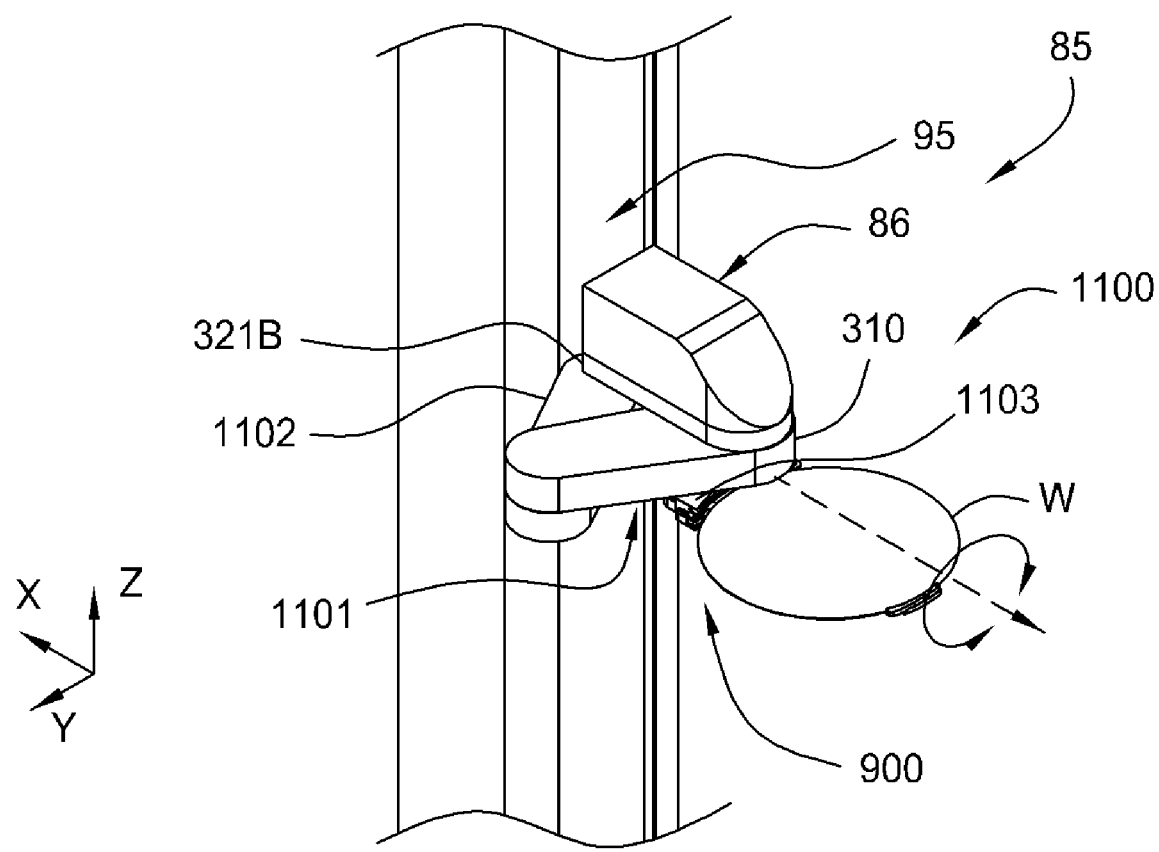
FIG. 5B is an isometric view illustrating one embodiment of a robot hardware assembly having a single robot assembly according to the present invention.

FIGS. 5A-5G illustrate embodiments of a robot assembly 11 and a transfer robot assemblies 86 that may be adapted to support and retain a substrate "W" while it is transferred through the cluster tool 10. In one embodiment, the transfer robot assemblies 86 shown in FIGS. 5-6 are adapted to transfer substrates generally parallel to a horizontal plane, such as a plane that includes the X and Y directions (FIG. 5A), due to the motion of the various components in the transfer robot assemblies 86. FIG. 5B is a close up isometric view of the robot assembly 11 illustrated in FIG. 5A that has a supinating robot blade assembly 1100 that is attached to a linkage 1102 within the transfer robot assembly 86. In this configuration the transfer robot assembly 86 and supinating robot blade assembly 1100 are aligned in forward position to allow the substrate "W" to be transferred in the X or Z-directions by use of the horizontal motion assembly 90 and the vertical motion assembly 95 without the interfering with adjacent processing rack components (FIG. 1B).

Figure 5C:
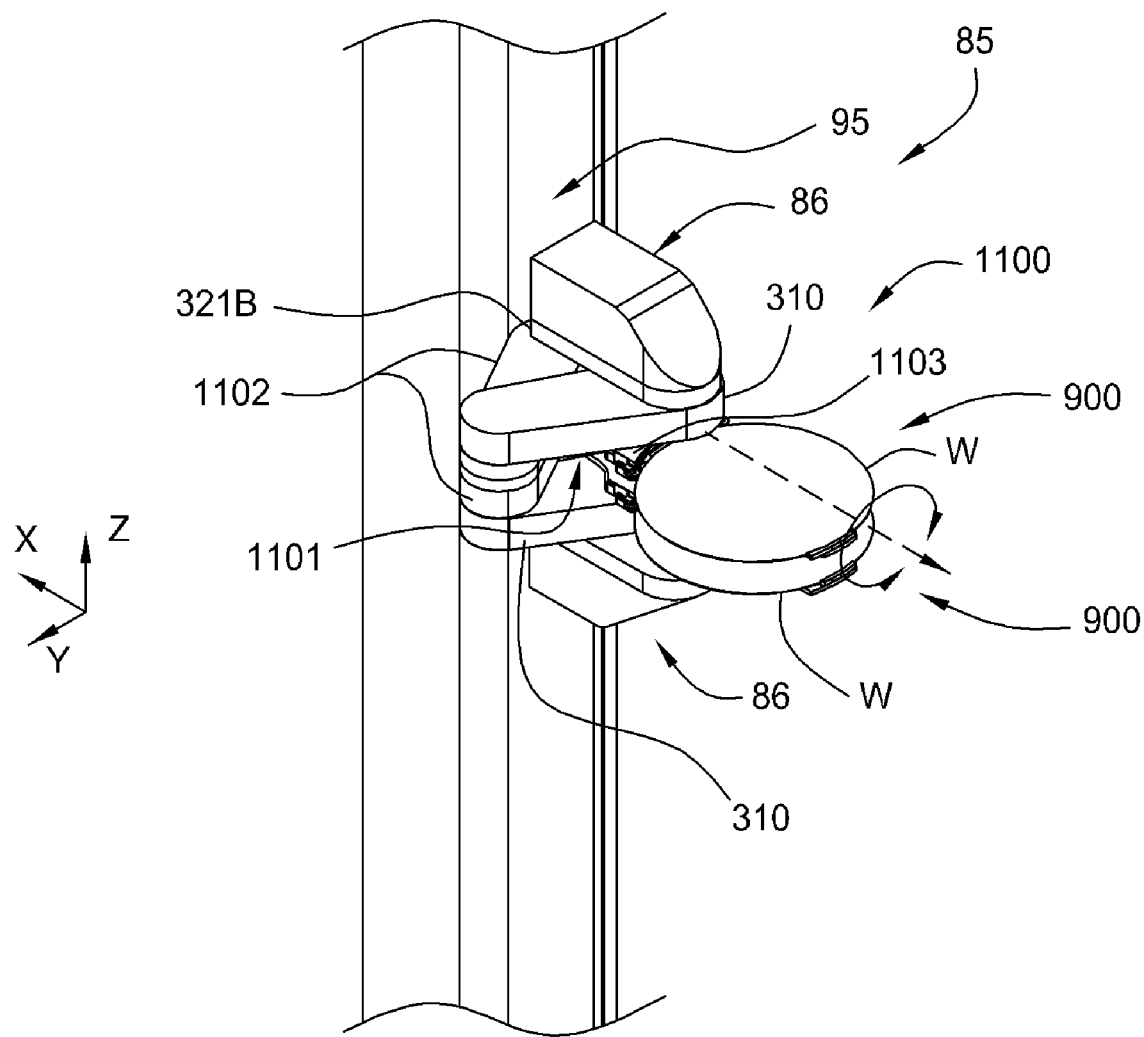
FIG. 5C is an isometric view illustrating one embodiment of a robot hardware assembly having a single robot assembly according to the present invention.

FIG. 5C illustrates an alternate embodiment of the robot hardware assembly 85 shown in FIG. 5B that contains two transfer robot assemblies 86 that are positioned in an opposing orientation to each other so that the supinating robot blade assembly 1100 can be placed a small distance apart. The configuration shown in FIG. 5C, or "over/under" type blade configuration, may be advantageous, for example, where it is desired to remove a substrate from a processing chamber prior to placing the next substrate to be processed in the same processing chamber, without causing the robot hardware assembly 85 to leave its basic position to move the "removed" substrate to another chamber (i.e., "swap" substrates). In this case it may be desirable to position a substrate "W" in the input slot 36A (FIGS. 1G-1H) and then remove a substrate from the output slot 36B using different robot assemblies 86. In another aspect, this configuration may allow the robot to fill up all of the blades and then transfer the substrates in groups of two or more substrates to a desired location in the tool. While transfer robot assemblies 86 depicted in FIGS. 5B-5C are the two bar linkage type of robot, this configuration is not intended to be limiting as to the orientation and type of robot assembly that may be used in conjunction with the embodiments discussed herein. In general, the embodiment of the robot hardware assembly 85 that has two transfer robot assemblies 86, as illustrated in FIG. 5C, will have two transfer robot assemblies 86 that contain the same basic components, and thus the discussion of a single transfer robot assembly 86 hereafter, is intended to also describe the components found in the two robot assembly aspect(s).

One advantage of the cluster tool and robot configurations illustrated in FIGS. 5-6, is that the size of the region that surrounds a transfer robot assembly 86 in which the robot components and substrate are free to move without colliding with other cluster tool components external to the robot assembly 11, is minimized. The area in which the robot and substrate are free to move is known as the "transferring region" (reference numeral "TR" in FIG. 1B). The transferring region "TR" may generally be defined as volume (X, Y and Z directions) in which the robot is free to move while a substrate is retained on a robot blade without colliding with other cluster tool components. While the transferring region may be described as a volume, often the most important aspect of the transferring region is the horizontal area (X and Y-directions) which the transferring region occupies, since it directly affects a cluster tool's footprint and CoO. The horizontal area of the transferring region is an important factor in defining the footprint of the cluster tool, since the smaller the horizontal components of the transferring region, the closer the various robot assembly and processing racks can be placed together. One factor in the defining size of the transferring region is the need to assure that the transferring region is large enough to reduce or prevent a robot's physical encroachment into the space occupied by other cluster tool components. The embodiments described herein have particular advantage over the prior art due to the way in which the embodiments retract the robots assembly 86 components into the transferring region oriented along the transfer direction (X-direction) of the horizontal motion assembly 90.

Two Bar Linkage Robot Assembly

Figure 5D:
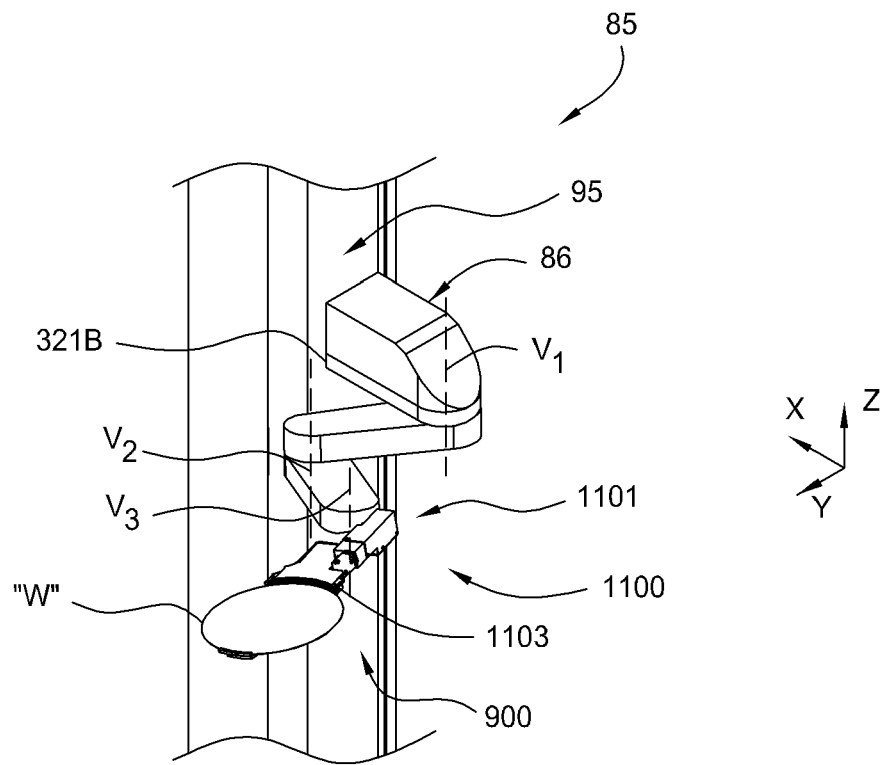
FIG. 5D is an isometric view illustrating one embodiment of a robot hardware assembly having a single robot assembly according to the present invention.
Figure 5E:
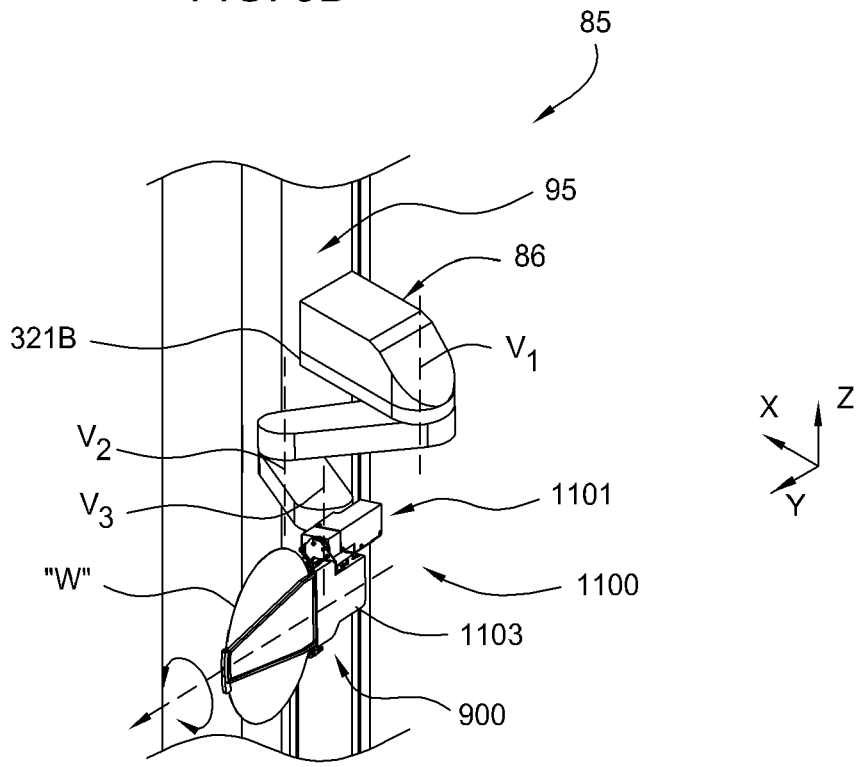
FIG. 5E is an isometric view illustrating one embodiment of a robot hardware assembly having a single robot assembly according to the present invention.
Figure 5F:
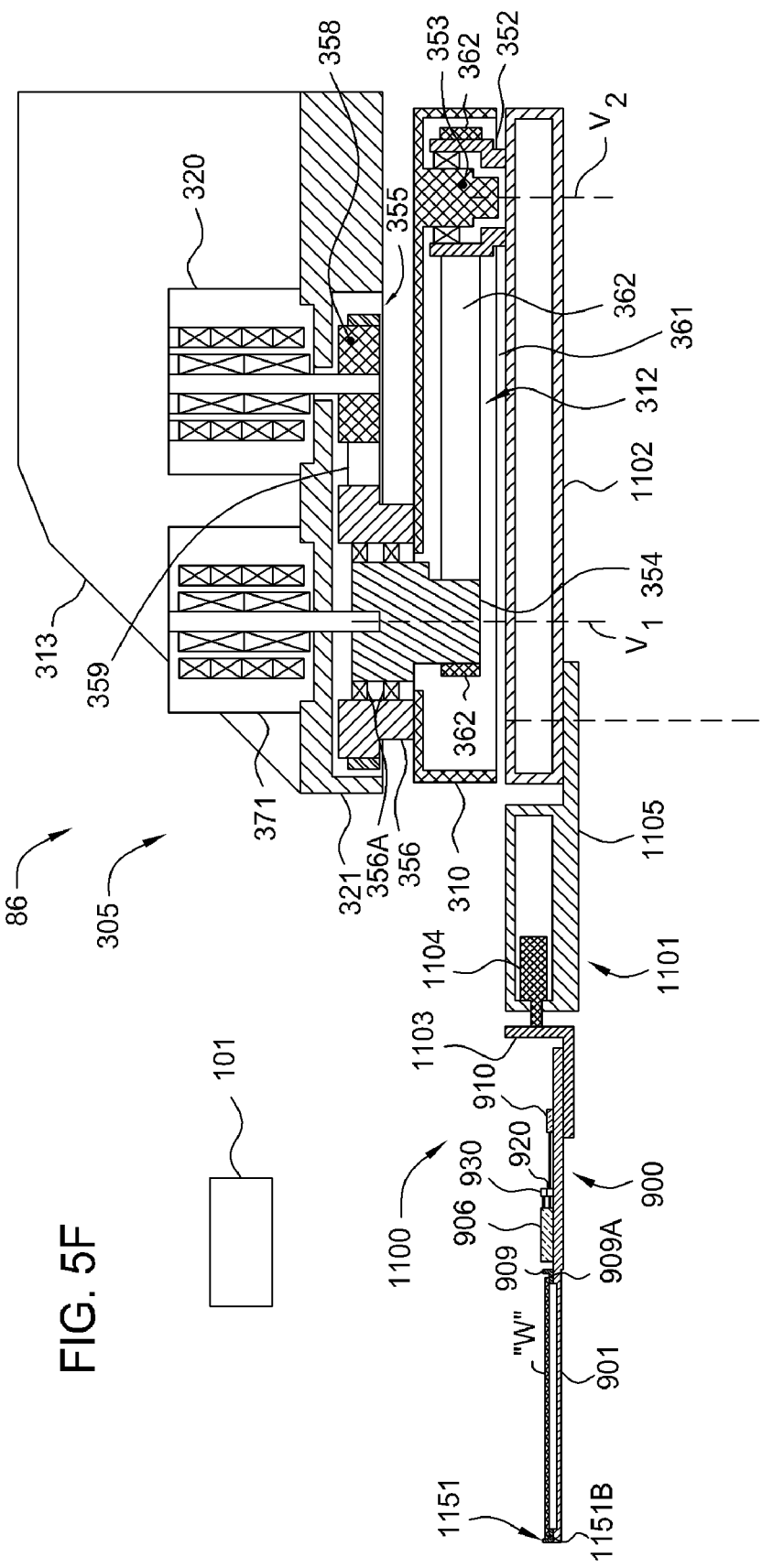
FIG. 5F is a cross-sectional view illustrating one embodiment of a robot hardware assembly according to the present invention.
Figure 7A:
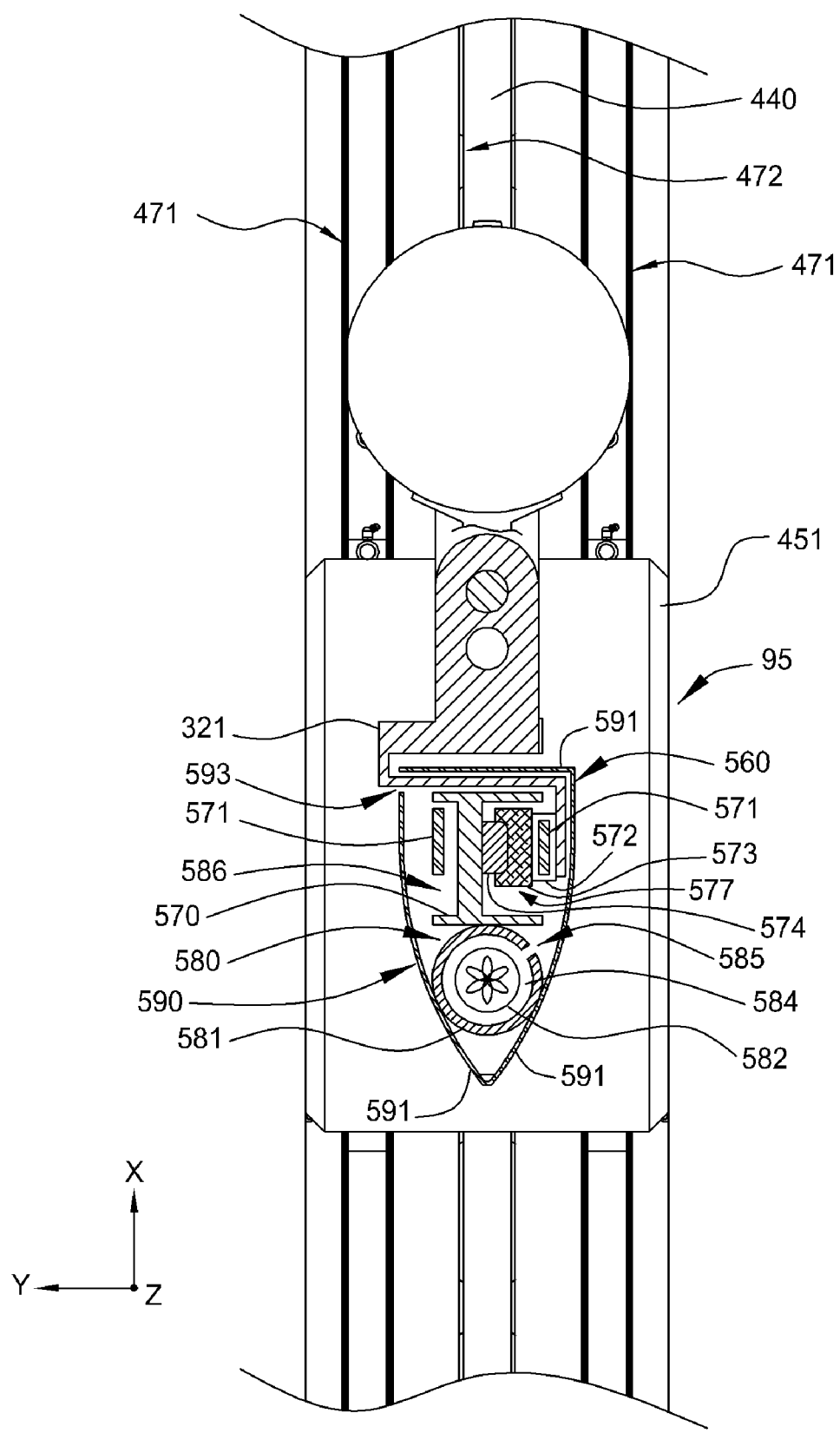
FIG. 7A is a cross-sectional view of the vertical motion assembly illustrated in FIG. 5A, according to the present invention.

FIGS. 5A and 5F, illustrates one embodiment of a two bar linkage robot 305 type of transfer robot assembly 86 that generally contains a support plate 321, a first linkage 310, a supinating robot assembly 1100, a transmission system 312 (FIG. 5F), an enclosure 313 a motor 320 and a second motor 371. FIG. 5F illustrates a side cross-sectional view of one embodiment of the two bar linkage robot 305 type of transfer robot assembly 86 in which the cross-sections of each of the components are oriented so that it could be viewed in a single figure. In this configuration the transfer robot assembly 86 is attached to the vertical motion assembly 95 through the support plate 321 which is attached to the vertical actuator assembly 560 (FIG. 7A). In this configuration the supinating robot blade assembly 1100 is attached to the linkage 1102 in the two bar linkage robot 305 by conventional means by use of a coupling plate 1105.

FIG. 5F illustrates a side cross-sectional view of one embodiment of the two bar linkage robot 305 type of transfer robot assembly 86. The transmission system 312 in the two bar linkage robot 305 generally contains one or more power transmitting elements that are adapted to cause the movement of the supinating robot assembly 1100 by motion of the power transmitting elements, such as by the rotation of motor 320. In general, the transmission system 312 may contain conventional gears, pulleys, etc. that are adapted to transfer rotational or translation motion from one element to another. The term "gear" as used herein is intended to generally describe a component that is rotationally coupled via a belt, teeth or other typical means to a second component and is adapted to transmit motion from one element to another. In general, a gear, as used herein, may be a conventional gear type device or pulley type device, which may include but is not limited to components such as, a spur gear, bevel gear, rack and/or pinion, worm gear, timing pulley, and v-belt pulley. The transmission system 312 in the two bar linkage robot 305 generally contains two power transmitting elements that are adapted to cause the movement of the linkage 1102 and the supinating robot blade assembly 1100 by motion of the motor 320 and/or the second motor 371. In one aspect, the transmission system 312 contains a first pulley system 355 and a second pulley system 361. The first pulley system 355 has a first pulley 358 that is attached to the motor 320, a second pulley 356 attached to the first linkage 310, and a belt 359 that connects the first pulley 358 to the second pulley 356, so that the motor 320 can drive the first linkage 310. In one aspect, a plurality of bearings 356A are adapted to allow the second pulley 356 to rotate about the axis $V_1$ of the third pulley 354. In one aspect, not shown in FIG. 5F, the bearings 356A are mounted on a feature formed on the support plate 321 rather than the third pulley 354 as shown in FIG. 5F.

The second pulley system 361 has a third pulley 354 that is attached to the second motor 371, a fourth pulley 352 that is attached to the linkage 1102 and a belt 362 that connects the third pulley 354 to the fourth pulley 352 so that the rotation of the second motor 371 causes the linkage 1102 and the supinating robot blade assembly 1100 to rotate about the bearing axis 353 (pivot $V_2$ in FIG. 11A) coupled to the first linkage 310. The second motor 371 is mounted on the support plate 321. When transferring a substrate the motor 320 drives the first pulley 358 which causes the second pulley 356 and first linkage 310 to rotate, which causes the fourth pulley 352 to rotate due to the angular rotation of the first linkage 310 and belt 362 about the third pulley 354 when the second motor 371 is maintained at a fixed angular position. In this configuration, versus the configuration shown in FIG. 10C, the third pulley can be rotated while the motor 320 is rotating the first linkage 310 which allows the gear ratio between the third pulley 354 and the fourth pulley 352 to be varied by adjusting the relative motion between the third pulley 354 and the fourth pulley 352. One will note that the gear ratio affects the linkage 1102 and the supinating robot blade assembly 1100 motion relative to the first linkage 310. In this configuration the gear ratio is not fixed by the size of the gears, and may be changed in different parts of the robot blade transferring motion to achieve a desired robot blade transfer path. An example of single and multiple linkage types of robot assemblies 86 that may adapted for use with the robot assembly 11 are further described in the commonly assigned and copending U.S. patent application Ser. No. 11/315,984 [APPM 9540.P1], filed Dec. 22, 2005, which is incorporated by reference in its entirety herein.

FIGS. 5A and 5C-5E illustrate one embodiment of a supinating robot blade assembly 1100 that may be used with some of the embodiments described herein to support and retain a substrate "W" while it is transferred through the cluster tool 10 using a robot assembly 11. FIG. 5B is a close up isometric view of the robot assembly 11 illustrated in FIG. 5A that has a supinating robot blade assembly 1100 that is attached to a linkage 1102 within the transfer robot assembly 86. In this configuration the transfer robot assembly 86 and supinating robot blade assembly 1100 are aligned in forward position to allow the substrate "W" to be transferred in an X or Z-directions by use of the horizontal motion assembly 90 and the vertical motion assembly 95 without the interfering with adjacent processing rack components (FIG. 1B). FIG. 5C is a close up isometric view of the robot assembly 11 in which the transfer robot assembly 86 is extended towards a position that is generally parallel to the direction in which the horizontal motion assembly is aligned (i.e., X-direction).

FIG. 5D is a close up isometric view of a transfer robot assembly 86 in an extended position that is orthogonal to the direction in which the horizontal motion assembly is aligned (i.e., X-direction). In this configuration a substrate "W" that is positioned on the supinating robot blade assembly 1100 may be transferred to a substrate receiving surface in a desired processing chamber in a horizontal orientation. FIG. 5D illustrates a transfer robot assembly that has a horizontally oriented supinating robot blade assembly 1100 that has been extended in a Y-direction by use of the various components found in the transfer robot assembly 86. In this configuration, the supinating robot blade assembly 1100 may be first rotate about a vertical axis, such as axis $V_1$ (FIG. 5F), by use of the motor 320 so that the robot blade assembly 900 is aligned parallel to the transfer direction (Y-direction) before the various components in the transfer robot assembly 86 are used to extend the two bar linkage robot 305 components and supinating robot blade assembly 1100 into a desired processing chamber.

FIG. 5E is a close up isometric view illustrating the transfer robot assembly 86 in the extended position shown in FIG. 5D with the robot blade assembly 900 positioned in a vertical orientation by use of the actuator assembly 1101 that is contained in the supinating robot blade assembly 1100. In this configuration a substrate "W" that is positioned on the supinating robot blade assembly 1100 is transferred to a substrate receiving surface in a desired processing chamber in an angular orientation relative to a horizontal plane (i.e., substrate processing surface is face up). FIG. 5E illustrates a substrate in a vertical orientation.

Figure 6A:
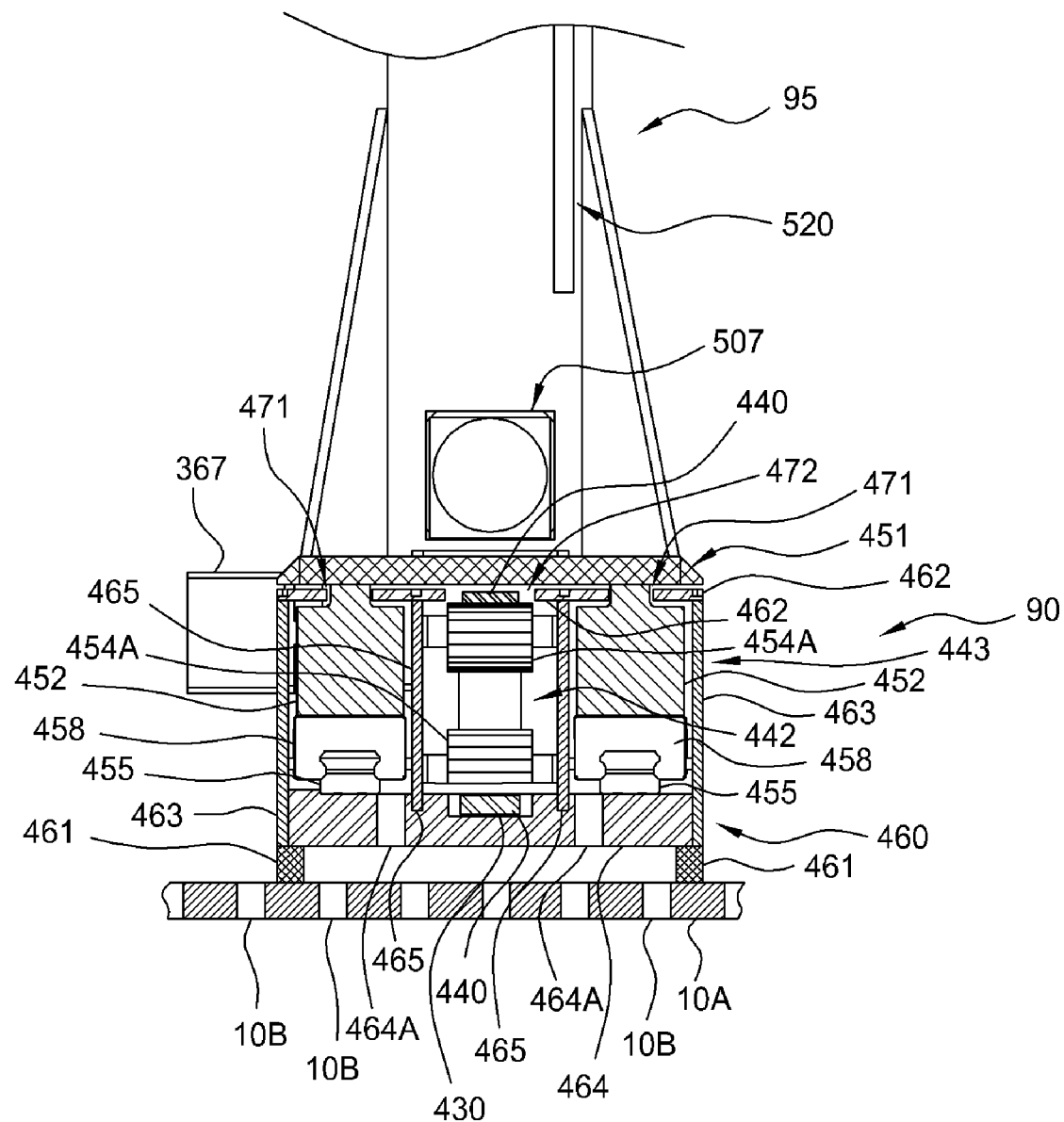
FIG. 6A is a cross-sectional view of one embodiment of one of the robot hardware assemblies illustrated in FIG. 5A, according to the present invention.
Figure 6B:
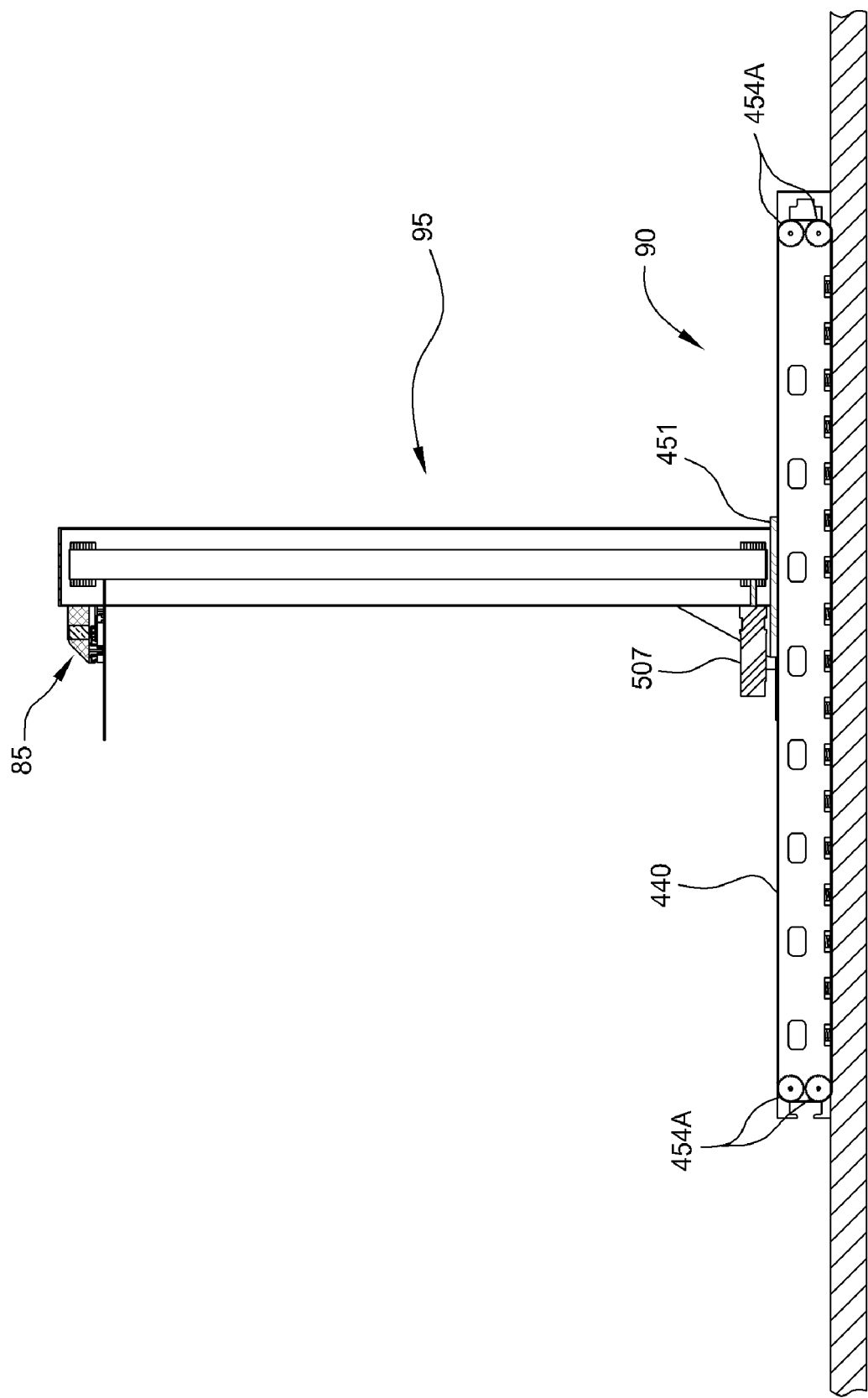
FIG. 6B is a cross-sectional view of one embodiment of the robot hardware assemblies illustrated in FIG. 5A, according to the present invention.

Referring to FIG. 6B, in one embodiment, the robot blade assembly 900 rotated (reference number "R") about an axis $V_4$ using a rotary actuator 1104. In this configuration a rotary actuator 1104, which is attached to the coupling plate 1105, is connected to a bracket 1103 that supports the robot blade assembly 900 so that the components in the rotary actuator 1104 can rotate the robot blade assembly 900 relative to the coupling plate 1105 that is attached to the linkage 1102. The rotary actuator 1104 may be a conventional stepper motor or servomotor, which when coupled to system controller 101 by conventional means, can be used to control the angular position of the substrate about the axis $V_4$.

Horizontal Motion Assembly

FIG. 6A illustrates a cross-sectional view of one embodiment of the horizontal motion assembly 90 taken along a plane parallel to the Y-direction. FIG. 6B is a side cross-sectional view of one embodiment of the robot assembly 11 illustrated in FIG. 5A that has been cut down the length of the horizontal motion assembly 90. The horizontal motion assembly 90 generally contains an enclosure 460, an actuator assembly 443 and a sled mount 451. The actuator assembly 443 generally contains at least one horizontal linear slide assembly 468 and a motion assembly 442. The vertical motion assembly 95 is attached to the horizontal motion assembly 90 through the sled mount 451. The sled mount 451 is a structural piece that supports the various loads created as the vertical motion assembly 95 is positioned by the horizontal motion assembly 90. The horizontal motion assembly 90 generally contains two horizontal linear slide assemblies 468 that each have a linear rail 455, a bearing block 458 and a support mount 452 that support the weight of the sled mount 451 and vertical motion assembly 95. This configuration thus allows for a smooth and precise translation of the vertical motion assembly 95 along the length of the horizontal motion assembly 90. The linear rail 455 and the bearing block 458 may be linear ball bearing slides or a conventional linear guide, which are well known in the art. An example of a horizontal motion assembly 90 that may adapted for use with the robot assembly 11 are further described in the commonly assigned and copending U.S. patent application Ser. No. 11/315,984 [APPM 9540.P1], filed Dec. 22, 2005, which is incorporated by reference above.

The motion assembly 442 generally contains sled mount 451, a horizontal robot actuator 367 (FIGS. 5A and 6A), a drive belt 440, and two or more drive belt pulleys 454A that are adapted to control the position of the vertical motion assembly 95 along the length of the horizontal motion assembly 90. In general, the drive belt 440 is attached to the sled mount 451 (e.g., bonded, bolted or clamped) to form a continuous loop that runs along the length of the horizontal motion assembly 90 and is supported at the ends of the horizontal motion assembly 90 by the two or more drive belt pulleys 454A. FIG. 6B illustrates one configuration that has four drive belt pulleys 454A. In one embodiment, the horizontal robot actuator 367 is attached to one of the drive belt pulleys 454A so that rotational motion of the pulley 454A will cause the drive belt 440 and the sled mount 451, which is attached to the vertical motion assembly 95, to move along the horizontal linear slide assemblies 468. In one embodiment, the horizontal robot actuator 367 is a direct drive linear brushless servomotor, which is adapted to move the robot relative to the horizontal linear slide assembly 468.

The enclosure 460 generally contains a base 464, one or more exterior walls 463 and an enclosure top plate 462. The enclosure 460 is adapted to cover and support the components in the horizontal motion assembly 90, for safety and contamination reduction reasons. Since particles are generated by mechanical components that roll, slide, or come in contact with each other, it is important to assure that the components in the horizontal motion assembly 90 do not contaminate the substrate surface while the substrates are transferred through the cluster tool 10. The enclosure 460 thus forms an enclosed region that minimizes the chance that particles generated inside the enclosure 460 will make their way to the surface of a substrate. Particulate contamination has direct effect on device yield and thus CoO of the cluster tool.

The enclosure top plate 462 contains a plurality of slots 471 that allow the plurality of support mounts 452 in the horizontal linear slide assemblies 468 to extend through the enclosure top plate 462 and connect to the sled mount 451. In one aspect, the width of the slots 471 (size of the opening in the y-direction) are sized to minimize the chance of particles making their way outside of the horizontal motion assembly 90.

The base 464 of the enclosure 460 is a structural member that is designed to support the loads created by the weight of the sled mount 451 and vertical motion assembly 95, and loads created by the movement of the vertical motion assembly 95. In one aspect, the base 464 further contains a plurality of base slots 464A that are positioned along the length of the horizontal motion assembly 90 to allow air entering the slots 471 of the enclosure top plate 462 to exit the enclosure through the base slots 464A and out the slots 10B formed in the cluster tool base 10A. In one embodiment of the cluster tool 10, no cluster tool base 10A is used and thus the horizontal motion assembly 90 and processing racks may be positioned on the floor of the region in which the cluster tool 10 is installed. In one aspect, the base 464 is positioned above the cluster tool base 10A, or floor, by use of the enclosure supports 461 to provide an unrestricted and uniform flow path for air to flow through the horizontal motion assembly 90. In one aspect the enclosure supports 461 may also be adapted to act as conventional vibration dampers. Air flow created by the environmental control assembly 110 or clean room environment that flows through the enclosure 460 in one direction, preferably downward, will help to reduce the possibility of particles generated inside the enclosure 460 from making its way to the substrate surface. In one aspect, the slots 471 formed in the enclosure top plate 462 and the base slots 464A are designed to restrict the volume of air flowing from the environmental control assembly 110 so that a pressure drop of at least a 0.1" wg is achieved between the outside of the enclosure top plate 462 to the interior region of the enclosure 460. In one aspect, a central region 430 of the enclosure 460 is formed to isolate this region from the other parts of the horizontal motion assembly by use of the internal walls 465. The addition of internal walls 465 can minimize recirculation of the air entering the enclosure 460 and acts as an air flow directing feature.

Referring to FIG. 6A and FIG. 7A, in one aspect of the enclosure 460, the drive belt is positioned to form a small gap between drive belt 440 and the drive belt slot 472 formed in the enclosure top plate 462. This configuration may be advantageous to prevent particles generated inside the enclosure 460 from making their way outside of the enclosure 460.

Vertical Motion Assembly

Figure 7B:
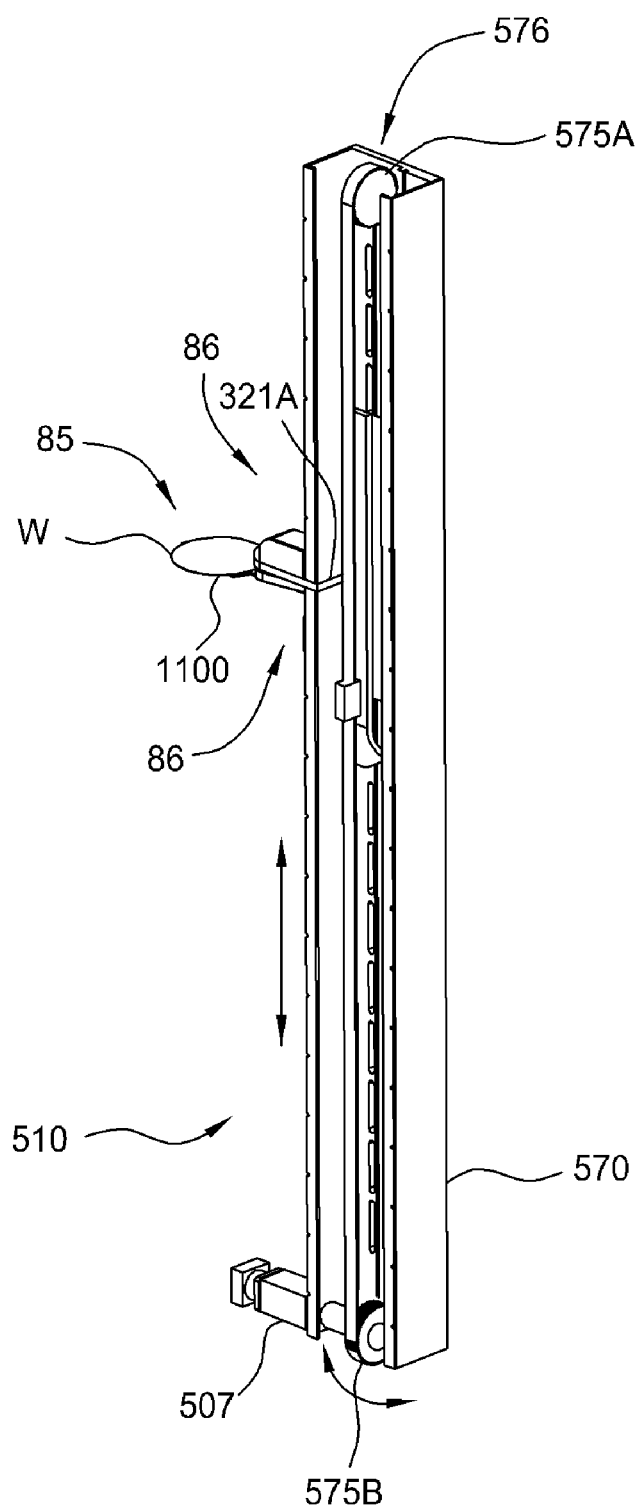
FIG. 7B is an isometric view illustrating one embodiment of a robot illustrated in FIG. 7A that may be adapted to transfer substrates in various embodiments of the cluster tool.

FIGS. 7A-7B illustrate one embodiment of the vertical motion assembly 95. FIG. 7A is a plan view of the vertical motion assembly 95 illustrating the various aspects of the design. The vertical motion assembly 95 generally contains a vertical support 570, vertical actuator assembly 560, a fan assembly 580, a support plate 321, and a vertical enclosure 590. The vertical support 570 is generally a structural member that is bolted, welded, or mounted to the sled mount 451, and is adapted to support the various components found in the vertical motion assembly 95.

The fan assembly 580 generally contains a fan 582 and a tube 581 that forms a plenum region 584 which is in fluid communication with the fan 582. The fan 582 is generally a device that is adapted to impart motion to air by use of some mechanical means, for example, rotating fan blades, moving bellows, moving diaphragms, or moving close toleranced mechanical gears. The fan 582 is adapted to draw a negative pressure in the interior region 586 of the enclosure 590 relative to the exterior of the enclosure 590 by creating a negative pressure in the plenum region 584 which is in fluid communication with the plurality of slots 585 formed in the tube 581 and the interior region 586. In one aspect, the number, size and distribution of the slots 585, which may be round, oval or oblong, are designed to evenly draw air from all areas of the vertical motion assembly 95. In one aspect, interior region 586 may also be adapted to house the plurality of cables (not shown) that are used to transfer signals between with the various robot hardware assembly 85 and components of vertical motion assembly 95 components with the system controller 101. In one aspect, the fan 582 is adapted to deliver the air removed from the interior region 586 into the central region 430 of the horizontal motion assembly 90 where it is then evacuated from the horizontal motion assembly 90 through the base slots 464A.

The vertical actuator assembly 560 generally contains a vertical motor 507 (FIGS. 6A and 7B), a pulley assembly 576 (FIG. 7B), and a vertical slide assembly 577. The vertical slide assembly 577 generally contains a linear rail 574 and a bearing block 573 which are attached to the vertical support 570 and the motion block 572 of the pulley assembly 576. The vertical slide assembly 577 is adapted to guide and provide smooth and precise translation of the robot hardware assembly 85 and also support the weight an loads created by the movement of the robot hardware assembly 85 along the length of the vertical motion assembly 95. The linear rail 574 and the bearing block 573 may be linear ball bearing slides, precision shaft guiding systems, or a conventional linear guide, which are well known in the art. Typical linear ball bearing slides, precision shaft guiding systems, or a conventional linear guide can be purchased from SKF USA Inc., or the Daedal Division of Parker Hannifin Corporation of Irwin, Pa.

Referring to FIGS. 7A and 7B, the pulley assembly 576 generally contains a drive belt 571, a motion block 572 and two or more pulleys 575 (e.g., elements 575A and 575B) which are rotationally attached to the vertical support 570 and vertical motor 507 so that a support plate (e.g., elements 321A in FIG. 7B), and thus robot hardware assembly 85, can be positioned along the length of the vertical motion assembly 95. In general, the drive belt 571 is attached to the motion block 572 (e.g., bonded, bolted or clamped) to form a continuous loop that runs along the length of the vertical motion assembly 95 and is supported at the ends of the vertical motion assembly 95 by the two or more drive belt pulleys 575 (e.g., elements 575A and 575B). FIG. 7B illustrates one configuration that has two drive belt pulleys 575A-B. In one aspect, the vertical motor 507 is attached to one of the drive belt pulley 575B so that rotational motion of the pulley 575B will cause the drive belt 571 and the support plate(s), and thus robot hardware assembly 85, to move along the vertical linear slide assemblies 577. In one embodiment, the vertical motor 507 is a direct drive linear brushless servomotor, which is adapted to move the robot hardware assembly 85 relative to the vertical slide assembly 577 and thus the drive belt 571 and two or more pulleys 575 are not required.

Figure 9A:
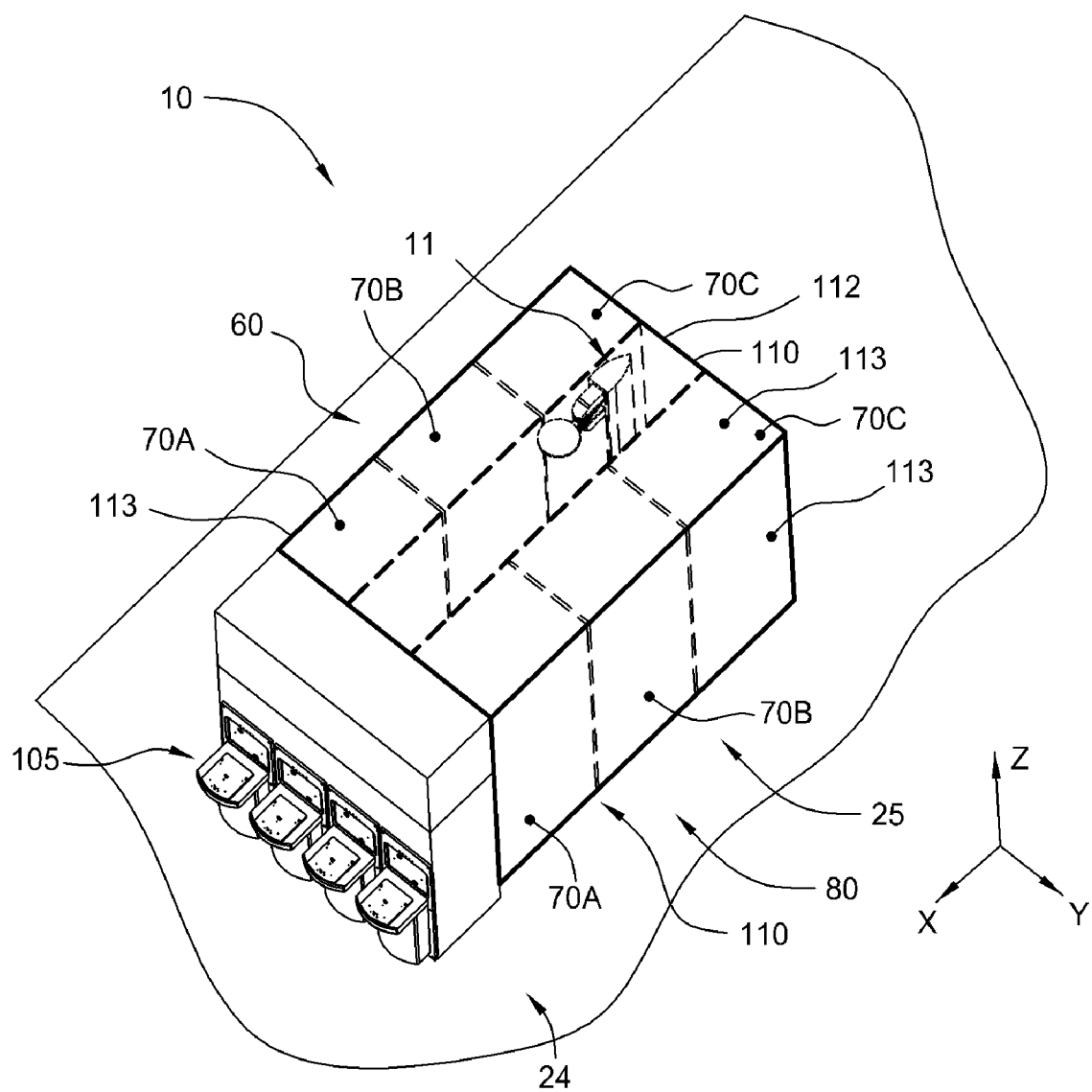
FIG. 9A is an isometric view illustrating another embodiment of a cluster tool illustrated in FIG. 1A that has an environmental enclosure attached, according to the present invention.

The vertical enclosure 590 generally contains one or more exterior walls 591 and an enclosure top 592 (FIG. 5A) and slot 593 (FIGS. 9A, 12A and 13A). The vertical enclosure 590 is adapted to cover the components in the vertical motion assembly 95, for safety and contamination reduction reasons. In one aspect, the vertical enclosure 590 is attached and supported by the vertical support 570. Since particles are generated by mechanical components that roll, slide, or come in contact with each other, it is important to assure that the components in the vertical motion assembly 95 do not contaminate the substrate surface while the substrates are transferred through the cluster tool 10. The enclosure 590 thus forms an enclosed region that minimizes the chance that particles generated inside the enclosure 590 will make their way to the surface of a substrate. Particulate contamination has direct effect on device yield and thus CoO of the cluster tool. Therefore, in one aspect, the size of the slot 593 (i.e., length and width) and/or the size of the fan 582 (e.g., flow rate) are configured so that the number of particles that can escape from the vertical motion assembly 95 is minimized. In one aspect, the length (Z-direction) and width (X-direction) of the slot 593 and the size of the fan 582 are selected so that a pressure drop created between a point external to the exterior walls 591 and the interior region 586 is between about 0.02 inches of water (~5 Pa) and about 1 inch of water (~250 Pa). In one aspect, the width of the slot 593 is between about 0.25 inches and about 6 inches.

The embodiments described herein generally have advantage over the prior art designs that are adapted to lift the robot components by use of components that must fold, telescope or retract back into itself to reach their lowest position vertical position. The issue arises since the lowest position of the robot is limited by the size and orientation of the vertical motion components that must fold, telescope or retract back into itself is due to the interference of the vertical motion components. The position of the prior art vertical motion components when they cannot retract any farther is often called the "dead space," or "solid height," due to the fact that the lowest robot position is limited by the height of the retracted components. In general, the embodiments described herein get around this problem since the bottom of the one or more transfer robot assemblies 86 are not supported underneath by the components in the vertical motion assembly 95 and thus the lowest position is only limited by the length of the linear rail 574 and the size of the robot hardware assembly 85 components. In one embodiment, as illustrated in FIGS. 7A-7B, the robot assemblies are supported in a cantilever fashion by the support plate 321 that is mounted to the vertical slide assembly 577. It should be noted that the configurations of the support plate 321 and the components in the robot hardware assembly 85 as shown in FIG. 5F are not intended to be limiting to the scope of the invention described herein since the orientation of the support plate 321 and the robot hardware assembly 85 may be adjusted to achieve a desired structural stiffness, and/or desired vertical stroke of the vertical motion assembly 95.

The embodiments of the vertical motion assembly 95 described herein also have advantage over the prior art vertical movement designs, such as ones that must fold, telescope or retract back into itself, due to the improved accuracy and/or precision of the robot hardware assembly 85 motion due to the constrained motion along a vertical slide assembly 577. Thus, in one aspect of the invention, the motion of the robot hardware assemblies is always guided by a rigid member (e.g., vertical slide assembly 577) that provides a structural stiffness and positional accuracy to the components as they move along the length of the vertical motion assembly 95.

Robot Blade Hardware Configuration

Figure 8A:
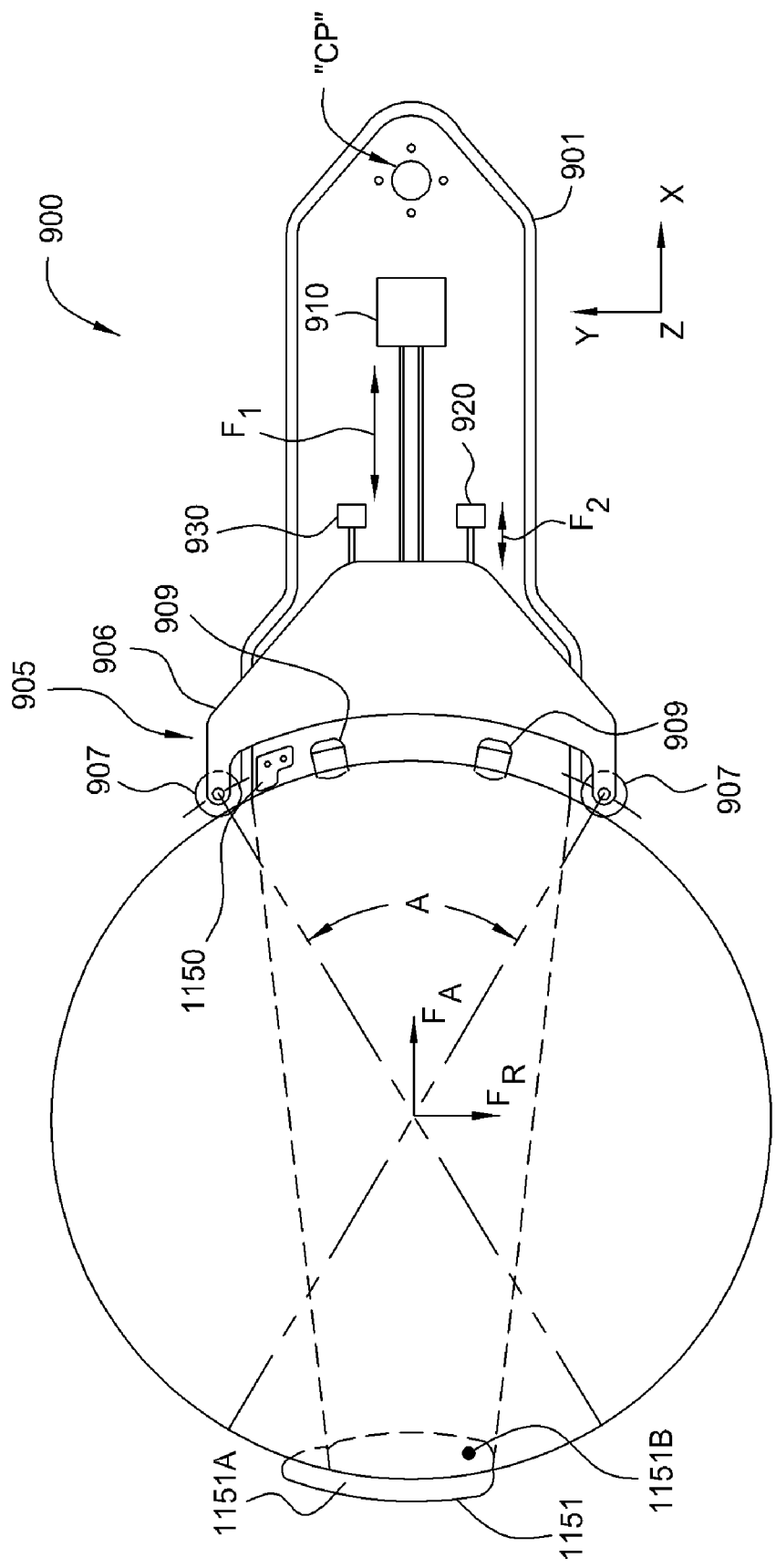
FIG. 8A is a plan view illustrating one embodiment of a robot blade assembly that may be adapted to transfer substrates in various embodiments of the cluster tool.
Figure 8B:
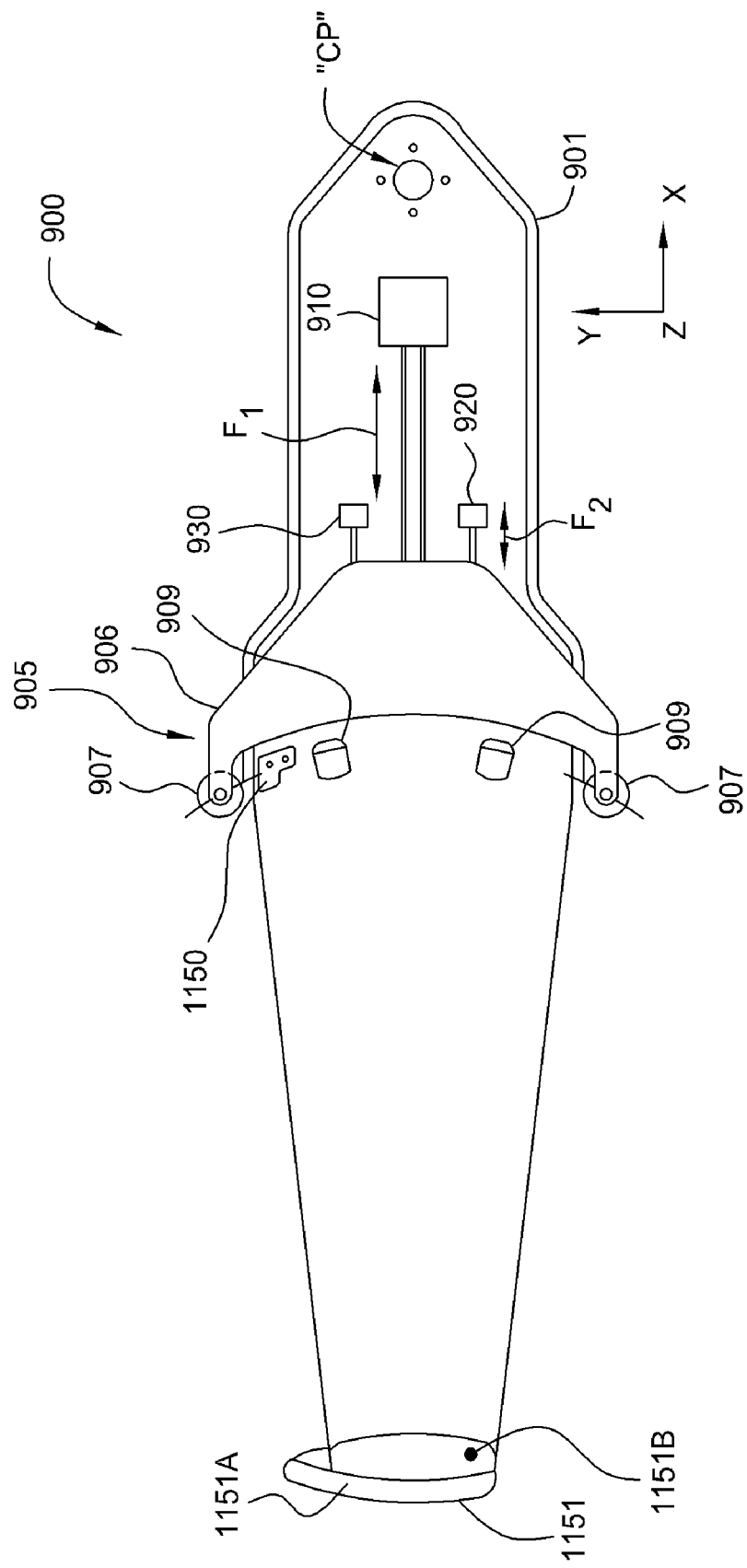
FIG. 8B is a plan view illustrating one embodiment of a robot blade assembly that may be adapted to transfer substrates in various embodiments of the cluster tool.

FIGS. 8A-8B illustrate one embodiment of a robot blade assembly 900 that may be used with some of the embodiments described herein to support and retain a substrate "W" while it is transferred through the cluster tool 10 using a robot assembly 11. In one embodiment, as shown in FIGS. 5A-5F the robot blade assembly 900 is connected to the transfer robot assembly 86 through the supinating robot assembly 1100. The robot blade assembly 900 is adapted to hold, "grip", or restrain a substrate "W" so that the accelerations experienced by a substrate during the movement of the robot assembly 11 and/or supinating robot assembly 1100 will not cause the substrate position to move from a known position on the robot blade assembly 900. Movement of the substrate during the transferring process will generate particles and reduce the substrate placement accuracy and repeatability by the robot. In the worst case the accelerations can cause the substrate to be dropped by the robot blade assembly 900.

The accelerations experienced by the substrate can be broken up into three components: a horizontal radial acceleration component, a horizontal axial acceleration component and a vertical acceleration component. The accelerations experienced by the substrate are generated as the substrate is accelerated or decelerated in the X, Y and Z directions during the substrate movement through the cluster tool 10. Referring to FIG. 8A, the horizontal radial acceleration component and the horizontal axial acceleration component are shown as forces $F_A$ and $F_R$, respectively. The forces experienced are related to the mass of the substrate times the acceleration of substrate minus any frictional forces created between the substrate and the robot blade assembly 900 components. In the embodiments described above, the radial acceleration is generally created as the substrate is being rotated into position by a transfer robot assembly 86 and can act in either direction (i.e., +Y or −Y directions). The axial acceleration is generally created as the substrate is positioned in the X-direction by the horizontal motion assembly 90, tilting of the substrate by the supinating robot blade assembly 1100, and/or by the motion of the transfer robot assembly 86 and can act in either direction (i.e., +X or −X directions). The vertical acceleration is generally created as the substrate is positioned in the Z-direction by the vertical motion assembly 95 and can act in either direction (i.e., +Z or −Z directions), tilting of the substrate by the supinating robot blade assembly 1100, or cantilever induced structural vibrations.

FIG. 8A is a schematic plan view of one embodiment of the robot blade assembly 900 which is adapted to support the substrate "W." The robot blade assembly 900 generally contains a blade base 901, an actuator 910, a brake mechanism 920, a position sensor 930, a clamp assembly 905, one or more reaction members 1151 (e.g., one shown), and one or more substrate support components 909. The clamp assembly 905 generally contains a clamp plate 906 and one or more contact members 907 (i.e., two contact members shown in FIG. 8A) mounted on the clamp plate 906. The clamp plate 906, contact members 907, support 1151, and blade base 901 can be made from a metal (e.g., aluminum, nickel coated aluminum, SST), a ceramic material (e.g., silicon carbide), or a plastic material that will be able to reliably withstand the accelerations (e.g., 10-30 m/s$^2$) experienced by the robot blade assembly 900 during the transferring process and will not generate or attract particles due to the interaction with the substrate. In one embodiment, the robot blade assembly 900 is connected to the linkage 1102 at the connection point "CP." Referring to FIG. 5G, which is a side schematic cross-sectional view of the robot blade assembly 900 shown in FIG. 8A, which has been sectioned through the center of the robot blade assembly 900. For clarity the components positioned behind the cross-sectional plane in FIG. 16B have been left out (e.g., contact members 907), while the brake assembly 930 has been retained in this view.

Figure 5G:
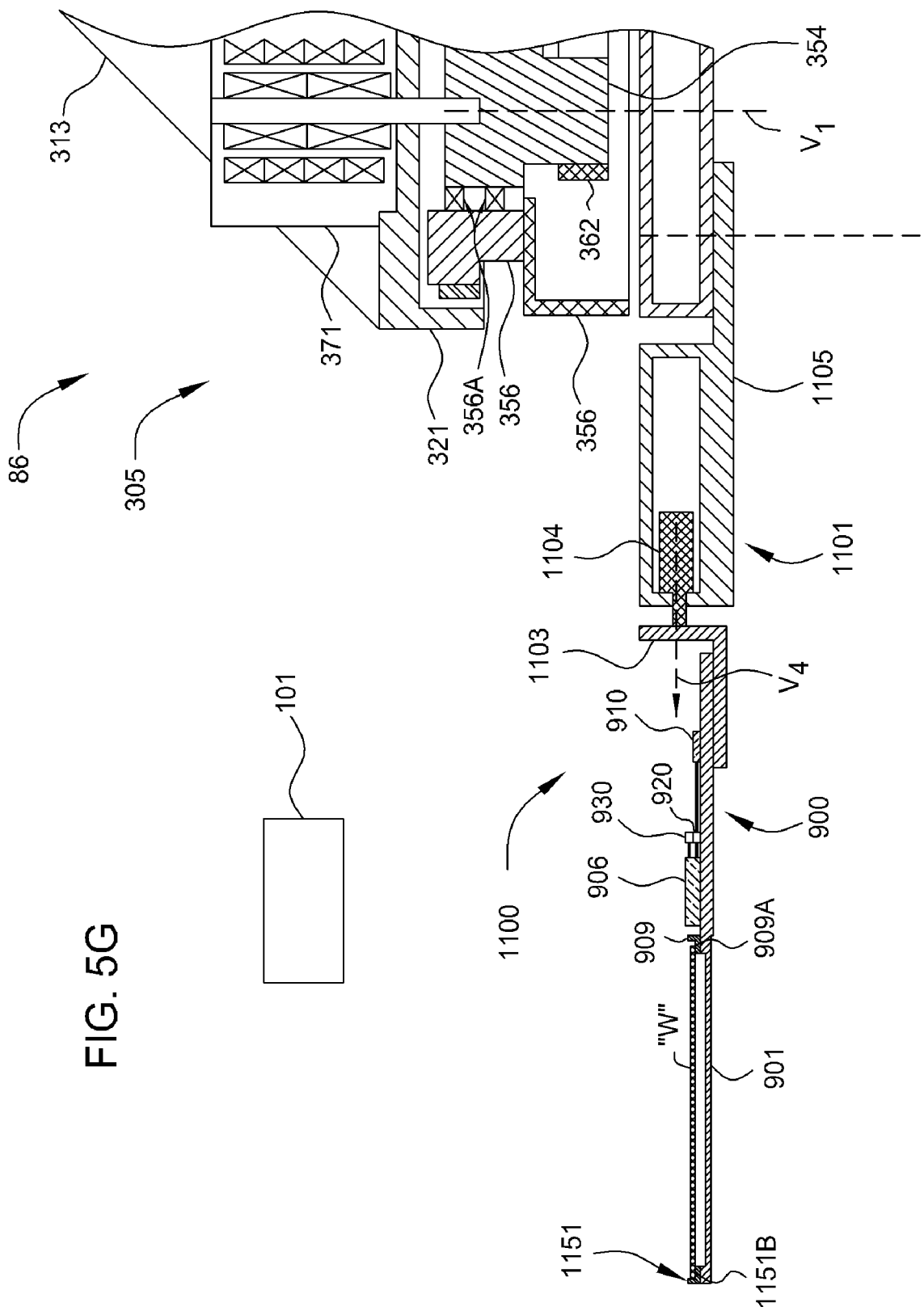
FIG. 5G is a cross-sectional view illustrating one embodiment of a robot hardware assembly according to the present invention.

Referring to FIGS. 8A and 5G, when in use the substrate "W" is pressed against the captured region 1151A of the support 1151 by a holding force ($F_1$) delivered to substrate "W" by the actuator 910 through the contact members 907 in the clamp assembly 905. In one aspect, the contact members 907 are adapted to contact and urge the edge "E" of the substrate "W" against the captured region 1151A. In one aspect, the holding force may be between about 0.01 and about 3 kilograms force (kgf). In one embodiment, as shown in FIG. 16A, it is desirable to distribute the contact members 907 an angular distance "A" apart to provide axial and radial support to the substrate as it is transferred by the robot assembly 11.

The process of restraining the substrate so that it can be reliably transferred through the cluster tool 10 using the robot blade assembly 900 will generally require three steps to complete. It should be noted that one or more of the steps described below may be completed simultaneously or sequentially without varying from the basic scope of the invention described herein. Before starting the process of picking up a substrate the clamp assembly 905 is retracted in the +X direction (not shown). The first step starts when a substrate is picked up from a substrate supporting component (e.g., pass-through positions 9 in FIG. 1B) so that the substrate rests on the substrate supporting surfaces 1151B and 909A on the support 1151 and substrate support component 909, respectively. Next, the clamp assembly 905 is then moved in the −X direction until the substrate is restrained on the robot blade assembly 900 by the holding force ($F_1$) delivered to substrate "W" by the actuator 910 through the contact members 907 in the clamp assembly 905 and the support 1151. In the last step, the clamp assembly 905 is then held, or "locked", in place by the brake mechanism 920 to prevent the acceleration of the substrate during the transferring process from appreciably varying the holding force ($F_1$) and thus allow the substrate to move relative to the supporting surfaces. After the brake mechanism 920 restrains the clamp assembly 905 the substrate can then be transferred to another point in the cluster tool 10. To deposit a substrate to a substrate supporting components the steps described above can be completed in reverse. In one embodiment, a position sensor 930 is used to sense the position of the clamp plate 906 so that the controller 101 can determine the status of the blade assembly 900 at any time during the transferring process.

In one aspect of the robot blade assembly 900, the brake mechanism 920 is adapted to limit the movement of the clamp assembly 905 in at least one direction (e.g., +X direction) during the transferring process. The ability to limit the motion of the clamp assembly 905 in a direction opposite to the holding force ($F_1$) supplied by the clamp assembly 905 will prevent the horizontal axial acceleration(s) from causing the holding force to appreciably decrease and thus allow the substrate to move around, which may generate particles, or from being dropped by the blade assembly 900 during the transferring process. In another aspect, the brake mechanism 920 is adapted to limit the movement of the clamp assembly 905 in at least two directions (e.g., +X and −X directions). In this configuration, the ability to limit the motion of the clamp assembly in the directions parallel to the holding force ($F_1$) direction will prevent the horizontal axial acceleration(s) from causing the holding force to appreciably increase, which may cause substrate breakage or chipping, or appreciably decrease, which may generate particles or cause the substrate to be dropped. One will note that the brake mechanism 920 may be a friction inducing device or a mechanical latching device that is adapted to restrain the clamp assembly 909 during the transferring process. Referring to FIG. 8B, the brake mechanism 920 thus can be adapted to provide a restraining force $F_2$ that is adapted to restrain the clamp assembly 909 during the transferring process. Examples of various robot blade assemblies, brake mechanisms and other components that may be used to restrain a substrate during processing is further described in the U.S. patent application Ser. No. 11/315,873, filed Dec. 22, 2005, and the U.S. patent application Ser. No. 11/620,606 entitled "Supinating Cartesian Robot Blade" by Jeff Hudgens et al., filed Jan. 5, 2007, which are both herein incorporated by reference in their entirety.

Supinating Blade Transfer Process and Apparatus

Figure 8C:
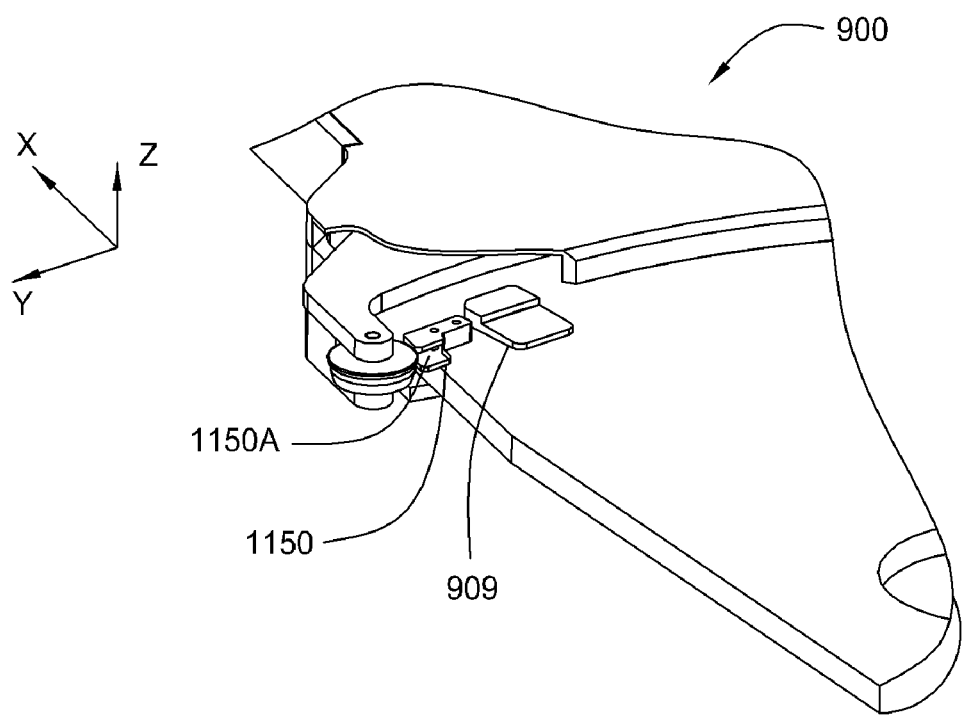
FIG. 8C is an isometric view illustrating one embodiment of a robot hardware assembly according to the present invention.

FIG. 8B illustrates one embodiment of a robot blade assembly 900 that contains a substrate retaining support 1150 and support 1151 that are adapted to retain a substrate when the robot blade assembly 900 is rotated at an angle relative to the horizontal. FIG. 8B is a plan view of robot blade assembly 900 that contains substrate retaining support 1150 and support 1151. FIG. 8C is an isometric partial cross-section view of a region of the robot blade assembly 900 that contains the substrate retaining support 1150 without a substrate positioned on the substrate support components 909 and reaction member 1150.

Figure 8D:
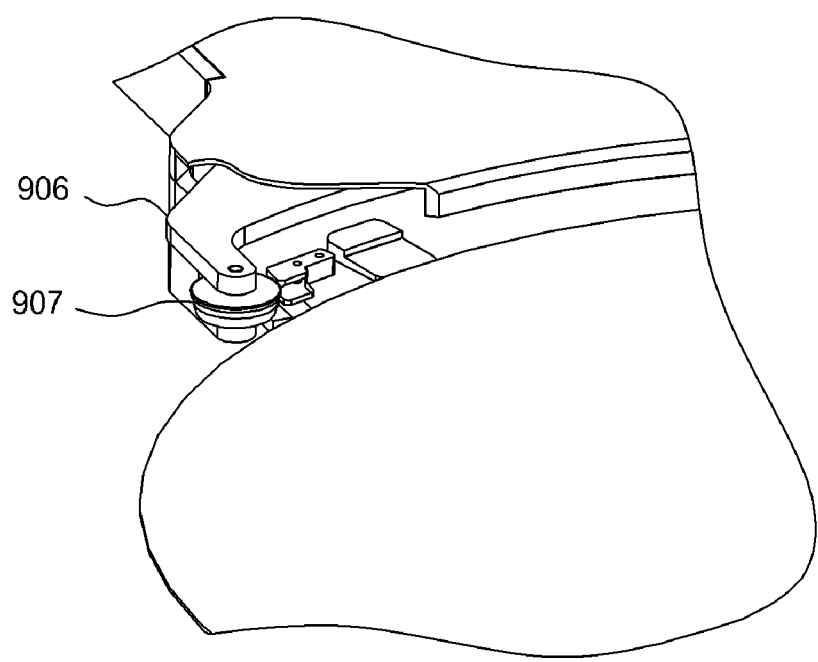
FIG. 8D is an isometric view illustrating one embodiment of a robot hardware assembly according to the present invention.
Figure 8E:
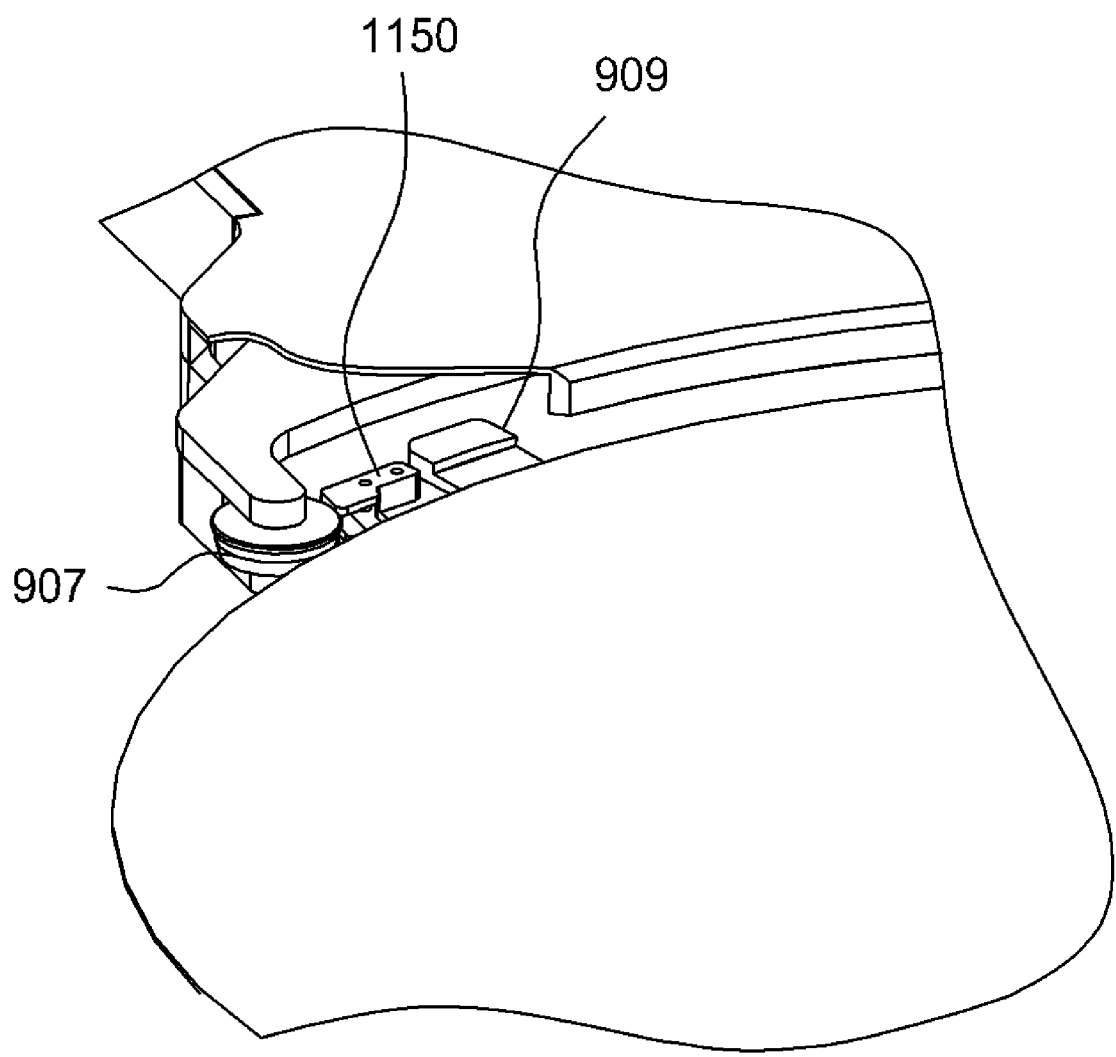
FIG. 8E is an isometric view illustrating one embodiment of a robot hardware assembly according to the present invention.
Figure 8F:
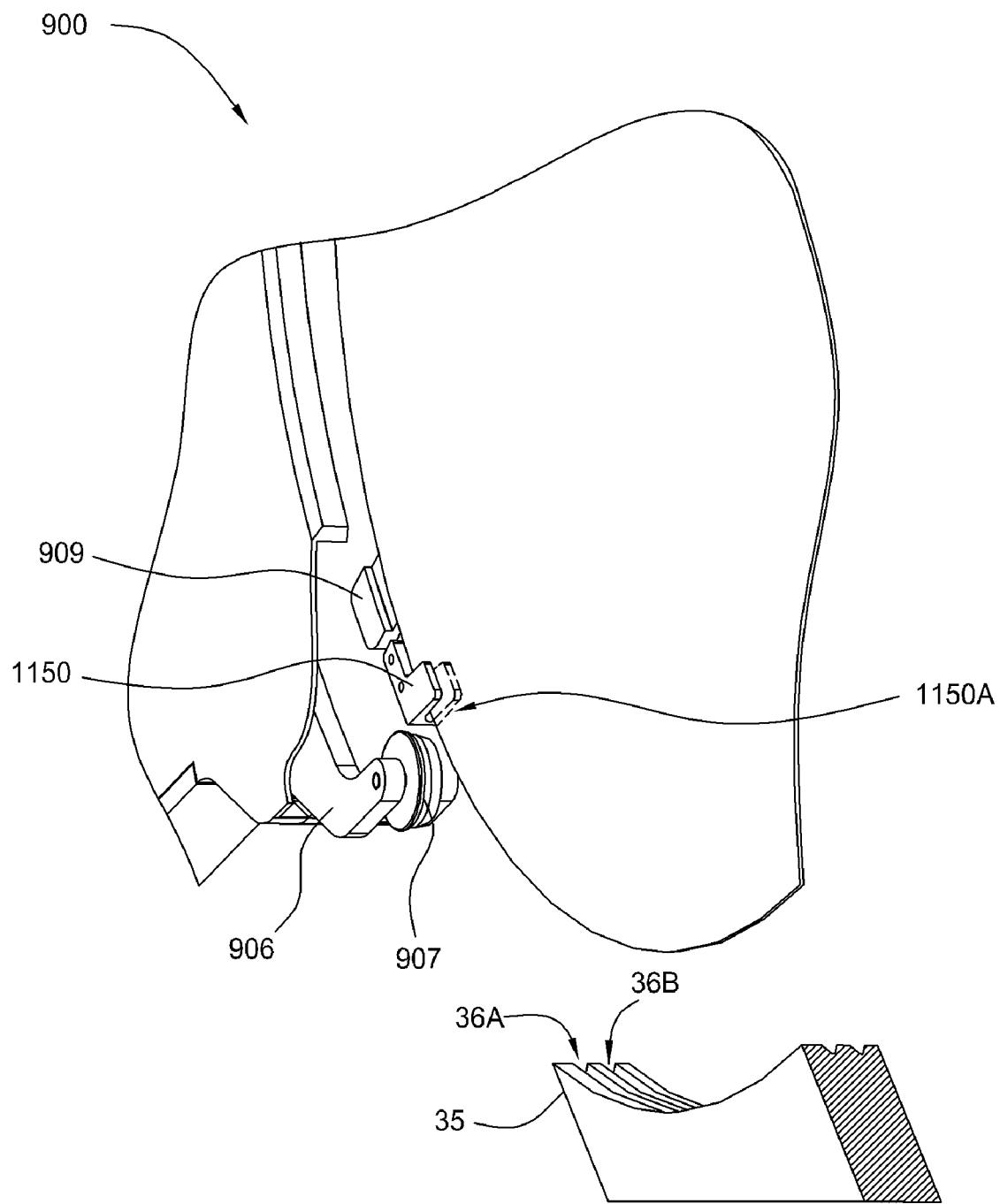
FIG. 8F is an isometric view illustrating one embodiment of a robot hardware assembly according to the present invention.
Figure 8G:
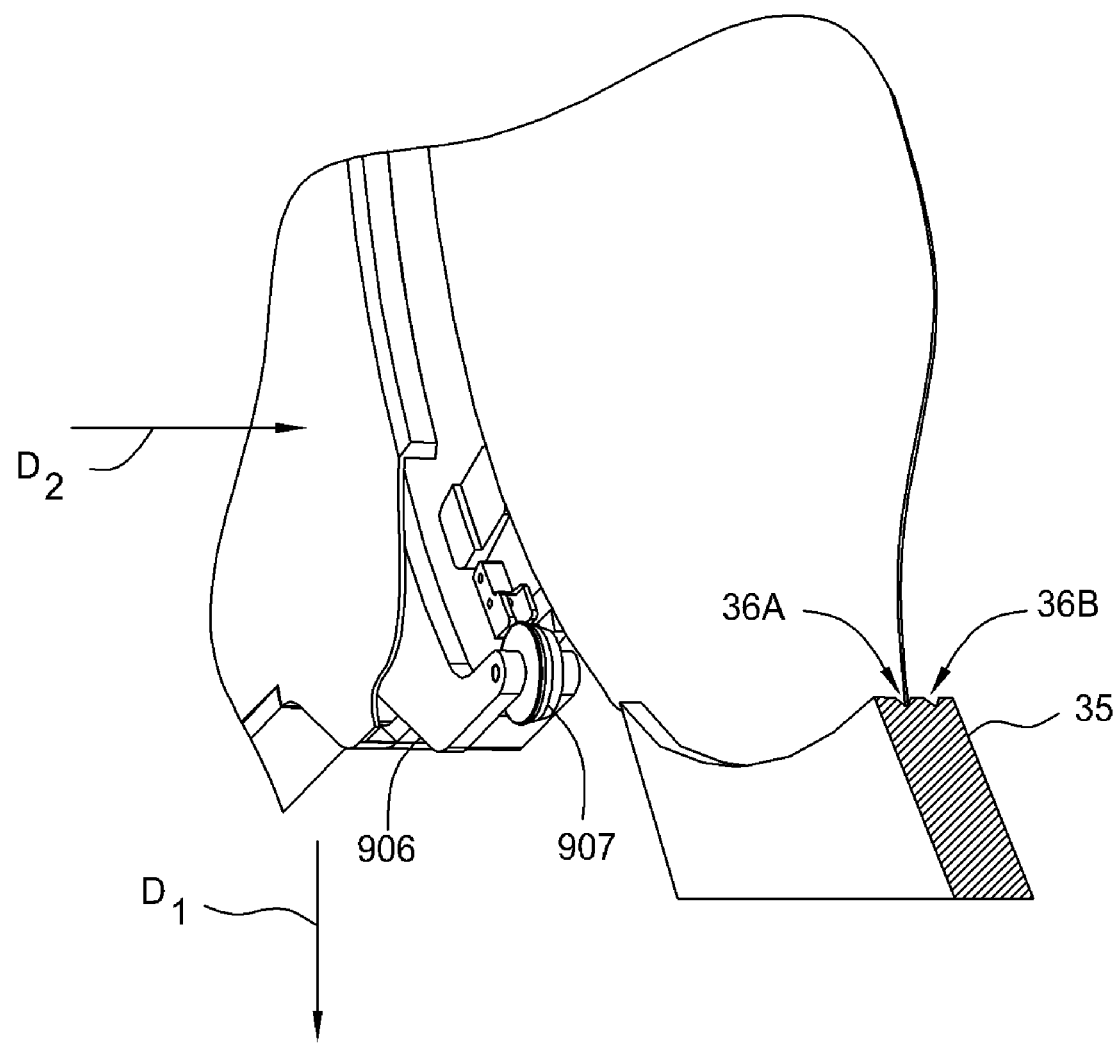
FIG. 8G is an isometric view illustrating one embodiment of a robot hardware assembly according to the present invention.

In one embodiment, the process of reliably transferring a substrate through the cluster tool 10 and depositing the substrate on a substrate support in a vertical orientation, such as to the chamber pass-through support 35 (FIG. 1H), may require the following steps. It should be noted that one or more of the steps described below may be completed simultaneously or sequentially without varying from the basic scope of the invention described herein. Before starting the process of picking up a substrate the clamp assembly 905 is retracted in the +X direction. Referring to FIGS. 8C-8D, the first step starts when a substrate is picked up from a substrate supporting component (e.g., pass-through positions 9 in FIG. 1B) so that the substrate rests on the substrate supporting surfaces 1151B and 909A on the support 1151 and substrate support component 909, respectively. Next, the clamp assembly 905 is then moved in the −X direction until the substrate is restrained on the robot blade assembly 900 by the holding force ($F_1$) delivered to substrate "W" by the actuator 910 through the contact members 907 in the clamp assembly 905 and the support 1151, as shown in FIG. 8E. Next, optionally the clamp assembly 905 is then held, or "locked", in place by the brake mechanism 920 to prevent the acceleration of the substrate during the transferring process from appreciably varying the holding force ($F_1$) and thus allow the substrate to move relative to the supporting surfaces. After the brake mechanism 920 restrains the clamp assembly 905 the substrate can then be transferred to another point in the cluster tool 10. Then, once the substrate has reached its destination the substrate the clamp assembly 905 is retracted in the +X direction to release and un-restrain the substrate "W". The robot blade assembly 900 is then rotated to a desired angular orientation, which cause the substrate to be captured within the angled captured region 1150A of the substrate retaining support 1150 and the captured region 1151A of the support 1151, as shown in FIGS. 8B and 8F. The robot blade assembly 900 is then moved in a desired direction (e.g., $D_1$ in FIG. 8G) to a position where the substrate "W" engages a substrate input slot 36A within a chamber pass-through 35, which causes the substrate "W" to become separated from the angled captured region 1150A of the substrate retaining support 1150 and the captured region 1151A of the support 1151. Then the robot blade assembly 900 can be moved away (e.g., direction $D_2$ in FIG. 8G) from the substrate "W" so that the robot assembly 11 can perform some other activity. In one embodiment, to pick-up a substrate "W" the steps described above can be completed in reverse.

As discussed and shown in FIGS. 8A-8G by use of a substrate supporting device that is coupled to the robot blade assembly, such as the angled captured region 1150A of the substrate retaining support 1150 and the captured region 1151A of the support 1151, a vertically oriented and unconstrained substrate "W" can be rapidly transferred to a substrate support without the generation of particles or chipping the substrate edge. In one embodiment, as discussed herein the substrate is maintained in a constrained state, and also in a supported and unconstrained state during different parts of the substrate transferring process. In one embodiment, when a transferring process requires a substrate to be oriented in an angular orientation relative to the horizontal, the substrate can be shifted from a constrained state to a supported and unconstrained state by removing the contact between the substrate constraining components, and then tilting the substrate support so that the substrate engages and is supported by the capturing regions (e.g., reference numerals 1150A and 1151A). The captured region 1150A and the captured region 1151A may contain one or more angled, beveled or hemispherical surfaces that are able to align, support, and retain a substrate that is positioned thereon due to the force gravity. The substrate retaining support 1150 and support 1151 may contain one or more polished surfaces and compatible materials (e.g., ceramic materials, silicon carbide, glass, stainless steels) that will not be abraded by the movement of the substrate edge against the captured region 1150A and the captured region 1151A surfaces as the substrate is transferred to a chamber pass-through 35. While the discussion herein describes the engagement of a substrate with the one or more capturing regions (e.g., reference numerals 1150A, 1151A) by titling the substrate in an unconstrained state from a horizontal to a vertical orientation, this configuration is not intended to be limiting as to the scope of the invention since one skilled in the art would appreciate that the substrate may also be deposited into the capturing regions while in an angled orientation as the substrate is un-gripped by the substrate supporting surfaces (e.g., clamp 907, support 1151) without varying from the scope of the invention described herein.

Environmental Control

Figure 9B:
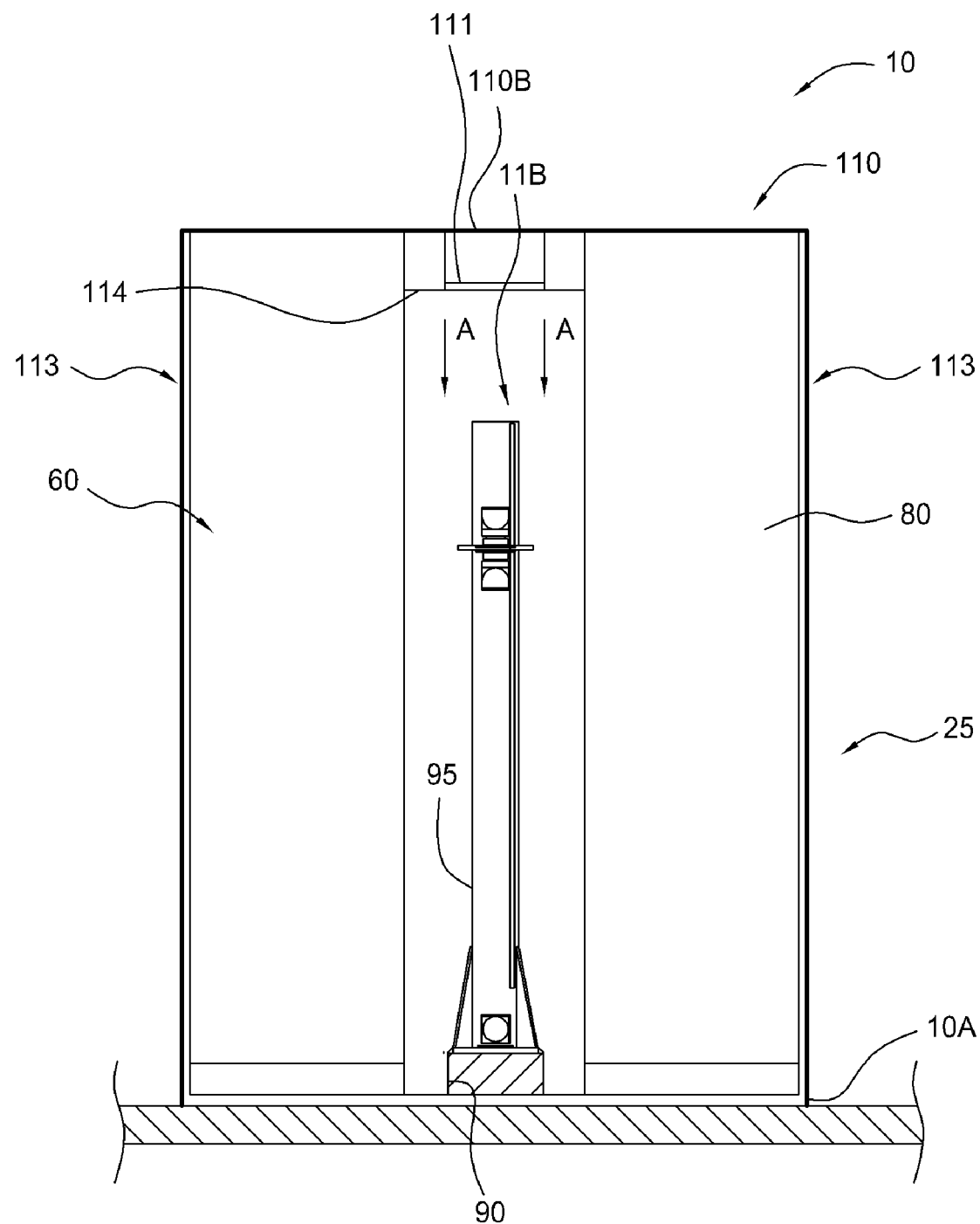
FIG. 9B is a cross-sectional view of the cluster tool illustrated in FIG. 1A, according to the present invention.

FIG. 9A illustrates one embodiment of the cluster tool 10 that has an attached environmental control assembly 110 that encloses the cluster tool 10 to provide controlled processing environment in which to perform the various substrate processing steps found in a desired processing sequence. FIG. 8A illustrates the cluster tool 10 configuration as illustrated in FIG. 1A with an environmental enclosure positioned above the processing chambers contained in the central module 25. The environmental control assembly 110 generally contains a filtration units 112, one or more fans (not shown), and an optional cluster tool base 10A (FIG. 9B). Generally the environmental control assembly 110 is adapted to control the air flow rate, flow regime (e.g., laminar or turbulent flow) and particulate contamination levels in the cluster tool 10. In one aspect, the environmental control assembly 110 may also control the air temperature, relative humidity, the amount of static charge in the air and other typical processing parameters that can be controlled by use of conventional clean room compatible heating ventilation and air conditioning (HVAC) systems. Referring to FIGS. 9A-9B, in operation the environmental control assembly 110 draws in air from a region outside of the cluster tool 10, by use of a fan (not shown) that then sends the air through a filter 111 and then through the cluster tool 10 and out of the cluster tool 10 through the cluster tool base 10A. In one aspect, the filter 111 is high efficiency particulate air (HEPA) filter. The cluster tool base 10A is generally the floor, or bottom region, of the cluster tool which contains a number of slots 10B (FIG. 6A) or other perforation that allow the air pushed through the cluster tool 10 from the fan(s) to exit the cluster tool 10.

FIG. 9B illustrates a cross-sectional view of an environmental control assembly 110 that has an environmental control assembly 110 that is mounted on a cluster tool 10 and is viewed using a cross-sectional plane oriented parallel to the Y and Z directions (see FIG. 1A). In this configuration the environmental control assembly 110 contains a cluster tool base 10A, an environmental control assemblies 110, a first processing rack 60 that extends to or above the lower surface 114 of the environmental control assembly 110, and a second processing rack 80 that extends to or above the lower surface 114 of the environmental control assembly 110. In general the environmental control assembly 110 will each contain one or more fans (not shown) and a filter 111. In this configuration the air delivered from the environmental control assembly 110 into the cluster tool 10 vertically (element "A"), between the processing racks 60, 80 and robot assembly 11, and out the cluster tool base 10A. In one aspect, the walls 113 are adapted to enclose and form a processing region inside the cluster tool 10 so that the processing environment around the processing chambers retained in the processing racks 60, 80 can be controlled by the air delivered by the environmental control assembly 110.

System Configurations

Figure 10:
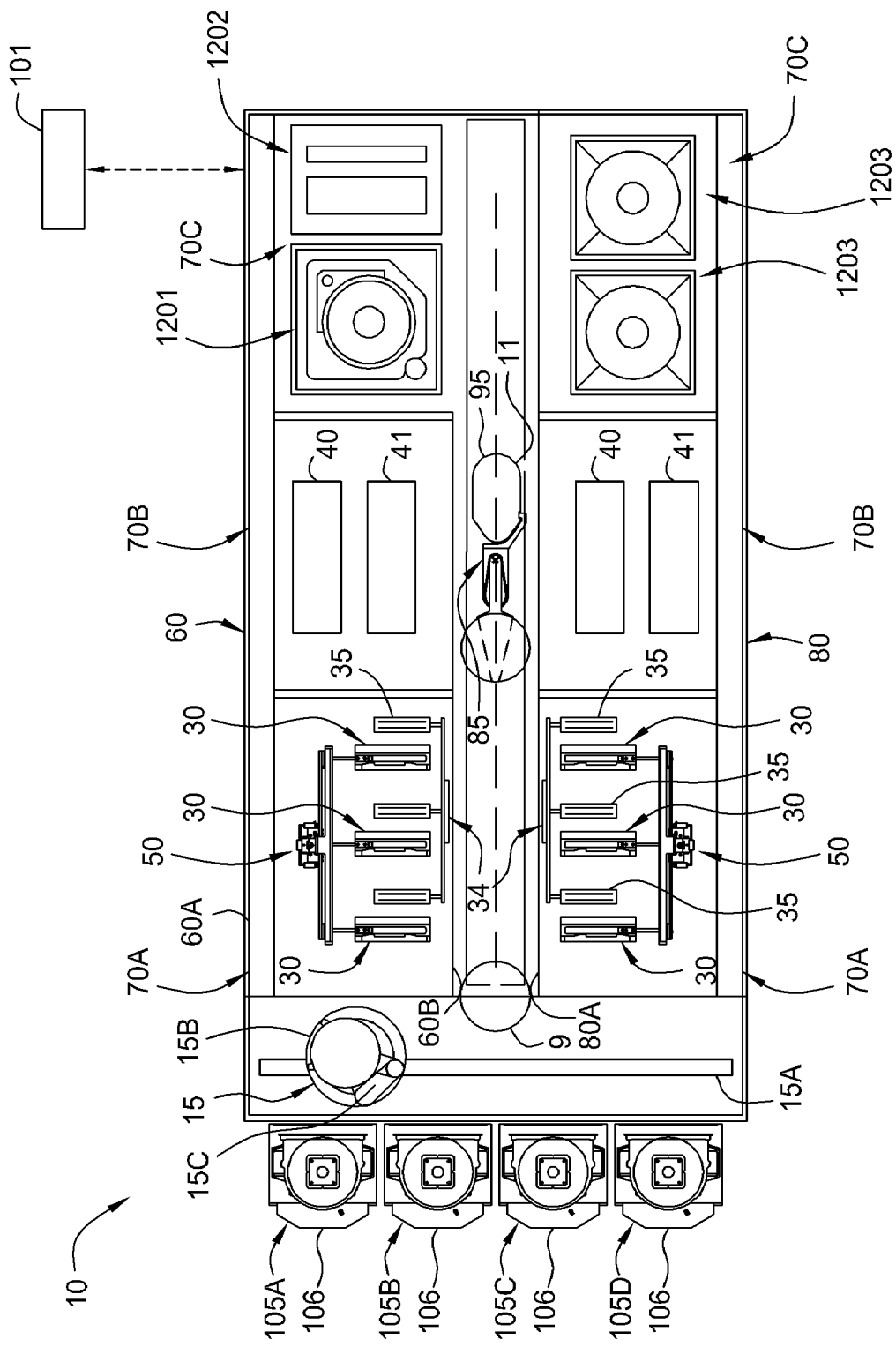
FIG. 10 is a plan view of a processing system according to the present invention.

FIG. 10 is a plan view of the embodiment of the cluster tool 10 that is similar to the embodiments illustrated in FIGS. 1B and 2C except that one or more wet processing chambers, or vacuum processing chambers have been added to the cluster tool 10. The additional wet processing or vacuum processing chambers generally provides additional processing capability and increases the number of front-end of the line (FEOL) cleaning processes, back-end of the line (BEOL) cleaning processes, HF Last cleaning processes, and lithography strip and clean sequences to be performed in the cluster tool 10. The additional wet processing or vacuum processing chambers may include a wet processing chamber that performs an oxide etch process, an electroless deposition process, an electrochemical deposition process, a wet etching process, or a vacuum processing that performs a photoresist strip process, a chemical vapor deposition (CVD) process, an atomic layer deposition (ALD) process, a dry etching process, or other similar processing techniques. One will note that FIG. 10 is similar to FIGS. 1B-1H and 2C, and thus the components that are the same or similar to those described above have the same reference numerals and are not discussed below.

In one embodiment, as shown in FIG. 10, the cluster 10 contains multiple processing chambers 30 positioned in the modules 70A, one or more supporting components positioned in the modules 70B, and one or more wet processing or vacuum processing chambers positioned in the modules 70C found in the first and second processing racks 60, 80. In one embodiment, as shown in FIG. 10, the module 70C in the first processing rack 60 contains a wet processing chamber 1201 and a substrate drying chamber 1202 and the module 70C in the second processing rack 80 contains two dry processing chambers 1203. It should be noted that number of wet processing or dry processing chambers (e.g., reference numerals 1201, 1202, and 1203), the position or orientation of the wet processing or dry processing chambers, the number of processing chambers 30, and/or the position or orientation of the processing chambers 30 shown in FIG. 10 is not intended to be limiting as to the scope of the invention described herein. For example, in one configuration the first processing rack contains a plurality of processing chambers 30 and the second process rack 80 contains only wet processing chambers 1201, drying chambers 1202 and/or dry processing chambers 1203. The number and type of chambers that are positioned in the cluster 10 is generally governed by the desired substrate throughput and possible processing sequences that will be run within the cluster tool.

In one embodiment, one or more of the modules 70A-70C in the first or second processing racks contains a wet clean chamber that is adapted to process the substrate in a horizontal orientation, such as a TEMPEST™ chamber available from Applied Materials of Santa Clara, Calif. In some cases the of a horizontal orientation of the substrate during processing is advantageous, since it can allow the chemicals applied to the front or backside of the substrate, which are facing up or down, to be for the most part isolated from each other due to gravity and surface tension affects. Thus allowing two different chemistries to be delivered to each side of the substrate at the same time without diluting the processing solutions, or causing the chemicals in the processing solutions to interact.

Horizontally Oriented Wet Clean Chamber

Figure 11:
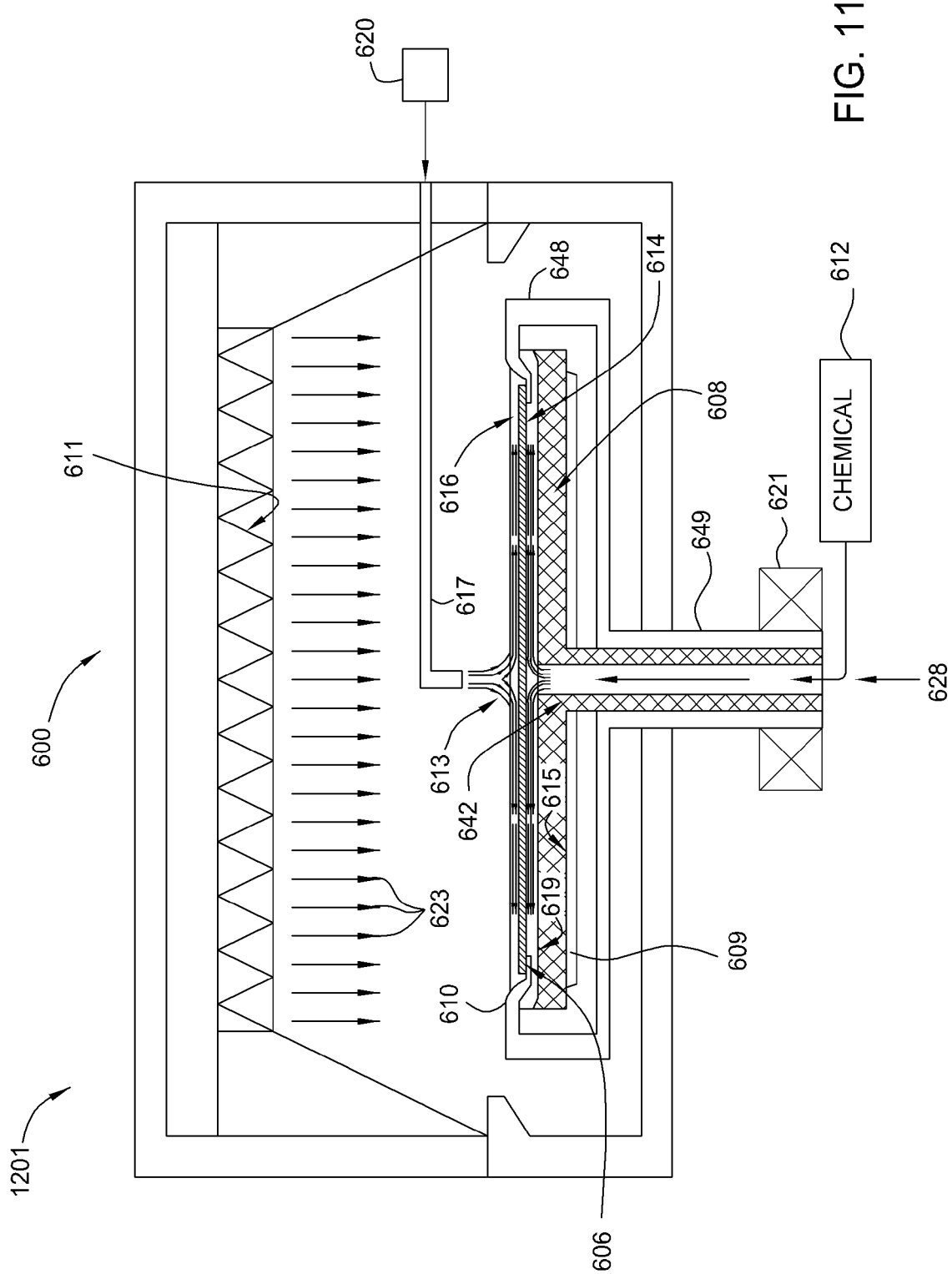
FIG. 11 is a cross-sectional view of a processing chamber that may positioned in the cluster tool, according to the present invention.

FIG. 11 illustrates one embodiment of a horizontally oriented version of a wet processing chamber 1201 (hereafter horizontally oriented wet-clean chamber) that may be used advantageously in the cluster tool 10. The horizontally oriented wet-clean chamber may be a single-substrate cleaning chamber. FIG. 11 is a cross-sectional illustration of one embodiment of wet processing chamber 1201 that generally contains a single-substrate cleaning chamber 600. In one example, the bottom side of the substrate 606 (substrate bottom surface 614) is exposed to cleaning, rinsing and drying chemicals (e.g., SC1, SC2, DI water). The topside of the substrate 606 (substrate top surface 616) is not exposed to any chemicals. The substrate bottom surface 614 (which could be the substrate non-device side) is facing down to be exposed to the chemicals delivered from the chemical source 612, while the substrate top surface 616 (which could the device side) is facing up and is not exposed to chemicals. In another example, both, the substrate top surface 616 and the substrate bottom surface 614 can be exposed to chemicals.

In another embodiment, the chamber 600 includes rotatable substrate holding bracket (bracket) 648, which rotates about an axis of a rotation device 649. The rotation device 649 can further be coupled to a conventional electric motor 621 which can rotate the bracket 648. The chamber 600 also includes an access door (not shown) through which robot blade assembly 900 (FIGS. 5A-5F) holding the substrate 606 enters to place the substrate 606 on the bracket 648. In one embodiment, the substrate 606, when positioned in the bracket 648, can rest on support clips 610 connected to the bracket 648. The bracket 648 together with the support posts 607 can raise or lower the substrate 606 to a desirable position.

In one embodiment, the electric motor 621 is adapted to rotate the bracket 648 and the substrate 606 while chemicals are dispensed from below during a cleaning cycle. In another embodiment, the bracket 648 rotates the substrate 606 while chemicals are dispensed from another nozzle the top and the bottom surface of the substrate 606 during a cleaning cycle.

In another embodiment, the chamber 600 includes a platter 608. The platter 608 is generally positioned a distance from the substrate 606. The gap between the substrate 606 and the platter 608 may be in the range of approximately 1-5 millimeters (mm). Chamber 600 also includes a tube 628 connected to a through-hole (feed port) 642 in the platter 608. During a cleaning cycle, cleaning fluids or chemicals are introduced through the tube 628 from a chemical source 612. A nozzle 617 located on the over the top surface of the substrate can be used to dispense chemicals and/or DI water (reference numeral 613) to the top surface of the substrate from a chemical source 620. The residues and/or liquids left on the substrate after processing can be cleaned off or removed by rotating the substrate 606 at high speed.

In one embodiment, the chamber 600 further includes a filter 611 such as a High Efficiency Particulate Arresting (HEPA) filter or an Ultra Low Penetration Air (ULPA) filter. A downward flow of air 623 from the filter 611 and gravity can act to maintain the substrate 606 positioned on the posts 607. In another embodiment, the chamber 600 does not contain a filter 611, but receives clean air delivered from the environmental control assembly 110 (FIGS. 9A-9B).

In one embodiment of the process chamber 600, the platter 608 has a platter top surface 619 and a platter bottom surface 615, with a set of acoustic wave transducers 609 coupled to the platter top surface 619. The platter top surface 619 can be facing the substrate 606. When the substrate 606 is placed in the bracket 648, the substrate 606 can be centered over and held substantially parallel to the platter 608 to create the gap. In this embodiment, acoustic waves or megasonic sound waves can be emitted from the platter 608 and be transferred to the substrate 606 through the cleaning fluids flowing in the gap formed between the substrate bottom surface 614 and the platter top surface 619.

In one embodiment, the chamber 600 may also include other nozzles (not shown) that allow cleaning fluid to be delivered onto the substrate top surface 616. Thus, a first group of chemicals can be transferred to the substrate bottom surface 614 while chemicals from a different source (a second group of chemicals) can be transferred to a substrate top surface 616. In this embodiment, the megasonic sound waves delivered by the set of acoustic wave transducers 609 are also applied to the substrate top surface 616 through the substrate when the cleaning solution is being delivered to the substrate top surface 616. An example of some exemplary horizontally oriented wet clean chambers and processes that may be used herein are further described in the commonly assigned U.S. Pat. No. 6,927,176, the US Patent Publication No. 2003/0172954, the US Patent Publication No. 2003/0192577, US Patent Publication No. 2002/0029788, and the US Patent Publication No. 2004/0127044, which are all incorporated by reference in their entirety to the extent not inconsistent with the present disclosure. A wet processing chamber 1201 may be a TEMPEST® chamber that is available from Applied Materials of Santa Clara, Calif.

Drying Chamber

In one embodiment, the cluster tool 10 contains one or more drying chambers 1202 that are adapted to rinse and/or dry a substrate. Examples of exemplary vapor drying processes are further described in the commonly assigned U.S. Pat. No. 6,328,814, filed Mar. 26, 1999, United States Patent Publication Number 2005/0229426, filed Oct. 20, 2005, United States Patent Publication Number 2005/0241684, filed Nov. 3, 2005, and U.S. patent application Ser. No. 10/737,732, entitled "Scrubber With Integrated Vertical Marangoni Drying", filed Dec. 16, 2003, which is incorporated by reference in its entirety to the extent not inconsistent with the present disclosure. A drying chamber 1202 may be a DESICA® MARANGONI® vapor drying chamber that is available from Applied Materials of Santa Clara, Calif.

In one embodiment, the drying chamber 1202 is adapted to perform a vapor drying process that is typically performed after completing one or more wet processing steps, to prevent watermarks and to remove any residue on the substrate from prior processes. The vapor drying process is generally performed in a vertical orientation to assure even drying or streaking on either side of the substrate. Vapor drying may also be used in lieu of a final spin-rinse-dry prior to removing a substrate from a wet processing platform. In one embodiment, it is desirable to use a drying chamber 1202 in combination with a wet processing chamber 1201 (e.g., horizontally oriented wet clean chamber). This configuration is generally advantageous in the case where the wet processing chamber 1201 is horizontally oriented, since drying processes, such as a Marangoni® drying process that dries both sides of substrate, are generally not effective when completed in a horizontal orientation. In this configuration, the robot assembly 11 is adapted to transfer a substrate from the horizontally oriented wet clean chamber to the drying chamber 1202. In one example, the robot blade assembly 900 is adapted to receive a substrate from a horizontally oriented wet clean chamber and deposit the substrate on the cradle 36 illustrated in FIG. 2A of the United States Patent Publication Number 2005/0229426, which is incorporated by reference above, of the drying chamber 1202. In one aspect the substrate receiving surface of the drying chamber 1202, or cradle 36, is vertically oriented.

The process of vapor drying includes introducing a surface tension-reducing volatile compound, such as a volatile organic compound (VOC), to the substrate structure. For example, a VOC may be introduced with a carrier gas (e.g., nitrogen gas) in the vicinity of the liquid adhering to a substrate structure, or Marangoni® type process. The introduction of the VOC results in surface tension gradients which cause the liquid to flow off of the substrate, leaving it dry. In one embodiment, the VOC is isopropyl alcohol (IPA). In other embodiments, the VOC may be other alcohols, ketones, ethers, or other suitable compounds.

Dry Processing Chamber

Figure 12:
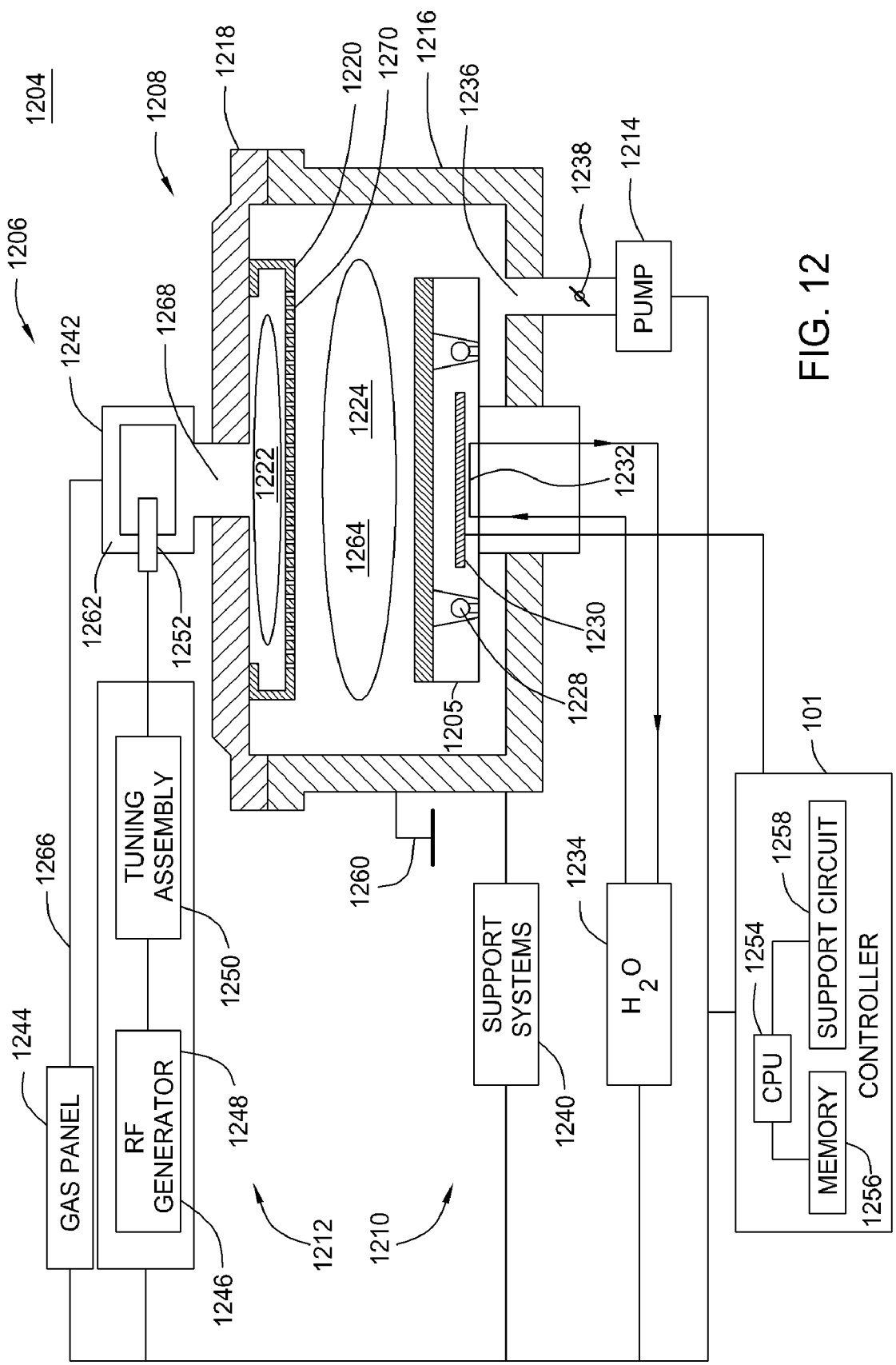
FIG. 12 is a cross-sectional view of a processing chamber that may positioned in the cluster tool, according to the present invention.

FIG. 12 illustrates one embodiment of a dry processing chamber 1203 that may be used advantageously in the cluster tool 10. In one embodiment, the dry processing chamber 1203 is a single-substrate vacuum compatible cleaning, deposition or thermal processing chamber. In one aspect, the dry processing chamber 1203 is adapted to perform a dry etch, photoresist strip, plasma clean, or other similar process. In one embodiment, the dry processing chamber 1203 is an AXIOM® reactor that is available from Applied Materials of Santa Clara, Calif. In general, the AXIOM® reactor is a remote plasma reactor in which the radio-frequency plasma is confined such that only reactive neutrals are allowed to enter a reaction volume of the process chamber. Such confinement scheme minimizes the plasma-related damage to the substrate or circuits formed on the substrate. In the AXIOM® reactor, a wafer backside may be heated radiantly by quartz halogen lamps or resistively heated or cooled using heat transfer (e.g., coolant circulating through the wafer support), such that the wafer temperature can be maintained at 20 to 450° C. The AXIOM® reactor is described in detail in U.S. patent application Ser. No. 10/264,664, filed Oct. 4, 2002, which is herein incorporated by reference. Examples of an exemplary dry clean process and apparatus are further described in the commonly assigned U.S. patent application Ser. No. 10/915,519, filed Aug. 10, 2004, U.S. patent application Ser. No. 11/463,429, filed Aug. 9, 2006, U.S. patent application Ser. No. 10/777,026, filed Feb. 11, 2004, which are all incorporated by reference in their entirety to the extent not inconsistent with the present disclosure.

FIG. 12 illustrates a schematic diagram of the AXIOM® reactor 1204 that may be used in the cluster tool 10. The reactor 1204 generally comprises a process chamber 1208, a remote plasma source 1206, and the system controller 101. The process chamber 1208 generally is a vacuum vessel, which comprises a first portion 1210 and a second portion 1212. In one embodiment, the first portion 1210 comprises a substrate pedestal 1205, a sidewall 1216 and a vacuum pump 1214. The second portion 1212 comprises a lid 1218 and a gas distribution plate (showerhead) 1220, which defines a gas mixing volume 1222 and a reaction volume 1224. The lid 1218 and sidewall 1216 are generally formed from a metal (e.g., aluminum (Al), stainless steel, and the like) and electrically coupled to a ground reference 1260.

The substrate pedestal 1205 supports a substrate (wafer) 1226 within the reaction volume 1224. In one embodiment, the substrate pedestal 1205 may comprise a source of radiant heat, such as gas-filled lamps 1228, as well as an embedded resistive heater 1230 and a conduit 1232. The conduit 1232 provides cooling water from a source 1234 to the backside of the substrate pedestal 1205. The wafer sits on the pedestal surface. Gas conduction transfers heat from the pedestal 1205 to the wafer 1226. The temperature of the wafer 1226 may be controlled between about 20 and 400° C.

The vacuum pump 1214 is adapted to an exhaust port 1236 formed in the sidewall or a bottom wall 1216 of the process chamber 1208. The vacuum pump 1214 is used to maintain a desired gas pressure in the process chamber 1208, as well as evacuate the post-processing gases and other volatile compounds from the chamber. In one embodiment, the vacuum pump 1214 comprises a throttle valve 1238 to control a gas pressure in the process chamber 1208.

The process chamber 1208 also comprises conventional systems for retaining and releasing the wafer 1226, detecting an end of a process, internal diagnostics, and the like. Such systems are collectively depicted in FIG. 12 as support systems 1240.

The remote plasma source 1206 comprises a power source 1246, a gas panel 1244, and a remote plasma chamber 1242. In one embodiment, the power source 1246 comprises a radio-frequency (RF) generator 1248, a tuning assembly 1250, and an applicator 1252. The RF generator 1248 is capable of producing of about 200 to 6000 W at a frequency of about 200 to 600 kHz. The applicator 1252 is inductively coupled to the remote plasma chamber 1242 to inductively couple RF power to process gas (or gas mixture) 1264 to form a plasma 1262 in the chamber. In this embodiment, the remote plasma chamber 1242 has a toroidal geometry that confines the plasma and facilitates efficient generation of radical species, as well as lowers the electron temperature of the plasma. In other embodiments, the remote plasma source 1206 may be a microwave plasma source, however, the stripping rates are generally higher using the inductively coupled plasma.

The gas panel 1244 uses a conduit 1266 to deliver the process gas 1264 to the remote plasma chamber 1242. The gas panel 1244 (or conduit 1266) comprises means (not shown), such as mass flow controllers and shut-off valves, to control gas pressure and flow rate for each individual gas supplied to the chamber 1242. In the plasma 1262, the process gas 1264 is ionized and dissociated to form reactive species.

The reactive species are directed into the mixing volume 1222 through an inlet port 1268 in the lid 1218. To minimize charge-up plasma damage to devices on the wafer 1226, the ionic species of the process gas 1264 are substantially neutralized within the mixing volume 1222 before the gas reaches the reaction volume 1224 through a plurality of openings 1270 in the showerhead 1220.

The system controller 101 comprises a central processing unit (CPU) 1254, a memory 1256, and a support circuit 1258. The CPU 1254 may be of any form of a general-purpose computer processor used in an industrial setting. Software routines can be stored in the memory 1256, such as random access memory, read only memory, floppy or hard disk, or other form of digital storage. The support circuit 1258 is conventionally coupled to the CPU 1254 and may comprise cache, clock circuits, input/output sub-systems, power supplies, and the like.

The software routines, when executed by the CPU 1254, transform the CPU into a specific purpose computer (system controller 101) that controls the reactor 1204 such that the processes are performed in accordance with the present invention. The software routines may also be stored and/or executed by a second controller (not shown) that is located remotely from the reactor 1204.

While the foregoing is directed to embodiments of the present invention, other and further embodiments of the invention may be devised without departing from the basic scope thereof, and the scope thereof is determined by the claims that follow.

The invention claimed is:

1. A cluster tool for cleaning a substrate, comprising:
two or more process chambers that are configured to process a substrate in a vertical orientation, wherein the two or more process chambers are positioned a distance apart along a first direction;
a robot assembly that comprises:
a first robot having a robot blade assembly that has a substrate supporting surface, and the first robot is adapted to position a substrate at one or more points contained within a first plane, wherein the first plane is parallel to the first direction;

an actuator that is coupled to the robot blade assembly and is adapted to position the substrate supporting surface in an angular orientation relative to a horizontal plane;
a first motion assembly that is adapted to position the first robot in a third direction that is perpendicular to the first plane; and
a second motion assembly that is adapted to position the first robot in a direction parallel to the first direction;
a chamber actuator assembly that has two or more end-effector assemblies, wherein the chamber actuator assembly is adapted to position one of the two or more end-effector assemblies in each of the two or more process chambers simultaneously;
two or more chamber pass-through supports that are each adapted to receive one or more substrates from the robot assembly; and
a support actuator that is adapted to position the two or more chamber pass-through supports so that each of the two or more end-effector assemblies can receive a substrate from at least one of the two or more chamber pass-through supports.

2. The cluster tool of claim 1, further comprising a wet processing chamber comprising:
a substrate support coupled to a rotation device that is adapted to rotate a substrate positioned on the substrate support in a horizontal orientation; and
a fluid source that is adapted to deliver a fluid to a bottom surface of a substrate positioned on the substrate support.

3. The cluster tool of claim 1, further comprising:
a vacuum processing chamber that has a plasma generating device that is adapted to ionize a process gas that is disposed over a surface of a substrate.

4. The cluster tool of claim 1, wherein the first motion assembly further comprises:
an robot actuator assembly that is adapted to vertically position the first robot, wherein the robot actuator assembly further comprises:
a vertical actuator that is adapted to vertically position the first robot; and
a vertical slide that is adapted to guide the first robot as it is translated by the vertical actuator;
an enclosure having an internal region that surrounds at least one of the components selected from a group consisting of the vertical actuator and the vertical slide; and
a fan that is in fluid communication with the internal region that is adapted to generate a negative pressure inside the enclosure.

5. The cluster tool of claim 1, further comprising:
a cassette that is adapted to retain two or more substrates in a horizontal orientation;
a pass-through chamber that is adapted to receive a substrate from a front end robot and the robot assembly; and
the front end robot being adapted to transfer a substrate to and from the cassette and the pass-through chamber.

6. The cluster tool of claim 1, wherein the each of the two or more process chambers further comprise:
one or more walls that form a processing region; and
a first megasonic actuator that is adapted to deliver energy to a processing side of a substrate that is positioned in the processing region; and
a second megasonic actuator that is adapted to deliver energy to a backside side of a substrate that is positioned in the processing region.

7. The cluster tool of claim 1, further comprising an isopropyl alcohol (IPA) source that is adapted to deliver an IPA containing gas to a processing region formed in each of two or more process chambers.

8. The cluster tool of claim 1, wherein the robot blade assembly further comprises:
a base having a substrate supporting surface;
a reaction member coupled to the base; and
a contact member that is coupled to a first actuator which is adapted to urge a substrate against the reaction member.

9. The cluster tool of claim 8, wherein the robot blade assembly further comprises:
a substrate retaining support coupled to the robot blade assembly that is adapted to receive a substrate when it is oriented in an angular orientation relative to the horizontal plane and the substrate is not being urged against the reaction member by the contact member.

10. A cluster tool for cleaning a substrate, comprising:
a first processing rack comprising:
two or more process chambers that each have one or more walls that form a processing region, wherein each of the two or more process chambers are configured to process a substrate in a vertical orientation;
a chamber actuator assembly that are adapted to dispose a substrate in each of the two or more process chambers simultaneously; and
a fluid source that is fluidly coupled to each of the two or more process chambers, wherein the fluid source is adapted to deliver a desired volume of a liquid to the processing regions of each of the two or more processing chambers from a fluid reservoir; and
a robot assembly that comprises:
a first robot having a robot blade assembly that has a substrate supporting surface, and the first robot is adapted to position a substrate at one or more points contained within a first plane, wherein the first plane is parallel to the first direction and a second direction;
an actuator that is coupled to the robot blade assembly and is adapted to position the substrate supporting surface in an angular orientation relative to a horizontal plane;
a first motion assembly that is adapted to position the first robot in a third direction that is perpendicular to the first plane; and
a second motion assembly that is adapted to position the first robot in a direction parallel to the first direction.

11. The cluster tool of claim 10, further comprising a wet processing chamber comprising:
a substrate support coupled to a rotation device that is adapted to rotate a substrate positioned on the substrate support in a horizontal orientation; and
a fluid source that is adapted to deliver a fluid to a bottom surface of a substrate positioned on the substrate support.

12. The cluster tool of claim 10, wherein the first motion assembly further comprises:
A robot actuator assembly that is adapted to vertically position the first robot, wherein the robot actuator assembly further comprises:
a vertical actuator that is adapted to vertically position the first robot; and
a vertical slide that is adapted to guide the first robot as it is translated by the vertical actuator;
an enclosure having an internal region that surrounds at least one of the components selected from a group consisting of the vertical actuator and the vertical slide; and a fan that is in fluid communication with the internal region that is adapted to generate a negative pressure inside the enclosure.

13. The cluster tool of claim 10, wherein the each of the two or more process chambers further comprise:
   one or more walls that form a processing region;
   a first megasonic actuator that is adapted to deliver energy to a processing side of a substrate that is positioned in the processing region; and
   a second megasonic actuator that is adapted to deliver energy to a backside side of a substrate that is positioned in the processing region.

14. The cluster tool of claim 10, further comprising an isopropyl alcohol (IPA) source that is adapted to deliver an IPA containing gas to a processing region formed in each of two or more process chambers.

15. The cluster tool of claim 10, wherein the robot blade assembly further comprises:
   a base having a substrate supporting surface;
   a reaction member coupled to the base; and
   a contact member that is coupled to a first actuator which is adapted to urge a substrate against the reaction member.

16. The cluster tool of claim 15, wherein the robot blade assembly further comprises:
   a substrate retaining support coupled to the robot blade assembly that is adapted to receive a substrate when it is oriented in an angular orientation relative to the horizontal plane and the substrate is not being urged against the reaction member by the contact member.

17. The cluster tool of claim 10, further comprising:
   a vacuum processing chamber that has a plasma generating device that is adapted to ionize a process gas that is disposed over a surface of a substrate.

18. A cluster tool for cleaning a substrate, comprising:
   two or more process chambers that are configured to process a substrate in a vertical orientation, wherein the two or more process chambers are positioned a distance apart along a first direction, and each of the two or more process chambers comprise:
      one or more walls that form a processing region; and
      a first megasonic actuator that is adapted to deliver energy to a processing side of a substrate that is positioned in the processing region;
   a robot assembly that comprises:
      a first robot having a robot blade assembly that has a substrate supporting surface, and the first robot is adapted to position a substrate at one or more points contained within a first plane, wherein the first plane is parallel to the first direction;
      a first motion assembly that is adapted to position the first robot in a third direction that is perpendicular to the first plane; and
      a second motion assembly that is adapted to position the first robot in a direction parallel to the first direction;
   a chamber actuator assembly that has two or more end-effector assemblies, wherein the chamber actuator assembly is adapted to position one of the two or more end-effector assemblies in each of the two or more process chambers simultaneously;
   two or more chamber pass-through supports that are each adapted to receive one or more substrates from the robot assembly; and
   a support actuator that is adapted to position the two or more chamber pass-through supports so that each of the two or more end-effector assemblies can simultaneously receive a substrate from at least one of the two or more chamber pass-through supports.

19. The cluster tool of claim 18, further comprising a wet processing chamber comprising:
   a substrate support coupled to a rotation device that is adapted to rotate a substrate positioned on the substrate support in a horizontal orientation; and
   a fluid source that is adapted to deliver a fluid to a bottom surface of a substrate positioned on the substrate support.

20. The cluster tool of claim 18, further comprising:
   a vacuum processing chamber that has a plasma generating device that is adapted to ionize a process gas that is disposed over a surface of a substrate.

21. The cluster tool of claim 18, wherein the first motion assembly further comprises:
   a robot actuator assembly that is adapted to vertically position the first robot, wherein the robot actuator assembly further comprises:
      a vertical actuator that is adapted to vertically position the first robot; and
      a vertical slide that is adapted to guide the first robot as it is translated by the vertical actuator;
   an enclosure having an internal region that surrounds at least one of the components selected from a group consisting of the vertical actuator and the vertical slide; and
   a fan that is in fluid communication with the internal region that is adapted to generate a negative pressure inside the enclosure.

22. The cluster tool of claim 18, wherein the each of the two or more process chambers further comprise a second megasonic actuator that is adapted to deliver energy to a backside side of a substrate that is positioned in the processing region.

23. The cluster tool of claim 18, further comprising an isopropyl alcohol (IPA) source that is adapted to deliver an IPA containing gas to a processing region formed in each of two or more process chambers.

24. The cluster tool of claim 18, wherein the robot blade assembly further comprises:
   a base having a substrate supporting surface;
   a reaction member coupled to the base; and
   a contact member that is coupled to a first actuator which is adapted to urge a substrate against the reaction member.

* * * * *